(12) United States Patent
Wood

(10) Patent No.: US 10,374,505 B2
(45) Date of Patent: Aug. 6, 2019

(54) POWER COUPLER

(71) Applicant: John Wood, Raunds (GB)

(72) Inventor: John Wood, Raunds (GB)

( * ) Notice: Subject to any disclaimer, the term of this patent is extended or adjusted under 35 U.S.C. 154(b) by 52 days.

(21) Appl. No.: 15/551,057

(22) PCT Filed: Dec. 16, 2015

(86) PCT No.: PCT/GB2015/054040
§ 371 (c)(1),
(2) Date: Aug. 15, 2017

(87) PCT Pub. No.: WO2016/097730
PCT Pub. Date: Jun. 23, 2016

(65) Prior Publication Data
US 2018/0034446 A1   Feb. 1, 2018

(30) Foreign Application Priority Data

Dec. 16, 2004   (GB) ...................................... 1422419

(51) Int. Cl.
| | |
|---|---|
| *H02M 1/08* | (2006.01) |
| *H02M 5/22* | (2006.01) |
| *H02M 5/458* | (2006.01) |
| *H02M 7/217* | (2006.01) |
| *H03H 11/28* | (2006.01) |
| *H02M 1/00* | (2006.01) |

(52) U.S. Cl.
CPC ............. *H02M 1/08* (2013.01); *H02M 5/225* (2013.01); *H02M 5/458* (2013.01); *H02M 7/217* (2013.01); *H03H 11/28* (2013.01); *H02M 2001/0048* (2013.01)

(58) Field of Classification Search
CPC ........... H02M 1/08; H02M 2001/0048; H02M 5/458; H02M 7/217; H02M 5/225; H03H 11/28
See application file for complete search history.

(56) References Cited

U.S. PATENT DOCUMENTS

| | | | | |
|---|---|---|---|---|
| 5,804,954 | A * | 9/1998 | Laplace, Jr. ............ | G05F 1/147 323/256 |
| 6,781,384 | B2 * | 8/2004 | Abdel-Rahman ...... | G01N 27/70 324/464 |
| 7,388,761 | B1 * | 6/2008 | Wang ................ | H02M 3/33576 363/17 |

(Continued)

*Primary Examiner* — Fred E Finch, III
*Assistant Examiner* — Demetries A Gibson
(74) *Attorney, Agent, or Firm* — Crose Law LLC; Bradley D. Crose

(57) ABSTRACT

We disclose herein a power coupler for connecting AC or DC electrical circuits having different voltages, current or impedance levels. The power coupler comprise a first switching device; a second switching device coupled with the first switching device; a power transformer comprising a first core winding and a second core winding; a first capacitance coupled between the terminals of the first core winding; a second capacitance coupled between the terminals of the second core winding; and a third capacitance coupled between the first and second cores windings. The power transformer is coupled with the first and second switching devices. The power coupler is configured to reduce switching power loss using an adiabatic technique and by selecting appropriate switching time of the switching devices.

11 Claims, 52 Drawing Sheets

(56) References Cited

U.S. PATENT DOCUMENTS

| | | | |
|---|---|---|---|
| 2003/0015972 A1* | 1/2003 | Suzuki | H05B 41/2881 |
| | | | 315/291 |
| 2012/0057387 A1* | 3/2012 | Lai | H02M 7/797 |
| | | | 363/132 |
| 2012/0163038 A1* | 6/2012 | Park | H02M 3/338 |
| | | | 363/21.02 |
| 2014/0084232 A1* | 3/2014 | Van Buskirk | G11C 13/0004 |
| | | | 257/2 |
| 2015/0381064 A1* | 12/2015 | Matsubara | H02M 3/33584 |
| | | | 363/17 |

* cited by examiner

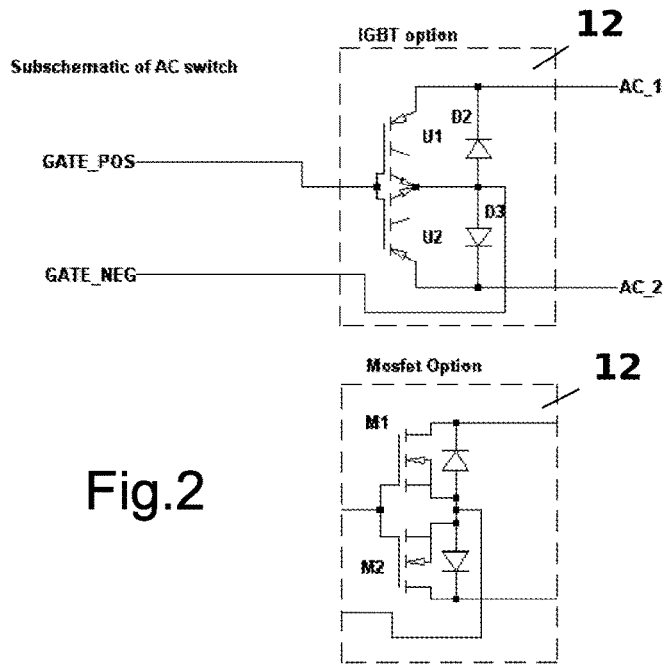
Fig.2
RCCD module 8.,
Option1, for full bridge power coupler modules.
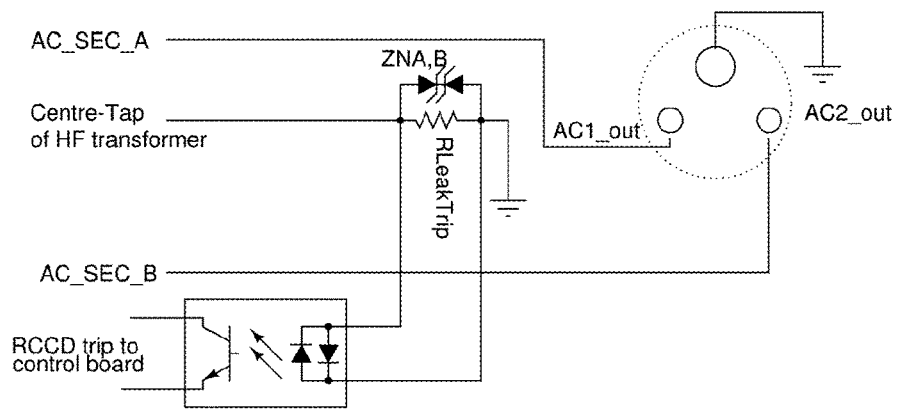
Option2 for half bridge power coupler module - (who's centre-tap is not mid AC-out voltage)
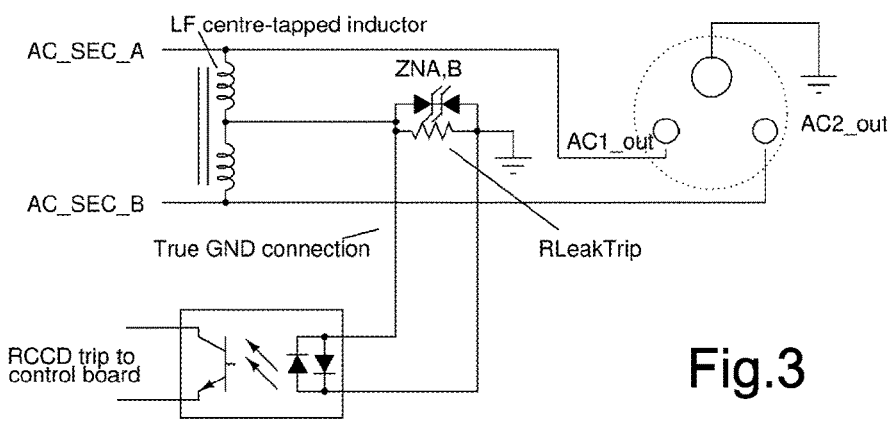
Fig.3

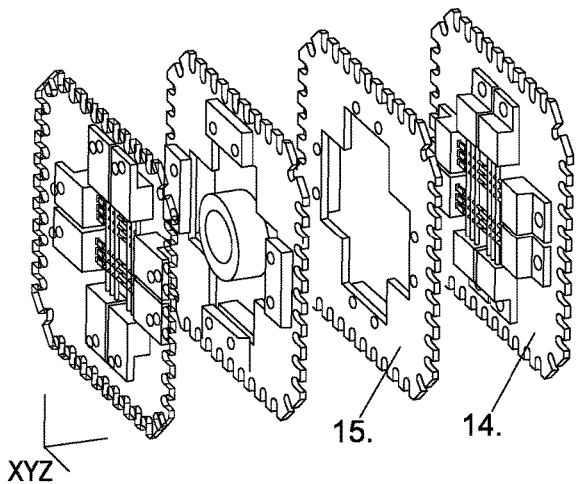
Fig.6a Switching Transistors - Heatseeking module exploded
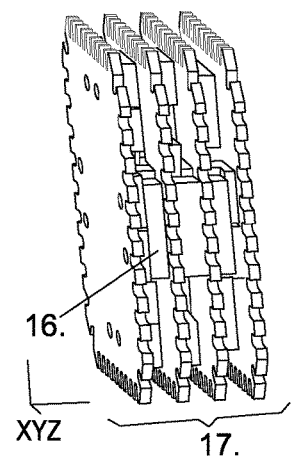
Fig.6b Switching Transistors + Heatseeking module assembled
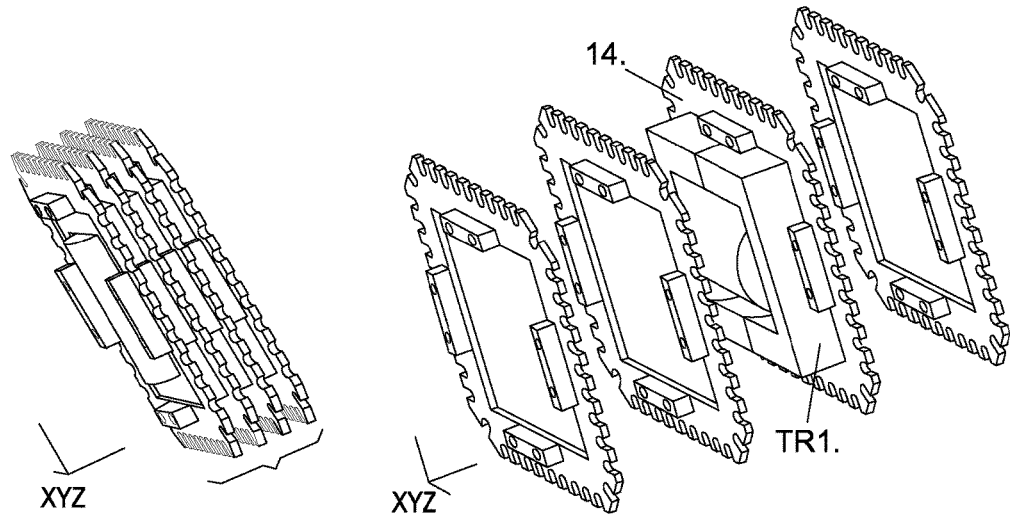
Fig.7a Transformers/Heatseeker assembled
Fig.7b Transformers + Heatseeker exploded
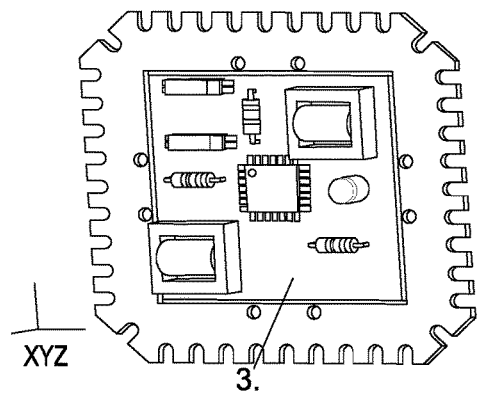
Fig.8 Control board + Aux PSUs + other control electronics

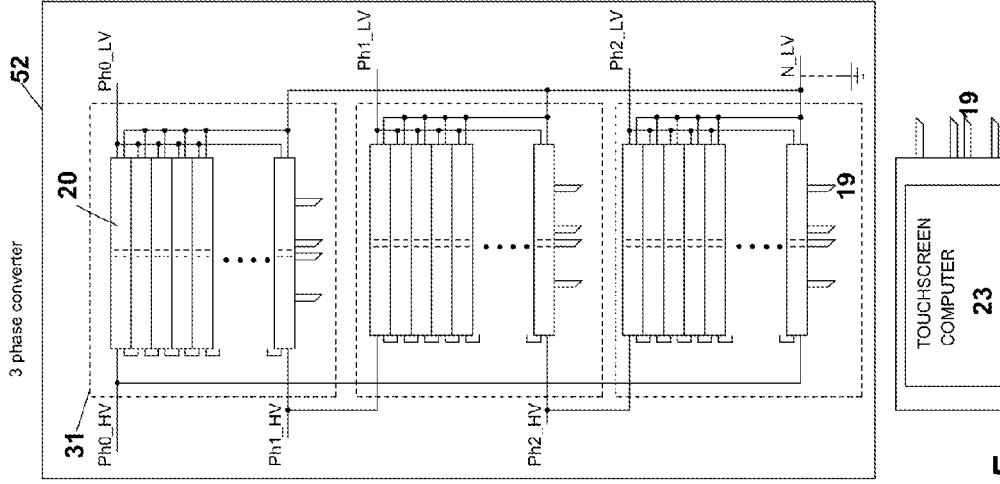
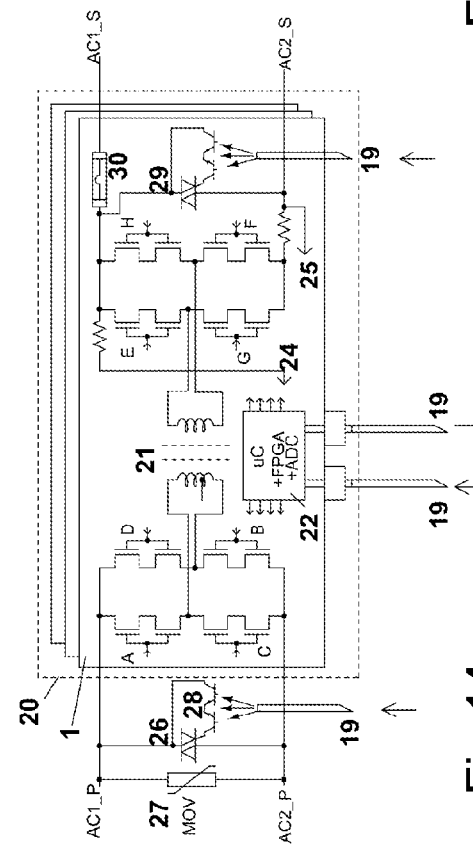
Fig.15
Fig.13
Fig.14

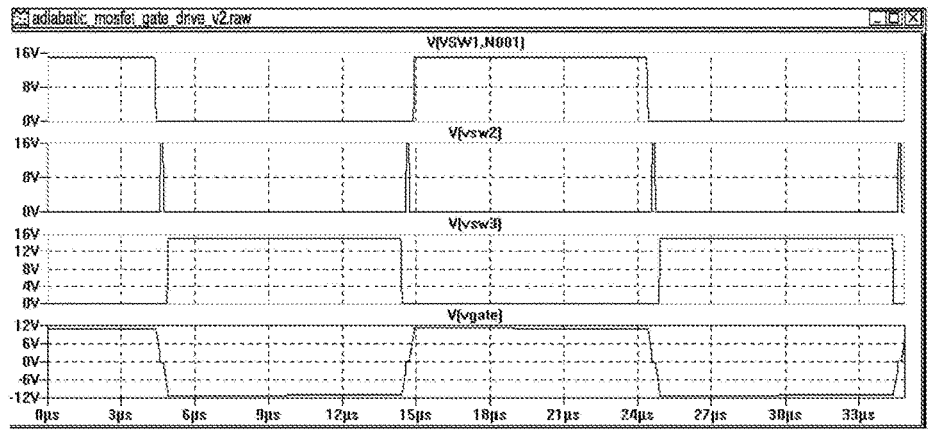
Fig.18
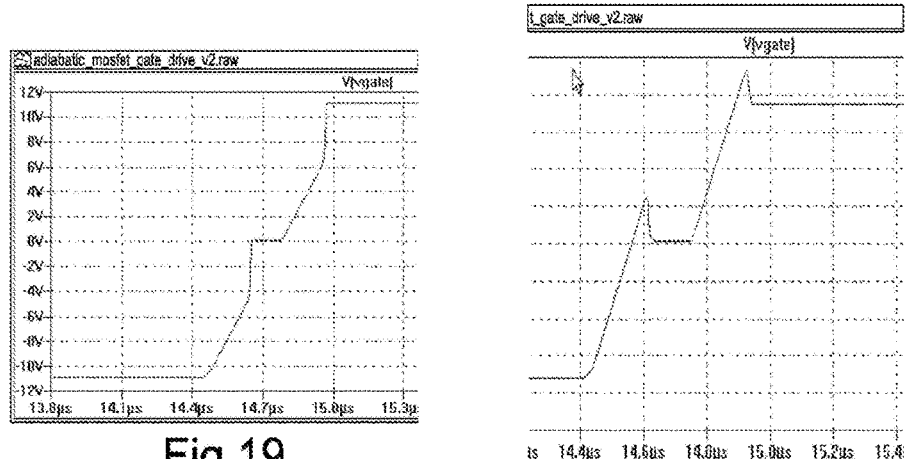
Fig.19
Fig.20
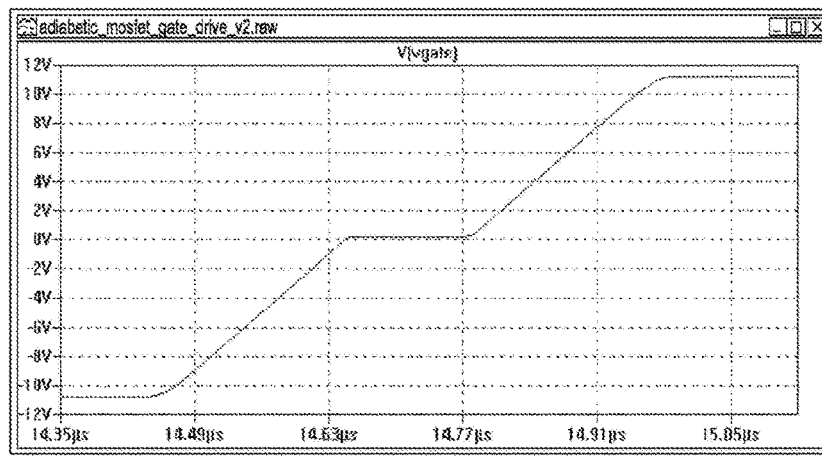
Fig.21

Universal AC/DC bidirectional power convertor
- example using DC source and AC load, but could be AC/AC DC/DC or AC/DC

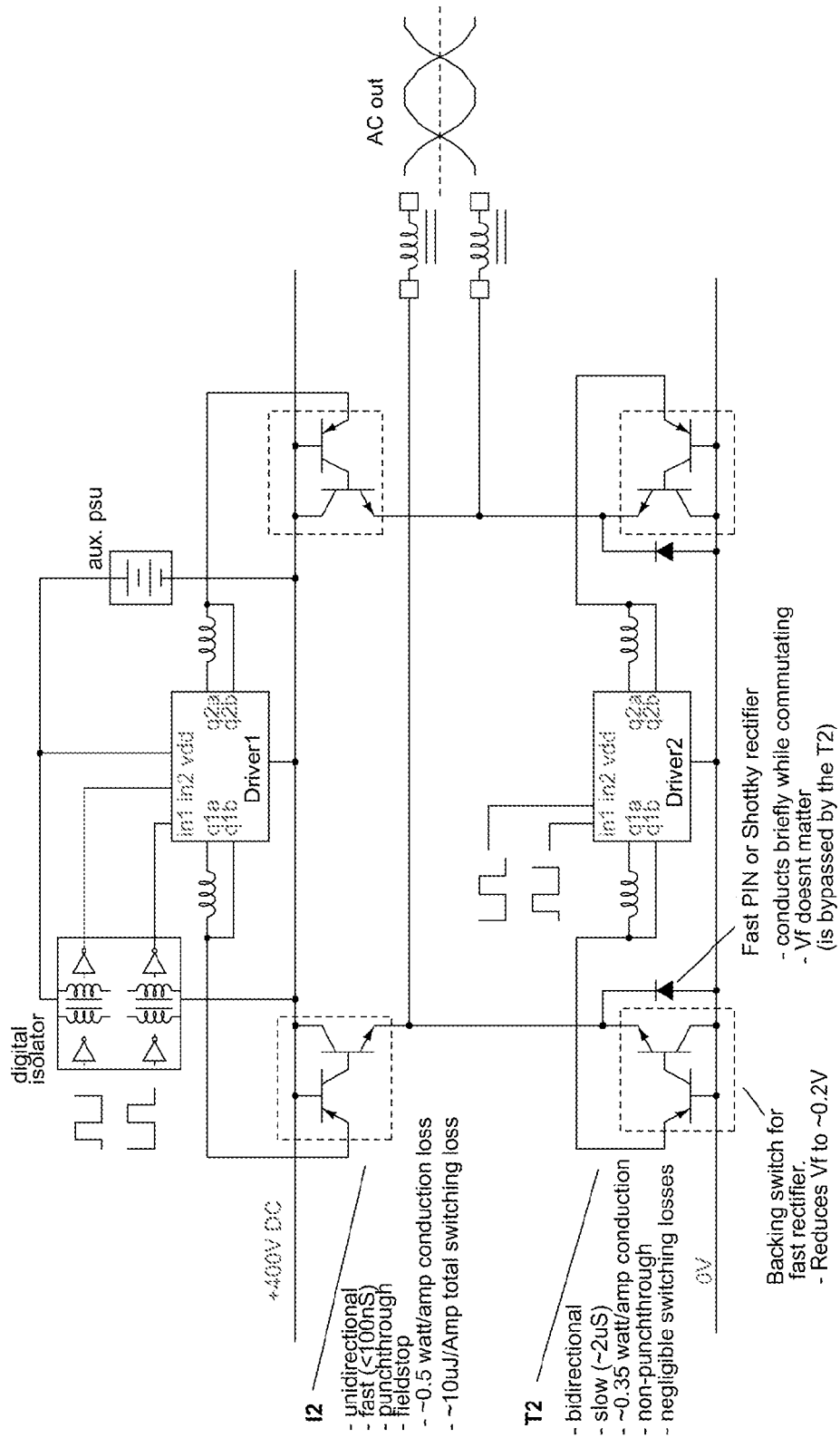

Fig. 37 Goggle LittleBox Challenge Specifications

General:

Input: 450V and 10ohm series resistance. 2.1kW max.

Output: 240Vac. 60Hz. 2 kVA.

Size: <40 in$^3$ (656cc) Metal case, Rectangular. (size of an ipad)

Efficiency: > 95%

| Easy | Hard | Hardest |
|---|---|---|
| Output Frequency 60Hz+/- 0.3Hz<br><br>THD + Noise < 5% for voltage, curremt<br><br>Power factor of load: Must drive 0.7 to 1.0 lead / lagging | Efficiency: 95%. This is hard to achieve at very high frequencies.<br><br>Output setting time: <1 second for a load change of 500VA | Input Ripple @120Hz: Ripple current <20% Ripple voltage <3% - Standard solution takes up a large volume. *New technique required.*<br><br>Thermal Management: Maximum hotspot temperature 60oC in a 30oC ambient<br><br>Electromagnetic Compliance: FCC Part 15B. Conducted and Radiated |

Transformer (one of 3)

(Would actually use twisted fine wires to reduce leakage inductance)

Torroid OD=12.5mm, ID=8.5mm  Al= 2000nH/turn$^2$ $L := 2400 \cdot uH$ $I_{pk} = 0.25 A$   $B_{pk} = 92.392 \, mT$ total_transformers_volume = 2.45 in$^3$ Losses (est) @150kHz:
total_transformer_core_losses = 1.18 W
total_transformer_conduction_losses = 2.659 W

Adiabatic Transformer Operation

All parasitic capacitance energy is recoverable if slew rate <<RC.

Select Lp for transformer to get sufficient Imag to slew Ctotal within the non-overlap time.

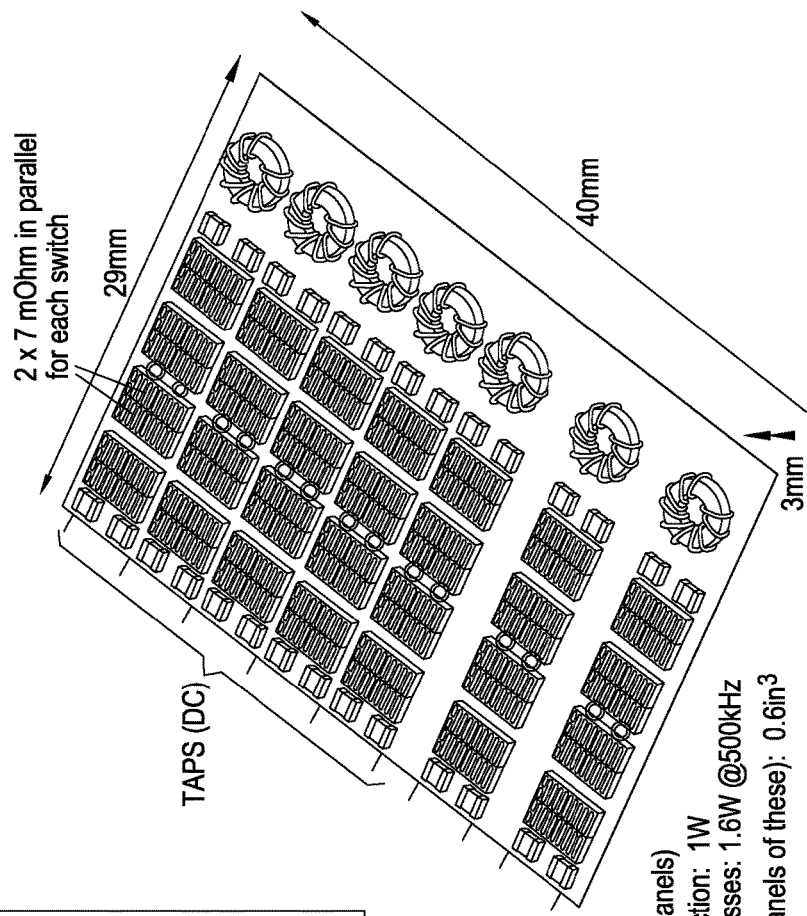
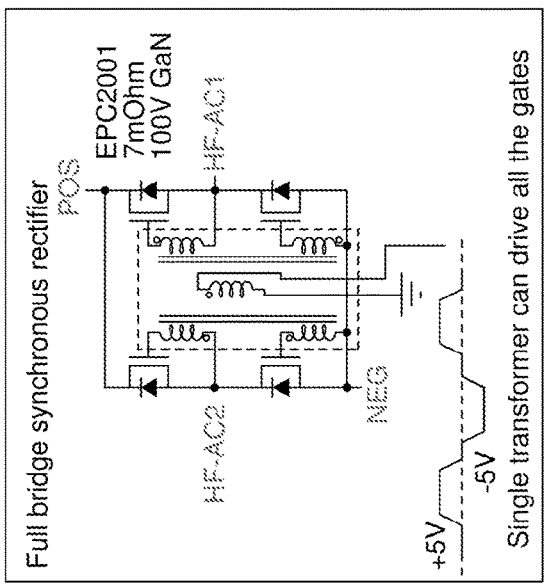
Fig. 51

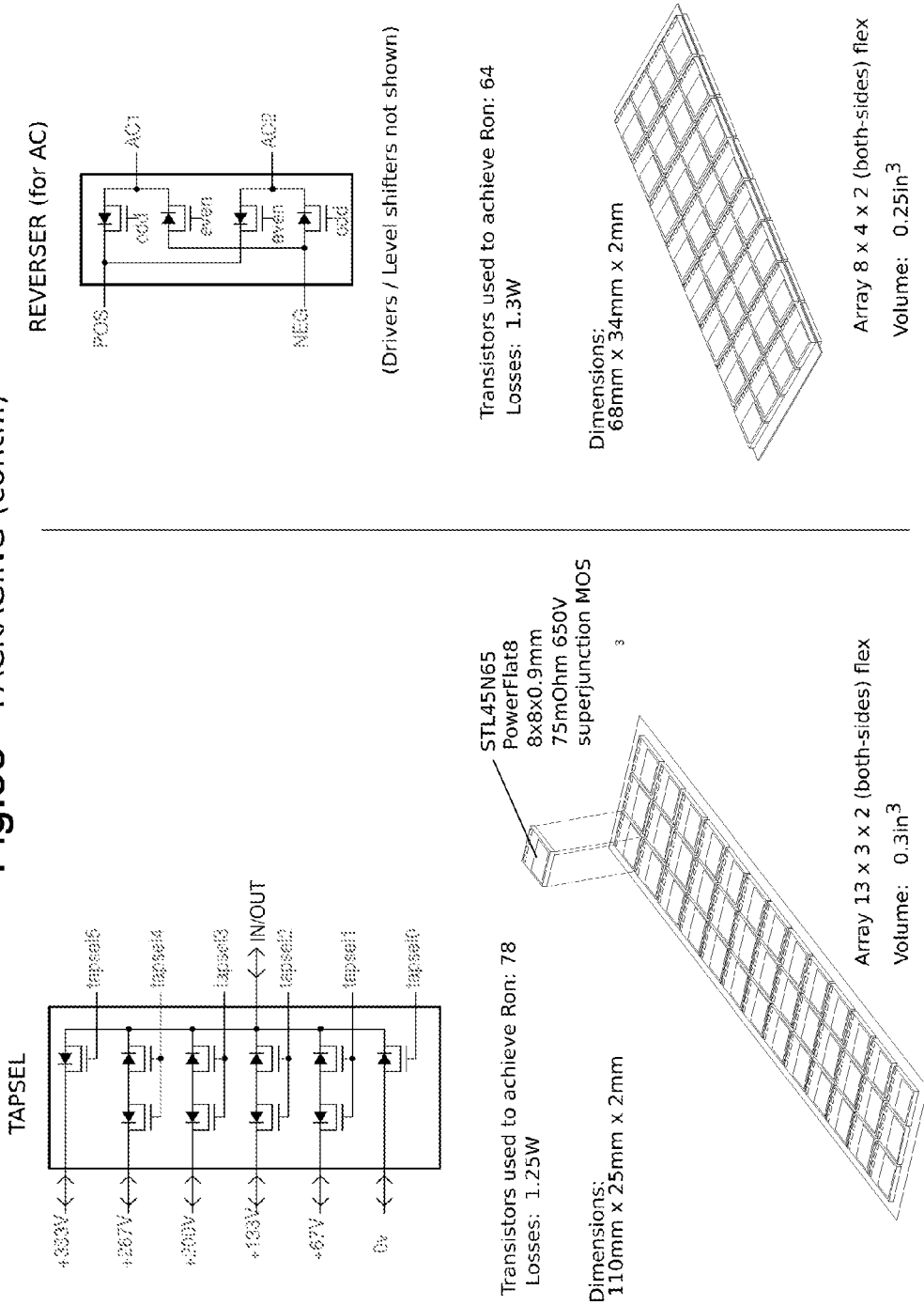
Fig. 58 PACKAGING (cont...)

Fig. 59  PACKAGING (cont...)
INDUCTORS FOR BLENDER
Wurth HCI series, 47uH 33mOhm x3 on Flex PCB
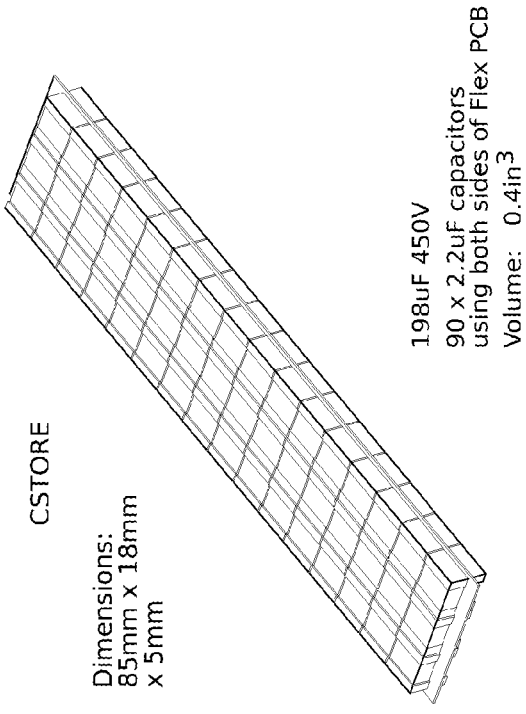
CSTORE
Dimensions:
85mm x 18mm
x 5mm
198uF 450V
90 x 2.2uF capacitors
using both sides of Flex PCB
Volume: 0.4in³
Losses: 0.9W @ 3 x 3A
Volume: 0.6in³
Dimensions: 60mm x 20mm x 10mm
SiC BJTs + I-MODE base drivers
- Wire bonded transistors
  and flip-chip for drivers
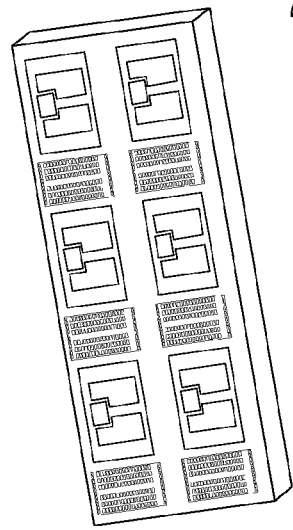
Losses: 1.9W total
all 3 transformers
Dimensions: 12.5mm x 7.5mm x 1mm

Fig. 62

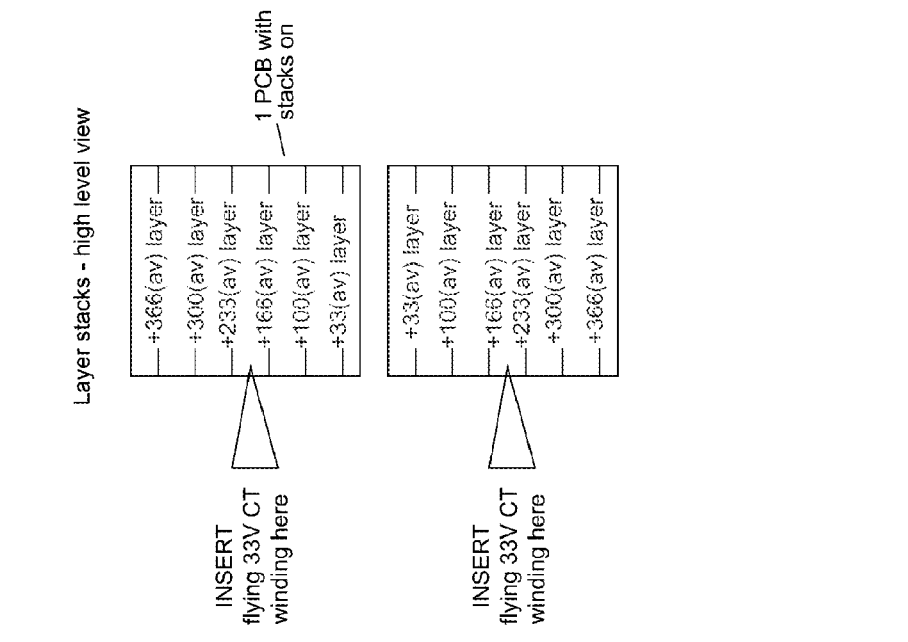
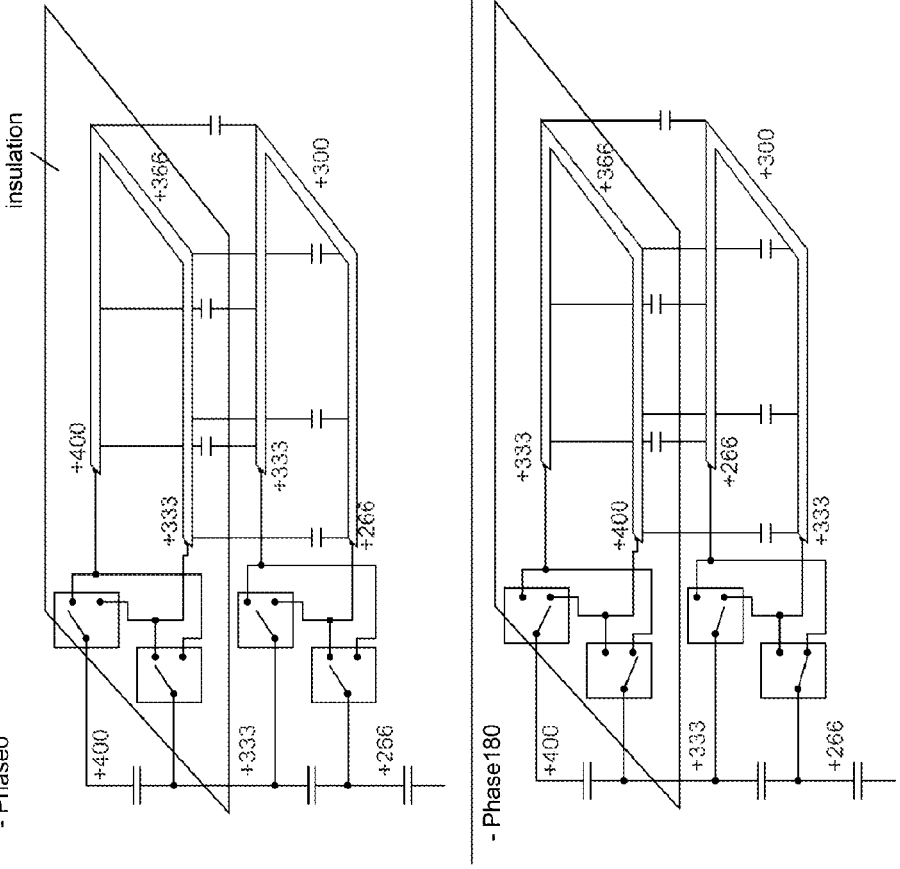
Fig. 63

POWER COUPLER

RELATED APPLICATIONS

The present application claims priority as a US national phase under 35 U.S.C. 363 of PCT/GB2015/054040 filed on Dec. 16, 2015, the disclosure of which is incorporated herein by reference.

FIELD OF THE INVENTION

This invention is in the field of power and impedance conversion technology.

BACKGROUND OF THE INVENTION

This invention is in the field of power and impedance conversion technology. It represents an improvement in size, weight and protection features for AC transformers used today mostly for industrial applications. In this context, an AC transformer is defined as an inherently bi-directional coupler of AC electrical energy i.e. AC<->AC unlike the more common AC->DC->AC or DC->AC conversion process used for example in Uninterruptible power supplies and Sine-Wave inverters respectively.

Since the 1980's most traditional AC transformer applications e.g. Computer power supply, Television power supplies have moved to switch-mode power supply (SMPS) conversion methods which replace the bulky iron-core line-frequency transformer core with an AC->DC stage (rectifier+smoothing capacitor)+isolated DC->DC stage incorporating high frequency ferrite magnetics.

While these new technologies serve their applications very well, there is still a large market for traditional AC power transformers especially in the industrial field.

Although much heavier than high-frequency switch-mode AC->DC or AC->DC->AC power supply, the traditional line-frequency (50, 60 or 400 Hz) AC transformer remains largely untouched in industrial power applications due to the following reasons:

- Low cost
- Simple—no electronic components.
- Extremely long life—no electrolytic capacitors, no semiconductors, no cooling fans needed.
- Rugged—Withstand short term overloads and transients.
- Zero electromagnetic interference.

Of all the advantages to the industrial user, the ruggedness of a well-designed power transformer when installed in a power network cannot be matched with prior-art electronic circuitry.

Not only does this reliability stem from the inherent simplicity of a transformer, it is just as much a function of another inherent ability of the AC transformer i.e. to pass power and transients bi-directionally between AC source and the load.

A typical example illustrates this feature: Where high power inductive load is switched off quickly, there is often a large 'kick-back' of electrical transient energy towards the power supply.

While a switch-mode power supply with potentially an AC->DC->AC conversion system has no inherent way to deal with this surge coming back into its output (except to try and absorb it), a standard AC transformer being a bi-directional device will naturally couple this energy back to its AC power input where it is dissipated back into the power grid. This effect eliminates the requirement for the transformer to absorb this energy. Similarly, when an mains-borne input transient enters into a SMPS, it cannot easily pass this pulse to its outputs and again must attempt to absorb it without exploding. Virtually all AC transformers in an industrial setting have loads such as motors, heaters, lamps which are well able to safely absorbing most transients passed on to them.

SUMMARY OF THE INVENTION

According to one aspect of the present invention, there is provided a power coupler for connecting AC or DC electrical circuits having different voltages, current or impedance levels, the power coupler comprising:
- a first switching device;
- a second switching device coupled with the first switching device;
- a power transformer comprising a first core winding and a second core winding;
- a first capacitance coupled between the terminals of the first core winding;
- a second capacitance coupled between the terminals of the second core winding; and
- a third capacitance coupled between the first and second cores windings;
- wherein the power transformer and the capacitance are coupled with the first and second switching devices, and wherein the power coupler is configured to reduce switching power loss using an adiabatic technique and by selecting appropriate switching time of the switching devices.

It will be appreciated that the term 'capacitance' refers to the capacitance (parasitic) which are already included in the active and magnetic components of the circuit, e.g. switching devices and/or transformer. One effective capacitance figure is an approximation of the contributions of all of these. It would be appreciated that this term also covers capacitors which may be externally coupled.

Adiabatic processes in general are those which exchange energy from one place or one state to another but do not increase the entropy of the system. Usually applied to gasses where there are numerous combinations of pressure, density and temperature which represent different amounts of unrecoverable low grade energy generated by irreversible processes such as turbulent compression.

In electronics, adiabatic has been used to mean reversible actions so an LC tank is an adiabatic system because the energy can circulate between magnetic flux and electric field during resonance [reversibly]. Crucially, the rate of change of voltage or current must be low enough relative to the parasitic resistances involved that at all times there is a low value of heat being generated in the resistance. For this invention it is important that the slew rates are low enough relative to the parasitic resistance (switch resistance, winding resistance) R*C product time constant must be much lower than the L*C time constants. What it boils down to in practice is that for all voltage differences in a system where current is flowing, i.e. V*I energy flowing, the voltage drop must be over an inductive element so that the energy is being stored somewhere where it can be recovered. The converse is that V*I power is being wasted over a resistance or a non-fully-turned-on transistor. If the inductor is maintaining the voltage difference over it then it's either building up its internal flux or reducing it (depending on the sign of the voltage relative to the current flux direction in the core).

When the transistors do actually turn on at the flat tops of the waveform (see FIG. 48) the magnetisation current waveform that first of all magnetic energy is pushed from the magnetisation current of the transformer into the power supplies until the current gets to zero (about half way through the flat-top period) and after this the current starts to go the other way, back from the power supply into the transformer. So the power switches conduct current but only where there is almost no voltage across them making it possible the reversible mechanism above.

The adiabatic technique may comprise interchanging magnetic and capacitive energy between the capacitance of the first and second switching devices and the transformer inductance between the transformer core windings.

The adiabatic technique may further comprise selecting switching time of the switching devices so that the resonant time constants are synchronised with the switching time.

The adiabatic technique may stepwise charging of the capacitance on the gates of the switching devices using a multi-level DC supply via a further transformer.

The adiabatic technique may comprise interchanging magnetic and capacitive energy between capacitance of the first, second and third capacitance coupled with the transformer and the inductances between the transformer cores, and selecting switching time of the switching devices to synchronise with the resonant constants thereof.

The adiabatic technique may comprise interchanging magnetic and capacitive energy between the capacitance of the first, second and third capacitance coupled with the power transformer and the inductances between the transformer cores, and selecting switching time to synchronise with the resonant time constants thereof.

Additional capacitance may be added to reduce the slew rates to aid adiabatic efficiency.

The switching time may be selected in proportion with the capacitance and inductance of the transformer cores.

The switching time may not in proportion with the voltages of the switching devices.

The inductance of the transformer cores may be about 2500 µH.

The inductance of the transformer cores may be selected to get a sufficient current which slews the total capacitance of the capacitors within non-overlap switching time.

The transformer may be configured such that magnetisation energy slews the capacitors automatically and adiabatically.

The switching devices may be gate insulated transistors.

The first and second switching devices may be coupled with the first core winding of the transformer.

The power coupler may be arranged in a half bridge configuration.

The power coupler may further comprise third and fourth power devices coupled with the second core winding of the transformer.

The power coupler may be arranged in a full bridge configuration.

Each switching device may be a bi-directional bipolar junction transistor (BJT) structure, comprising:
  a base region of a first conductivity type, wherein said base region constitutes a drift region of said structure;
  first and second collector/emitter (CE) regions, each of a second conductivity type adjacent opposite ends of said base region;
  wherein said base region is lightly doped relative to said collector/emitter regions;
  the structure further comprising:
  a base connection to said base region, wherein said base connection is within or adjacent to said first collector/emitter region.

The BJT structure may further comprise a buried layer of the second conductivity type disposed between the second CE region and the base region.

A power coupler assembly may incorporate a plurality of power couplers as described above, wherein the power couplers are interleaved with one another.

One power coupler may comprise a different phase compared with the other power coupler.

The interleaved power couplers may be configured to provide continuous primary to secondary high bandwidth power coupling.

The transformer core windings may have a common core.

The power coupler assembly may further comprise a voltage tap coupled with each power coupler.

The voltage tap may be a binary-tree voltage scaled tap selection scheme which selects 1 to N voltage taps, and wherein N is an integer.

According to a further aspect of the present invention there is provided a method of reducing switching power loss in a power coupler which connects AC or DC electrical circuits having different voltages, current or impedance levels, the method comprising:
  providing a first switching device;
  providing a second switching device coupled with the first switching device;
  providing a power transformer comprising a first core winding and a second core winding;
  providing a first capacitor coupled between the terminals of the first core winding;
  providing a second capacitor coupled between the terminals of the second core winding; and
  providing a third capacitor coupled between the first and second cores windings;
  coupling the power transformer and the capacitors with the first and second switching devices, and
  reducing switching power loss using an adiabatic technique by selecting appropriate switching time of the switching devices.

The method may further comprise interchanging magnetic and capacitive energy between the capacitance of the first and second switching devices and the transformer inductance between the transformer core windings.

The method may further comprise selecting switching time of the switching devices so that the resonant time constants are synchronised with the switching time.

The method may further comprise stepwise charging the capacitance on the gates of the switching devices using a multi-level DC supply via a further transformer.

The method may further comprise interchanging magnetic and capacitive energy between capacitance of the first, second and third capacitors coupled with the transformer and the inductances between the transformer cores, and selecting switching time of the switching devices to synchronise with the resonant constants thereof.

In embodiments, there is provided a power coupler able to connect AC or DC electrical circuits together which may be at different voltage, current or impedance levels comprising of digital control circuit for multi-phase overlapping switches which exist on both sides of (a) high frequency transformer(s) in a duplex synchronous modulation/demodulation fashion.

The switches may be inherently AC to support simultaneous 2-way power transfer between the ports of the power coupler.

The power coupler may comprise multiple smaller couplers organised to switch at staggered timing intervals and with inputs and outputs combined to eliminate gaps in power transfer path between the two ports.

No power-storing electrolytic capacitors may be used.

The power coupler may be at the same nominal voltage, current or impedance where there is a desire to achieve electrical isolation between ports.

The power transfer path may be bi-directional.

The power transfer path may be capable if passing power waveforms without distortion even if those waveforms are significantly higher frequency than even the inherent transformer switching i.e. modulation frequency.

The coupler may be made using multi-phase overlapping converters, the number of which is higher than the minimum required, in order to make use of lower cost commodity Mosfets, IGBTs and magnetic components.

The number of sub-couplers may be chosen based on the ability to distribute and dissipate heat from the lossy devices within a constrained size or weight budget for heatsinking system.

The power coupler may have the ability to pass transients from one port to the other without having to absorb them.

The switching conditions of the power transistors may be 'Soft' where they are switched at zero-current and/or zero-voltage to reduce switching losses especially for IGBT type transistors.

The power coupler may be configured to convert 230 Vac to 110 Vac furnishing in a centre-tapped 55 vac to ground output for use in UK construction site applications.

The unit may be powered up from either direction making it a true transformer replacement for applications in a mains or other power grid.

The power coupler may incorporate a CPLD or Microcontroller device for implementing safety state machines, digital switch control and startup/shutdown sequences.

The power coupler according to any preceding claim where an electronic RCCD (earth leakage detection) is directly facilitated with the addition of extra control logic and voltage drop detection referenced to a mid-tap on a coupler's nominal 'output' port.

The short circuit electronic current limit may prevent sparks upon short circuit condition. The power coupler may incorporate a line-synchronous start-up circuit which begins conversion synchronous to zero crossing of the power waveform preventing high inrush and output surge currents.

The power coupler may incorporate mains voltage monitoring and control logic to shut down a half-bridge centre-tapped transformer drive arrangement to give overvoltage protection to above 2× nominal input peak voltage rating.

The surge rating of semiconductor devices may be above 5× to 10× nominal current passed through each device and voltage rating is 1.75× or higher than nominal voltage stress.

The redundant switching devices may be removed and replaced with wire links in the case of non-AC power coupling applications where input and output are DC and polarities are known in advance.

The power coupler may be able to connect AC to DC electrical circuit each which may be at different voltage, current or impedance levels comprising of digital control circuit for multi-phase overlapping switches which exist on one side of a high frequency transformer, the other side using rectifiers to create a power level with DC component suitable for powering low grade loads.

There may be no cooling fan being used.

A mechanical assembly to house a power-coupler comprising stacked heatsink means with integrated and dispersed power transistors and where the unit is double insulated by virtue of isolated-tab power semiconductors and final conformal insulating coating or plastic cover over heatsink fins.

One or more of an IEC 60309 type socket may be included in the mechanical assembly in the moulding for the lowest total space occupied The power coupler or multiple power coupler modules may be configured for Medium Voltage (MV) to Low Voltage class (LV) voltage distribution-type transformer usage for single or polyphase mains power where it is constructed of multiple (series-connected primary, parallel-connected secondary) power-coupler modules with an overall control computer to act as a single intelligent unit.

The voltage and current digitisations may be detected and signalled to the control computer that one or more modules have become defective.

The defective modules may be electronically 'swapped out' for spare modules in the stack using bypass circuits to maintain continuity in the series chain.

The modules may be 'hot-swappable' using bypass circuits to maintain continuity in the series chain in the absence of a module.

The modules may be intelligently and electronically bypassed or un-bypassed at will in the series chain to effect an overall coarse-level voltage regulation.

One or more primary or secondary tap on the HF power transformer may be intelligently multiplexed for a fine-level change in turns ratio to effect a small-level voltage regulation with closed-loop feedback.

A completely failed module may be forced out of circuit by the action of an independent 'crowbar' circuit which forces a fuse to open in the defective module.

Additional battery in each module and additional PWM DCDC converter plus polarity reversal means may be able to sustain output in the presence of short-term input power failure.

The power coupler may continuously adjust its series primary connection string to safely run the semiconductors at close to their maximum rated voltage where currents and hence losses are lower for the same power throughput.

The overall unit may be partially shut-down to save power through full module or sub-module shutdown—where output loading permits.

The power coupler may be arranged in a form factor suitable for 'piggy-back' arrangement to augment or replace a standard MV/LV Distribution transformer.

The majority of $C*V^2*F$ power loss mechanisms may be reduced using adiabatic technique of interchanging magnetic and capacitive energy between capacitance on the insulated-gate switches and the drive transformer inductance and optimising switching timing to synchronise with the natural LC time constants thereof.

The majority of $C*V^2*F$ power loss mechanisms may be reduced using adiabatic technique of stepwise charging of capacitance on the gates of insulated-gate switches from a multi-level DC supply via a drive transformer.

The majority of $C*V^2*F$ power loss mechanisms may be reduced using adiabatic technique of interchanging magnetic and capacitive energy between capacitance on HF power transformer circuits and the inductances of the transformer itself and optimising switching timing to synchronise with the natural LC time constants thereof.

The majority of $C*V^2*F$ power loss mechanisms may be reduced using adiabatic technique of interchanging magnetic and capacitive energy between capacitance on HF power transformers and the inductances of the transformer itself and optimising switching timing to synchronise with the natural LC time constants thereof and where additional capacitance is added to reduce the slew rates to aid adiabatic efficiency.

The power coupler may comprise in part of multiphase interleaved sub-modules working to ensure continuous primary<->secondary high bandwidth power coupling and while outside of the adiabatic transitions function as resistive and transformer-coupled paralleled power sources.

Voltage-sustaining-only non-functional module-stand-in elements may be switched into and out of the series primary chain of modules to increase the short term withstand voltage of the primary circuit during the presence of transients.

A high speed ADC converter and digital differentiation algorithm or mechanism may predict early onset of a primary lightning strike to signal a reconfiguration of primary circuit into a high-voltage-withstand mode.

A high speed ADC converter and digital differentiation algorithm or mechanism may detect early onset of a lightning strike on the secondary side to signal an alternative clamping mode (short circuit) of secondary bridge mosfets (or other switches) to clamp such transients to ground to protect the system.

Insulation between primary and secondary may be Kapton CR (anti-corona version of polyimide film) or equivalent of order of 0.3 mm to 1.5 mm thick between primary and secondary windings of both trigger transformer and the main transformer per 7 kV of rms voltage difference.

The power coupler may be using specially modified super-junction mosfet transistors as the switching elements where these been optimised not for low Ciss, Coss, miller or gate-charge parameters but mainly to give more cost effective low on resistance.

Output impedance may be low to low frequency line currents but high to high frequency data e.g. 8b10 encoded data to allow for high bandwidth—mains signalling system originating at the MV/LV distribution transformer substitute to be inserted.

The power coupler may be using double-gate transistors for AC switching components.

The power coupler may be using two separate transformer based voltage sources plus a buck regulator switching between those two sourced to derive an infinitely variable voltage conversion ratio.

BRIEF DESCRIPTION OF THE PREFERRED EMBODIMENTS

Some preferred embodiments of the invention will now be described by way of example only and with reference to the accompanying drawings, in which:

FIG. 2 shows an AC switching device;

FIG. 3 shows a RCCD module having option 1 for full bridge power coupler module and in option 2 having a half bridge power coupler module (whose centre tap is not mid AC-out voltage);

FIG. 6 illustrates switching transistors and heatsink modules;

FIG. 7 illustrates transformer and heatsink;

FIG. 8 shows control board, power supply units and other control electronics;

FIG. 13 is a string-of Module design for high-voltage series-input, low-voltage parallel output;

FIG. 14 shows an uC (microcontroller) based system;

FIG. 15 shows an example distribution transformer replacement;

Figure 16:
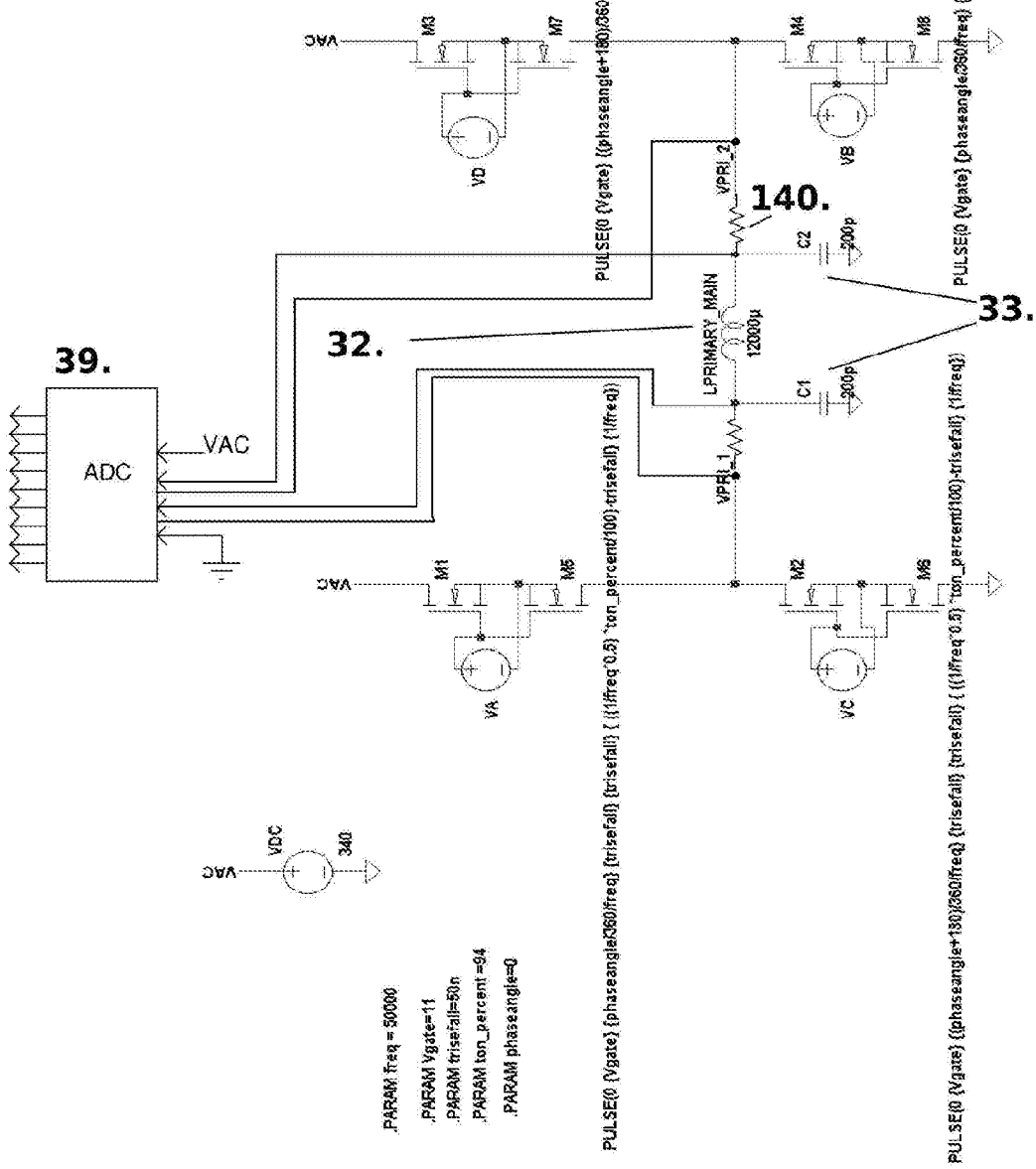
FIG. 16 shows padding capacitance.
Figure 22:
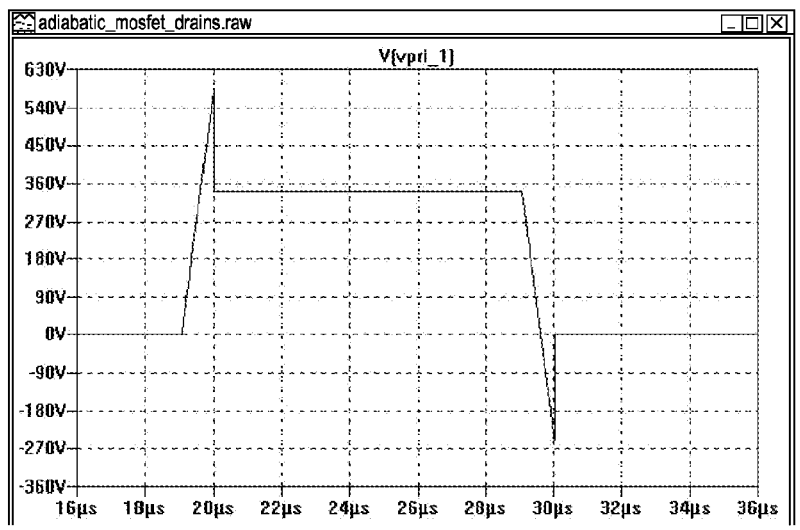
Figure 23:
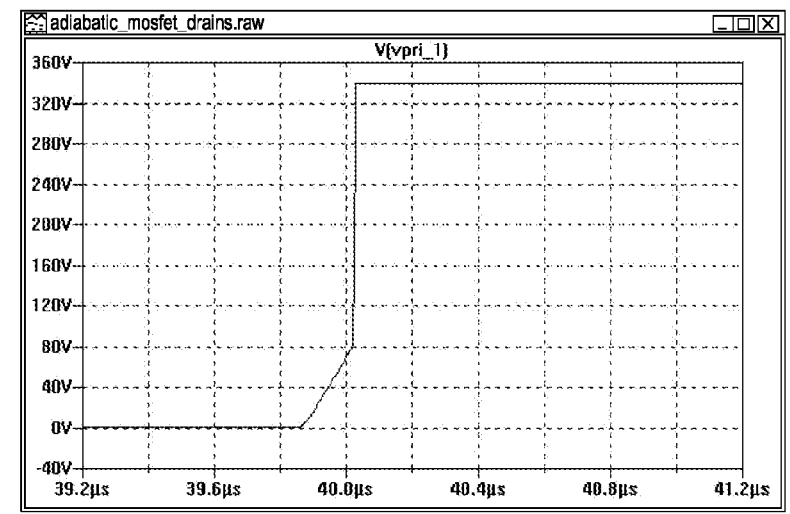
Figure 24:
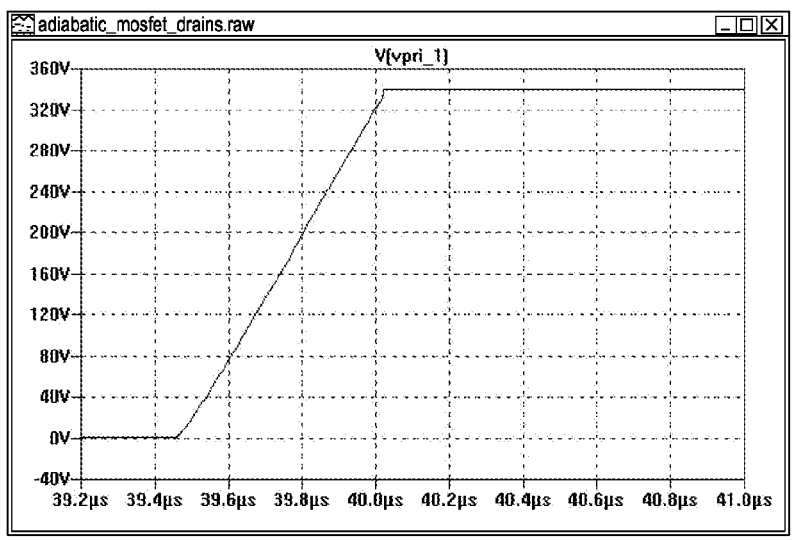
Figure 25:
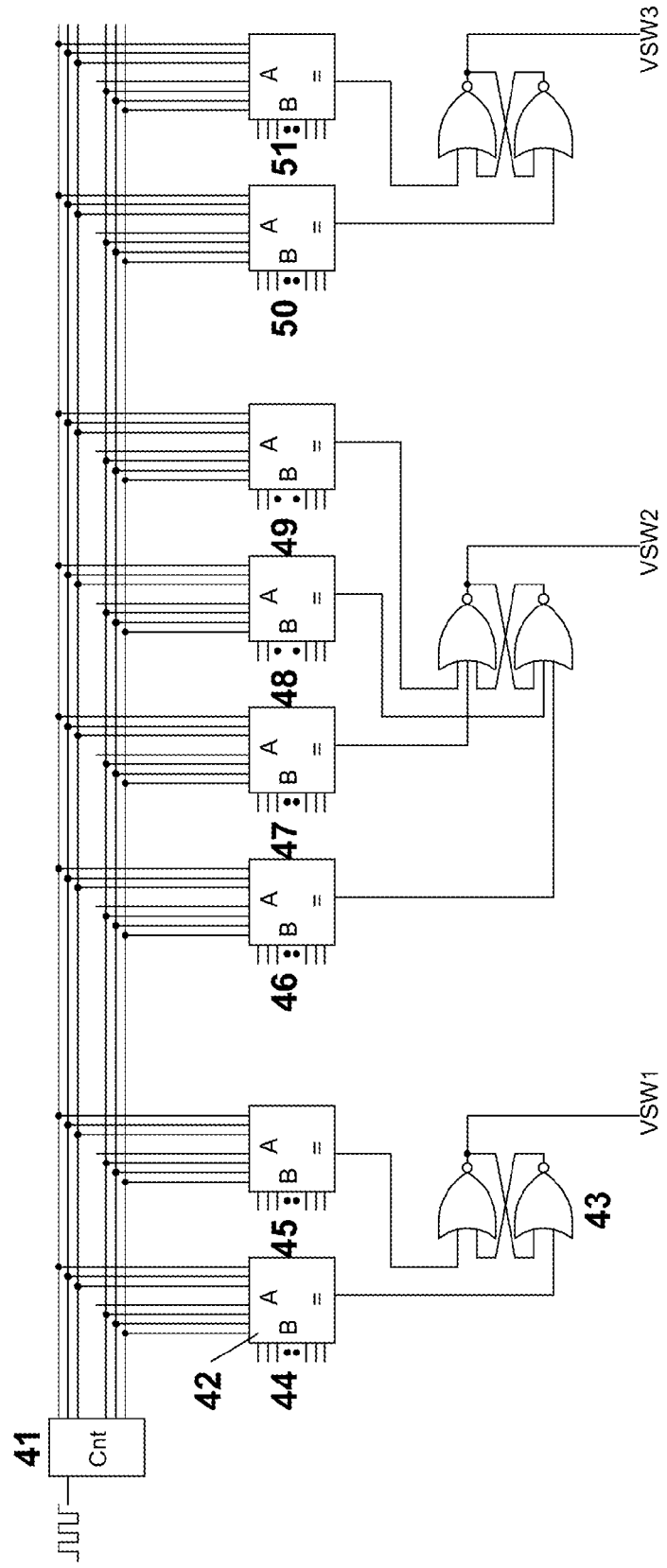
Figure 26:
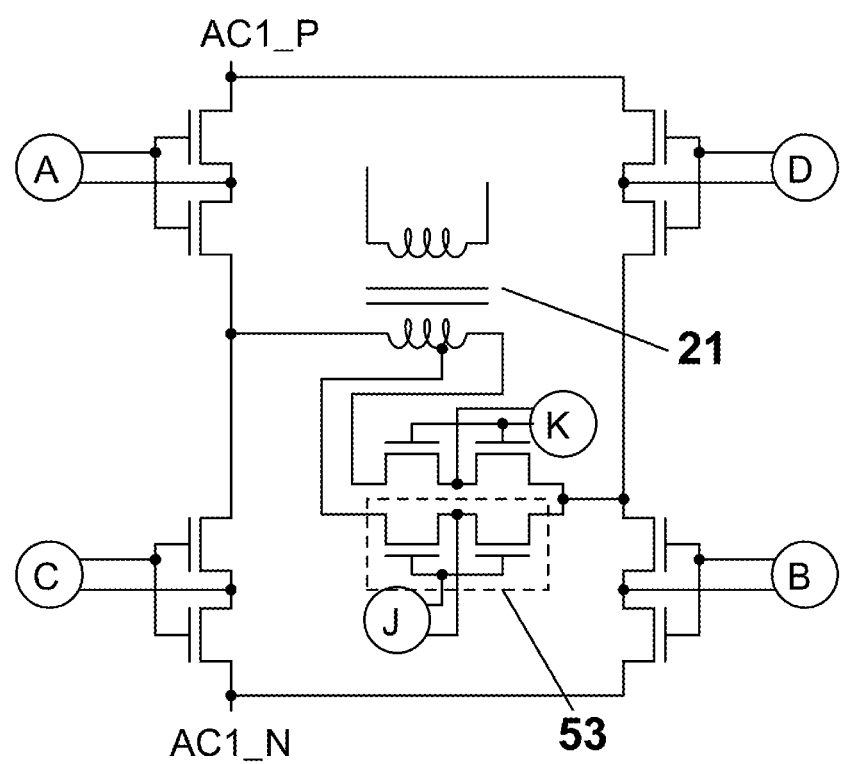
Figure 28:
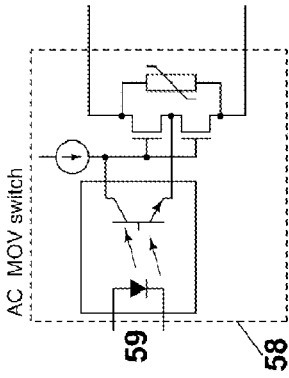
Figure 29:
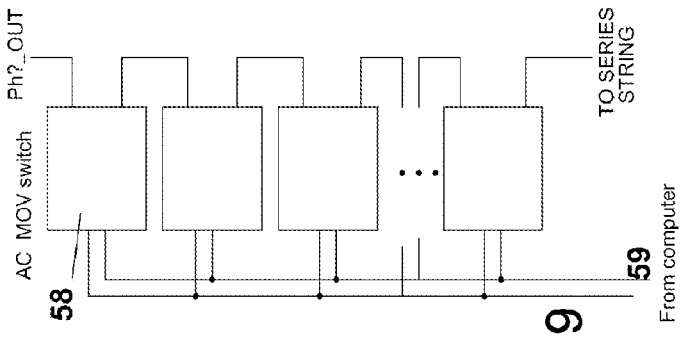
Figure 27:
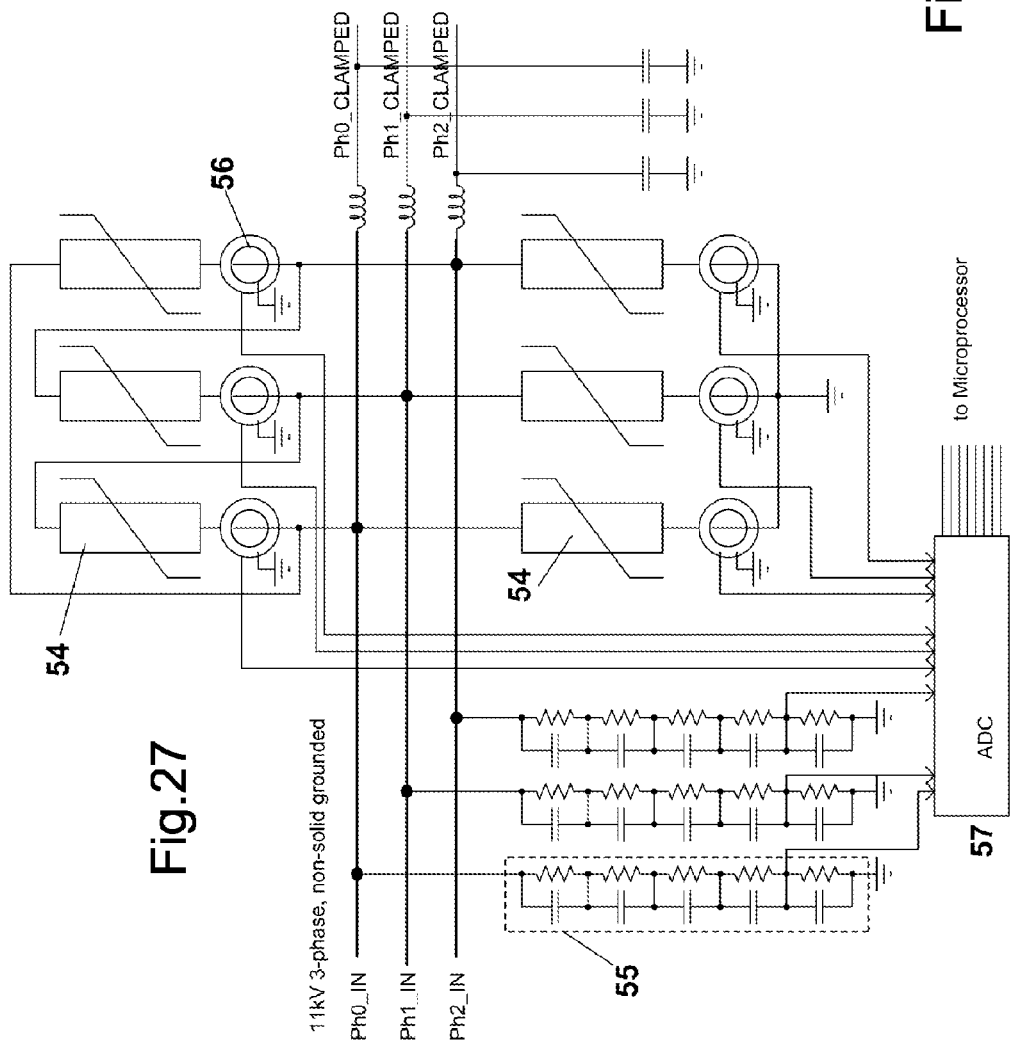

FIG. 18 has the controlling and resultant Vgate waveforms of the circuitry;

FIGS. 19, 20, 21 are the different waveforms at Vgate with undershoot, overshoot and ideal waveforms respectively;

FIGS. 22, 23, 24 are the different waveforms at Vgate with overshoot, undershoot and ideal waveforms respectively;

FIG. 25 illustrates a CPLD circuit;

FIG. 26 illustrates a fine tune tapping circuit;

FIG. 27 illustrates a transient protection circuit;

FIGS. 28 and 29 illustrate 'dummy' voltage-sustaining series modules which can stand in for normal modules and added in the strings shown for FIG. 13 and FIG. 16

Figure 1:
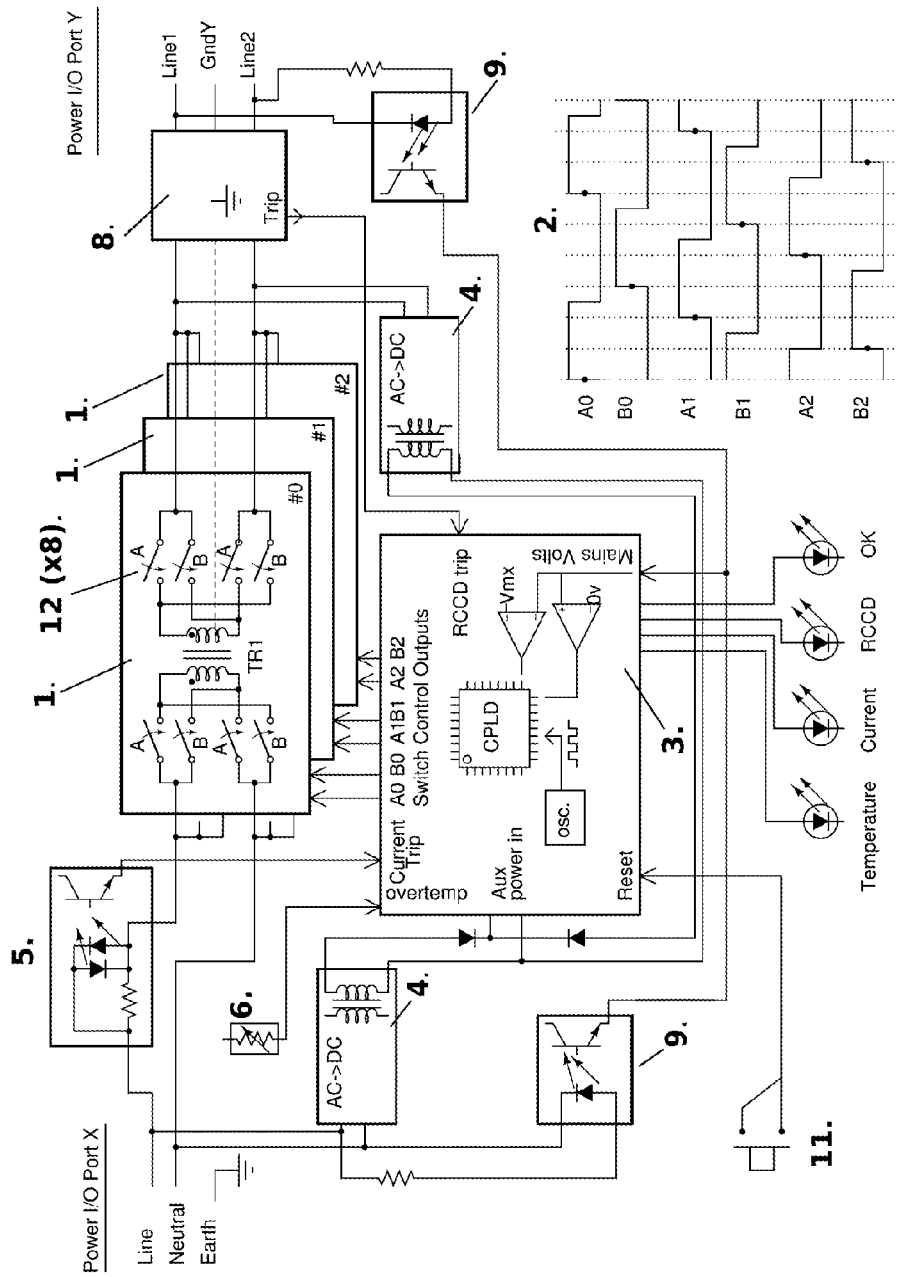
FIG. 1 shows a block diagram of an active magnetics circuit board.
Figure 30:
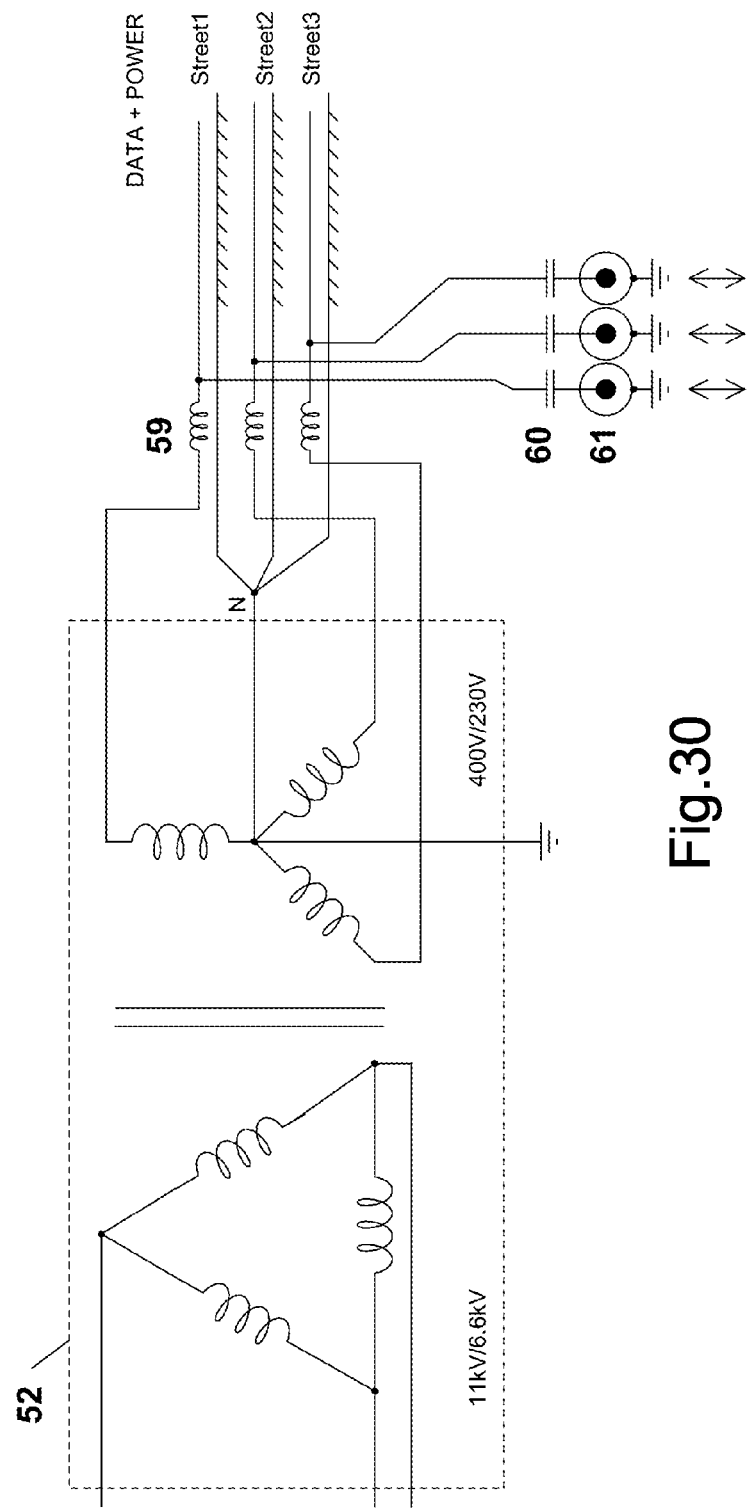
Figure 31:
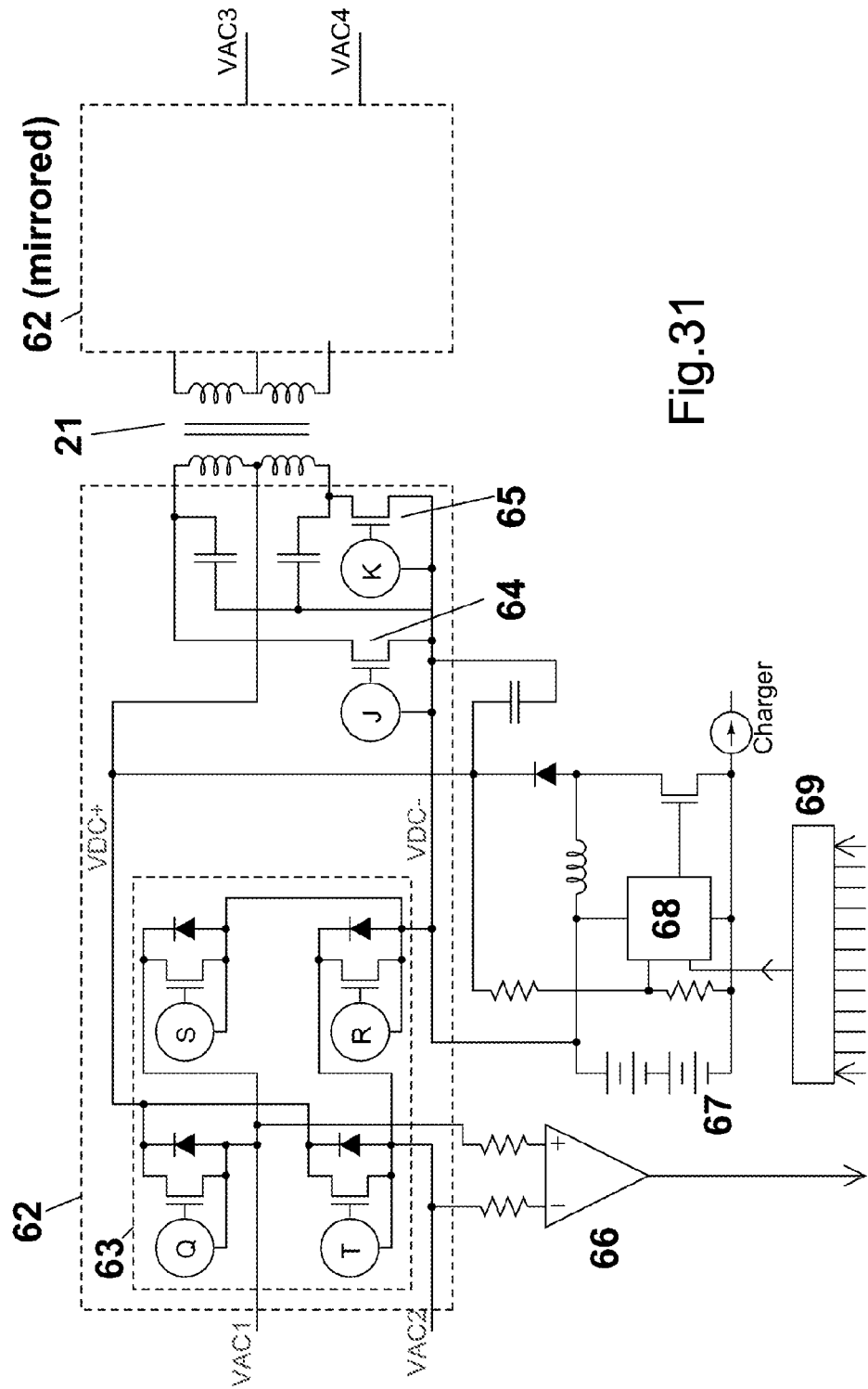
Figure 32:
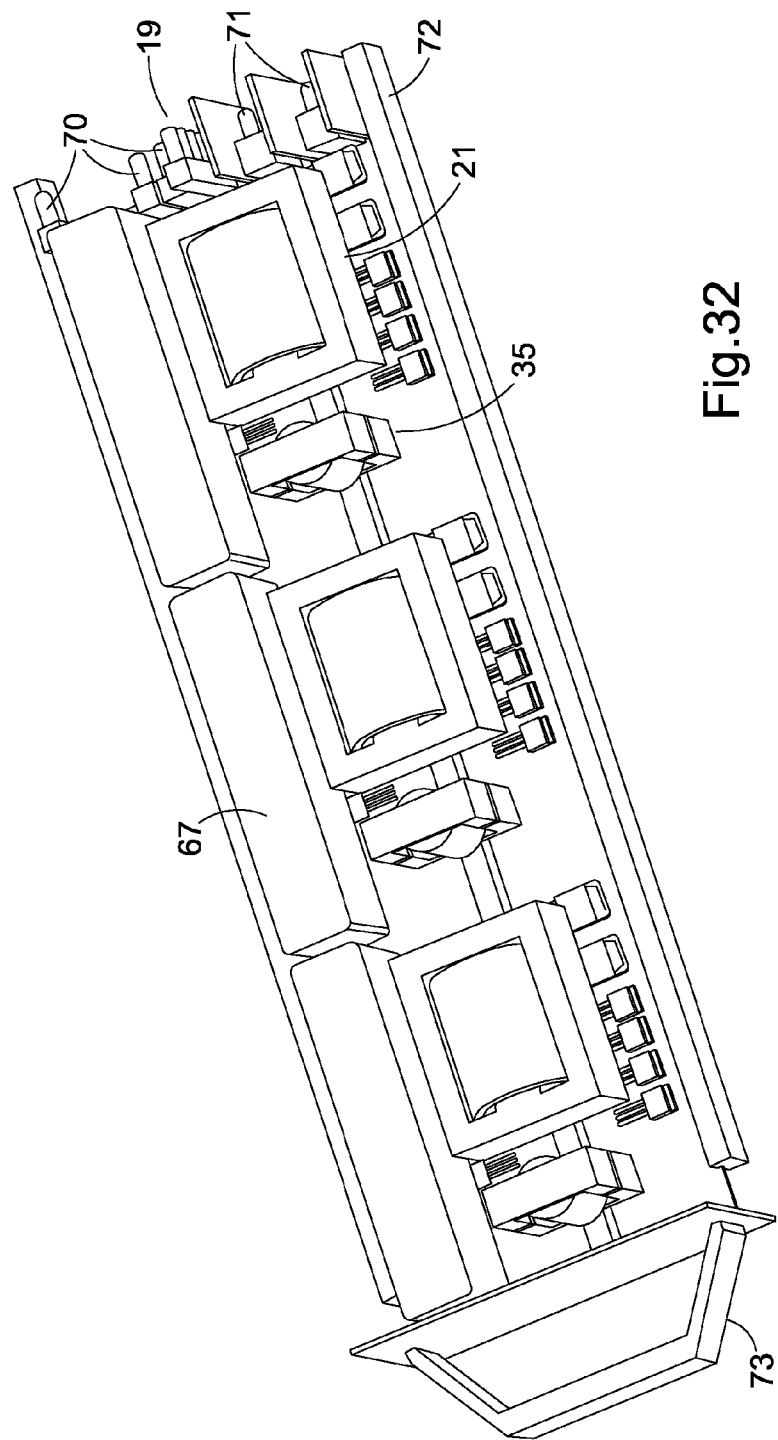
Figure 33:
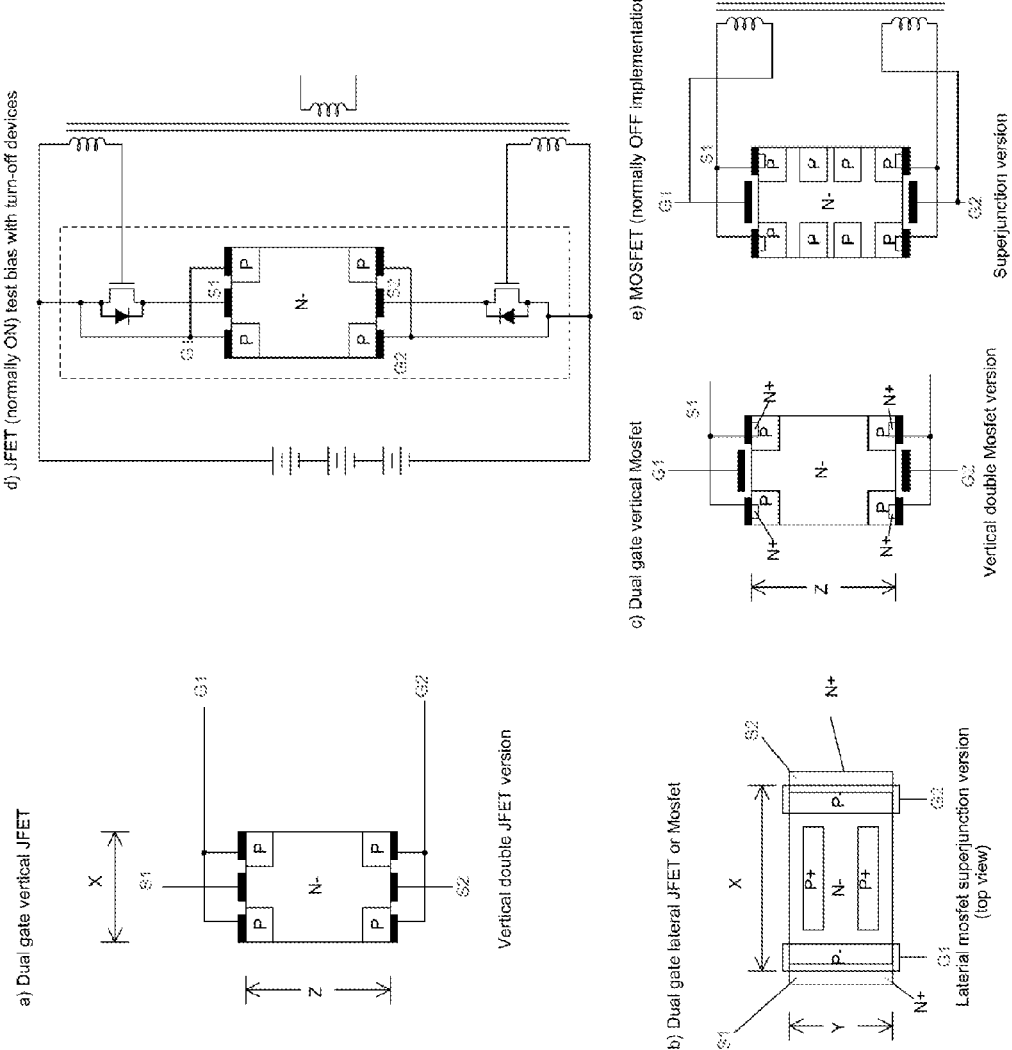
Figure 34A:
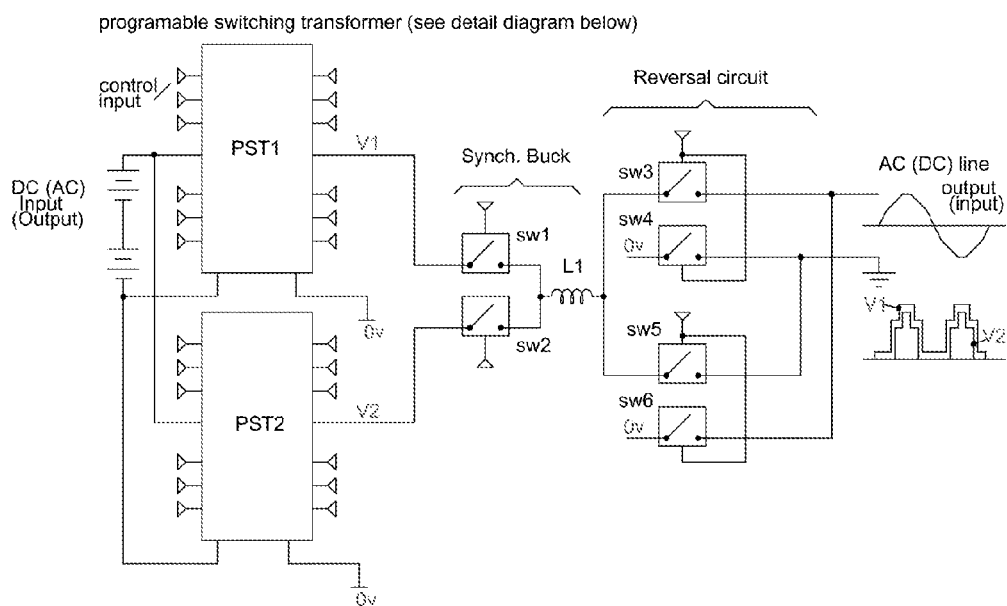
Figure 35:
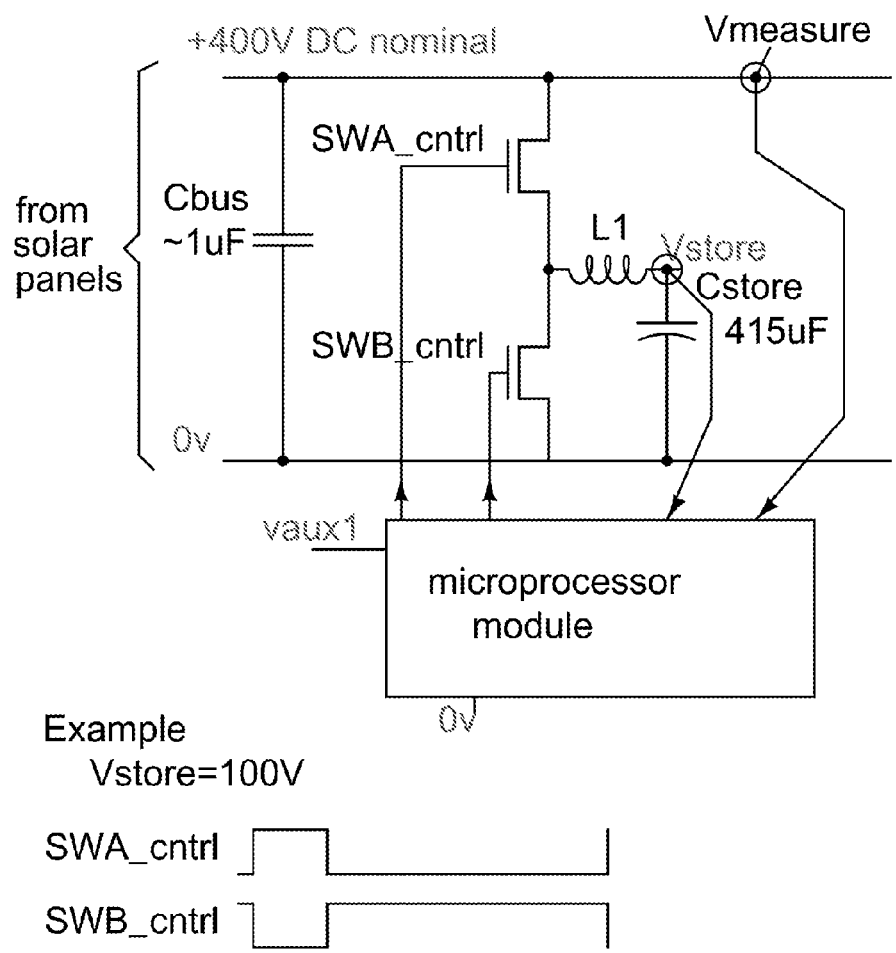
Figure 38:
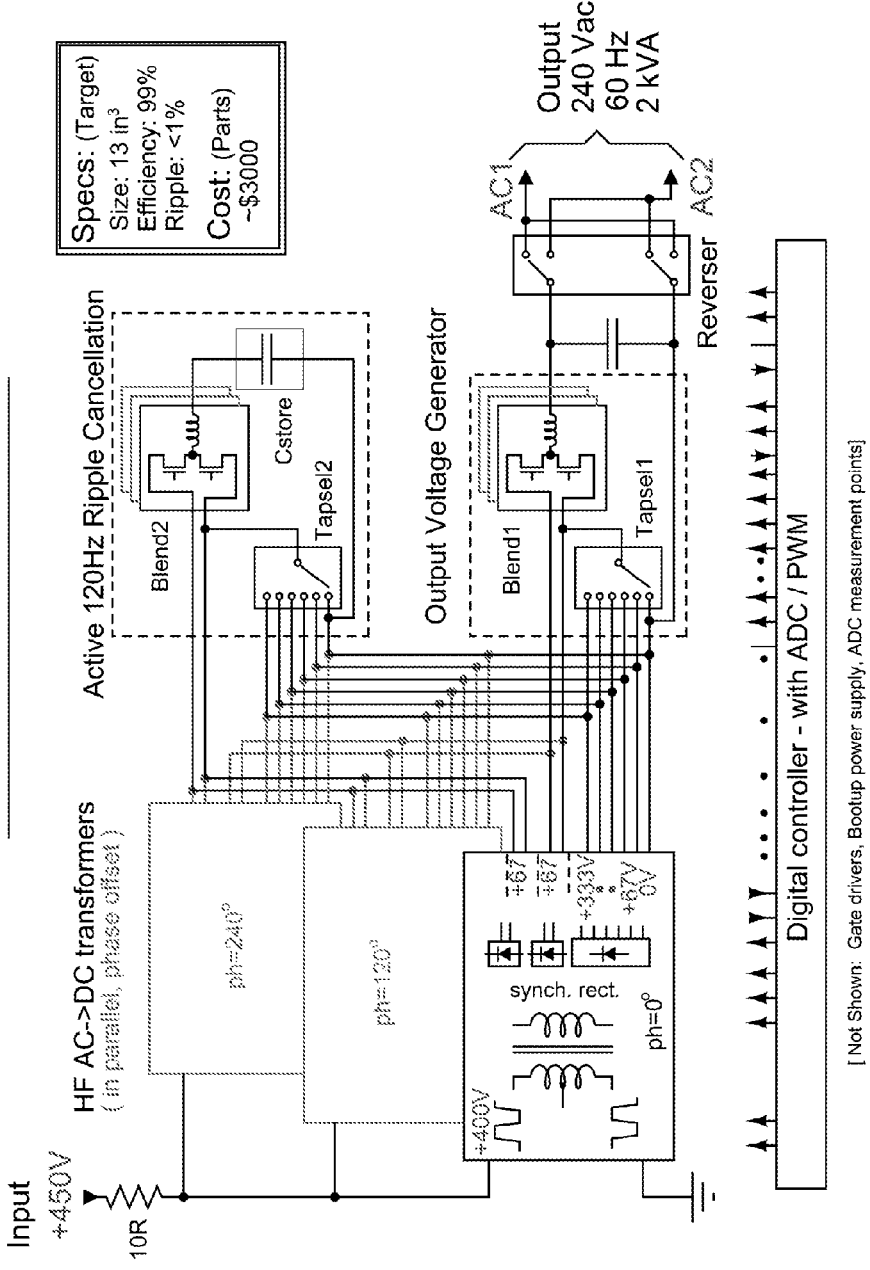
Figure 39:
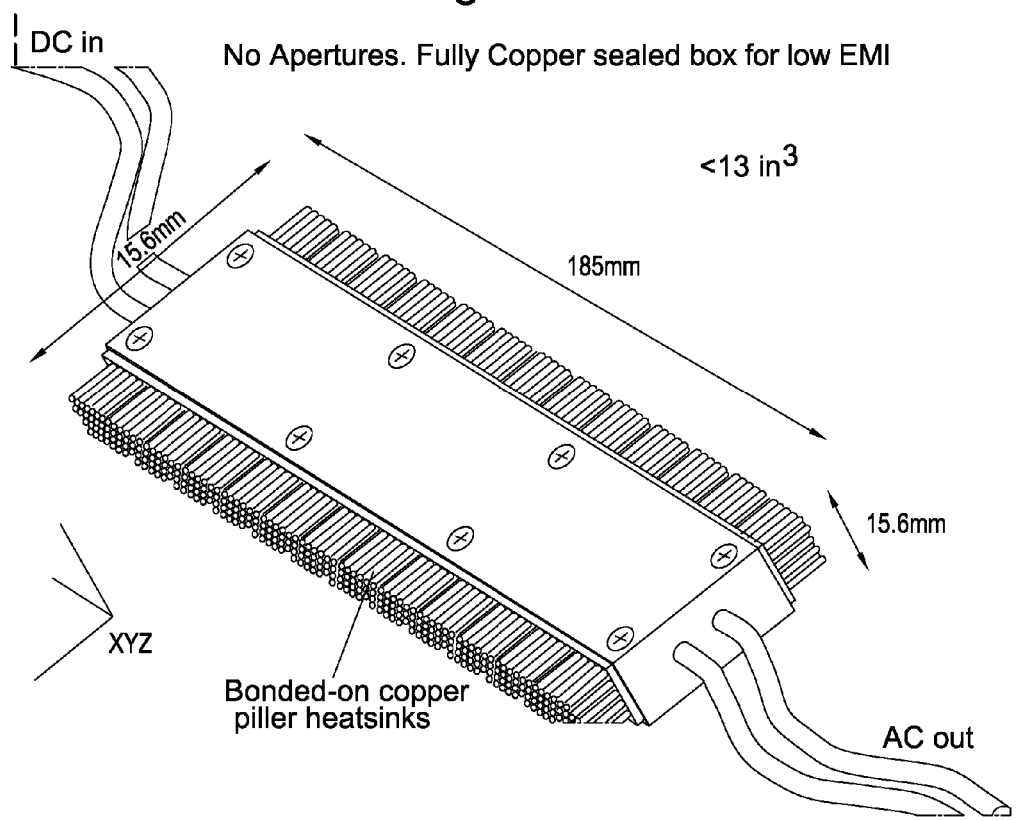
Figure 40:
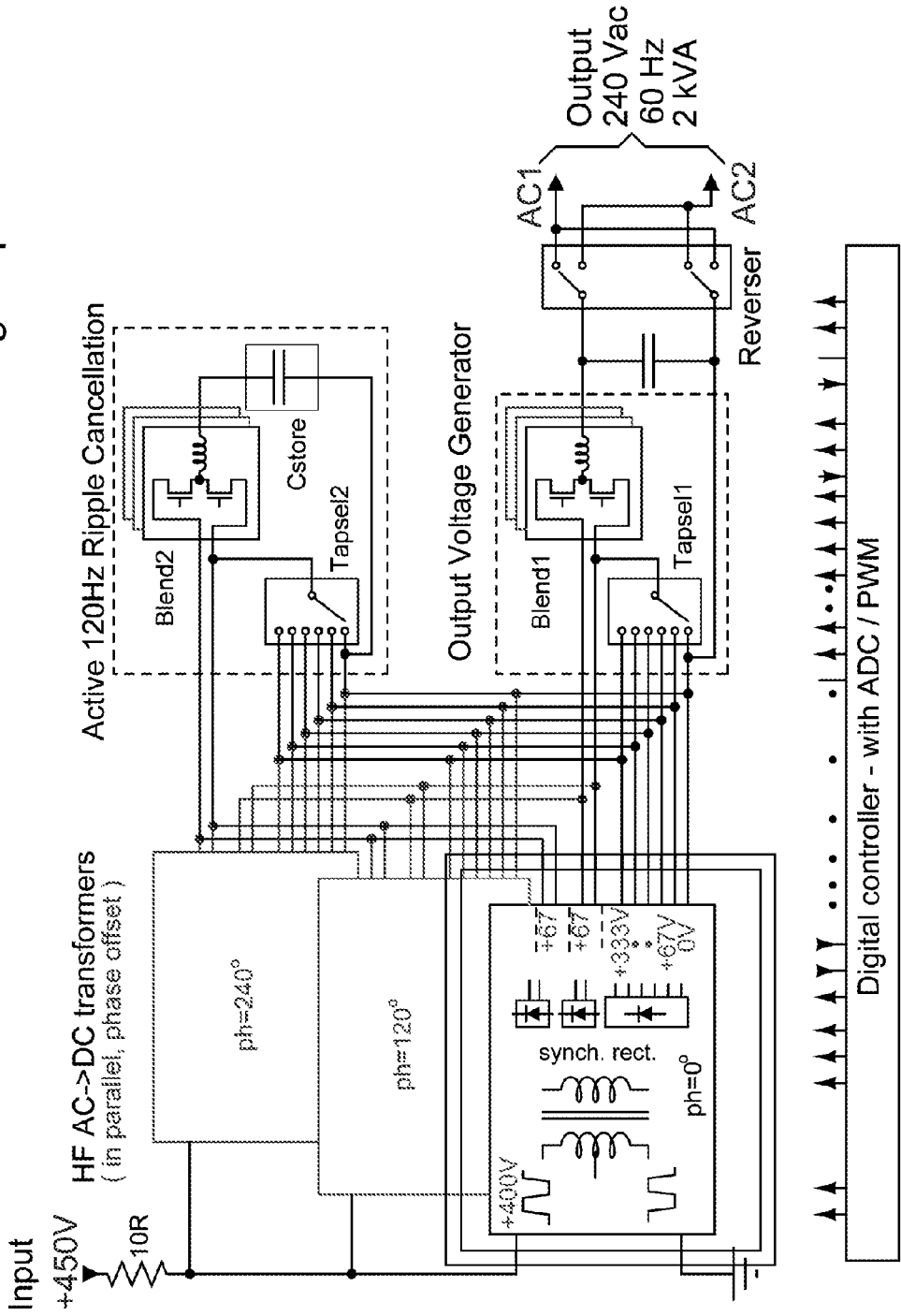
Figure 41:
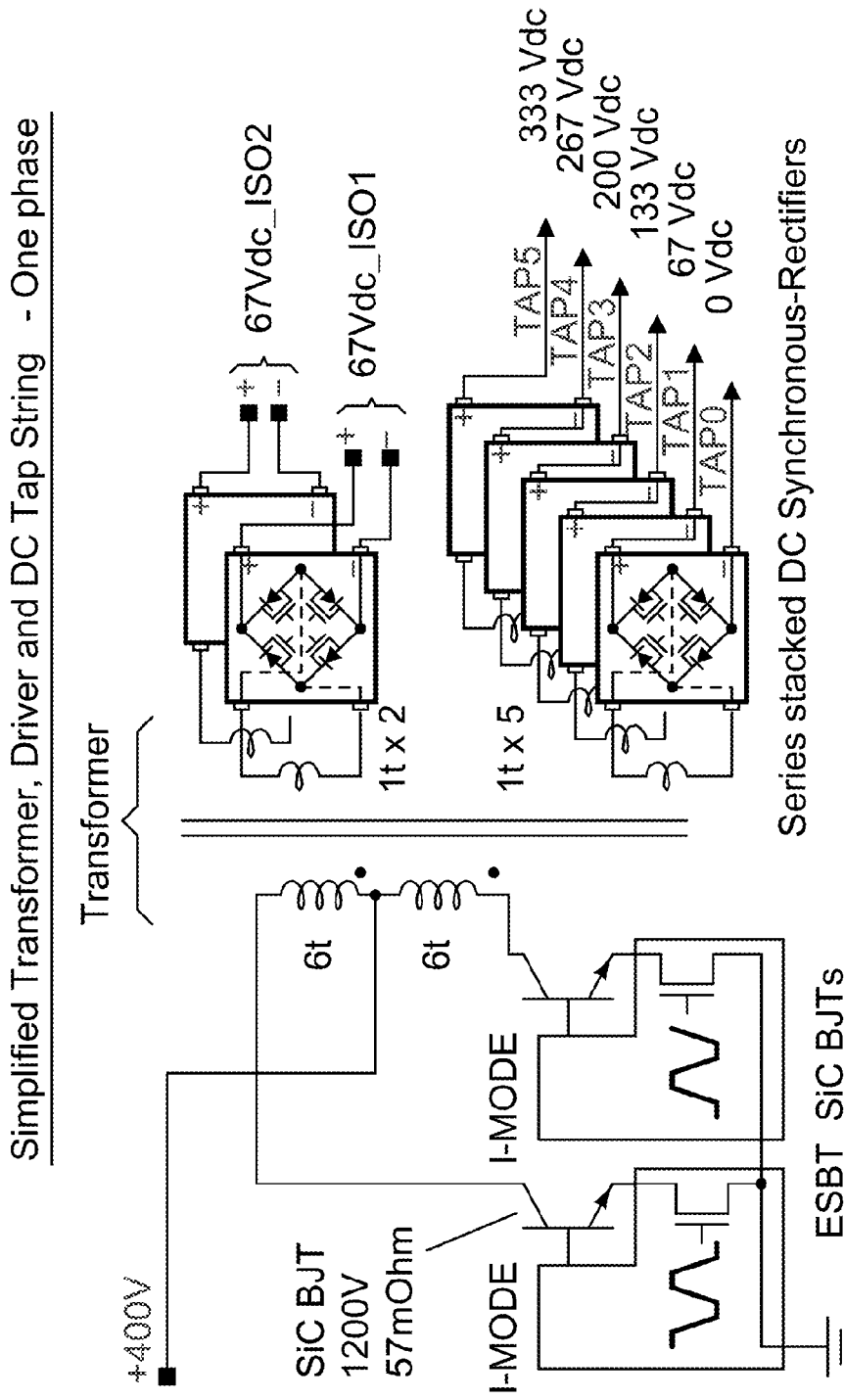
Figure 42:
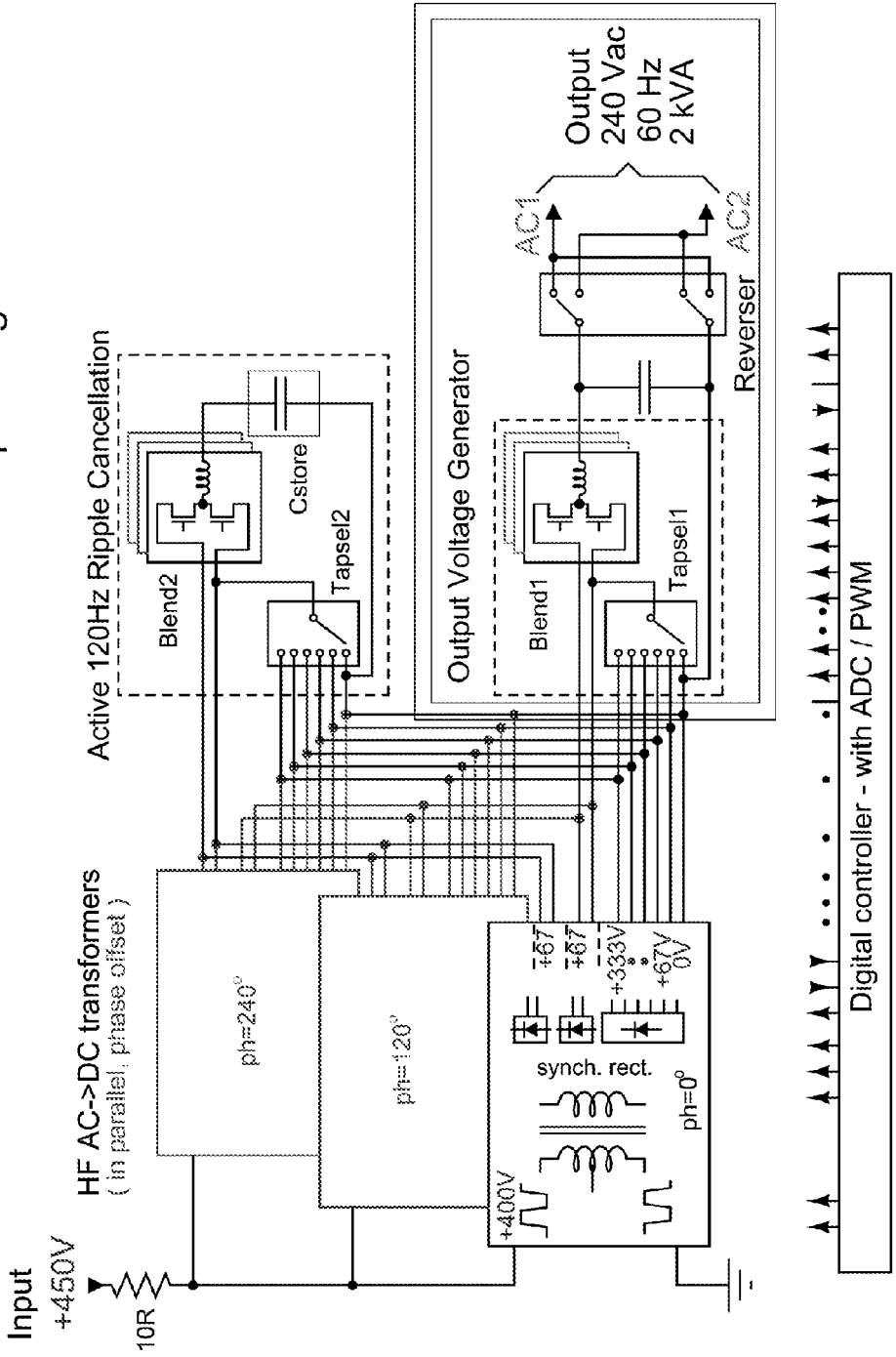
Figure 43:
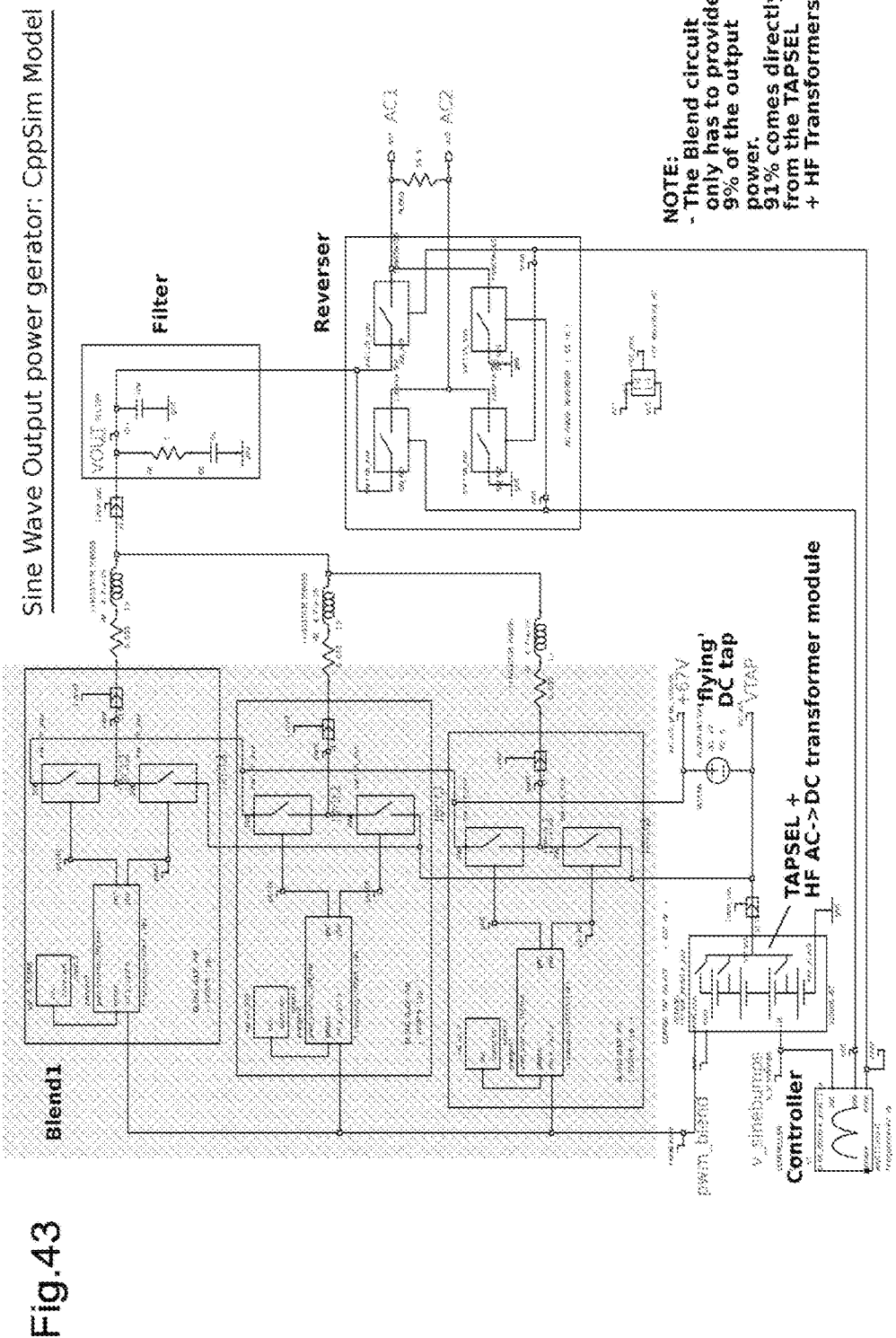
Figure 44:
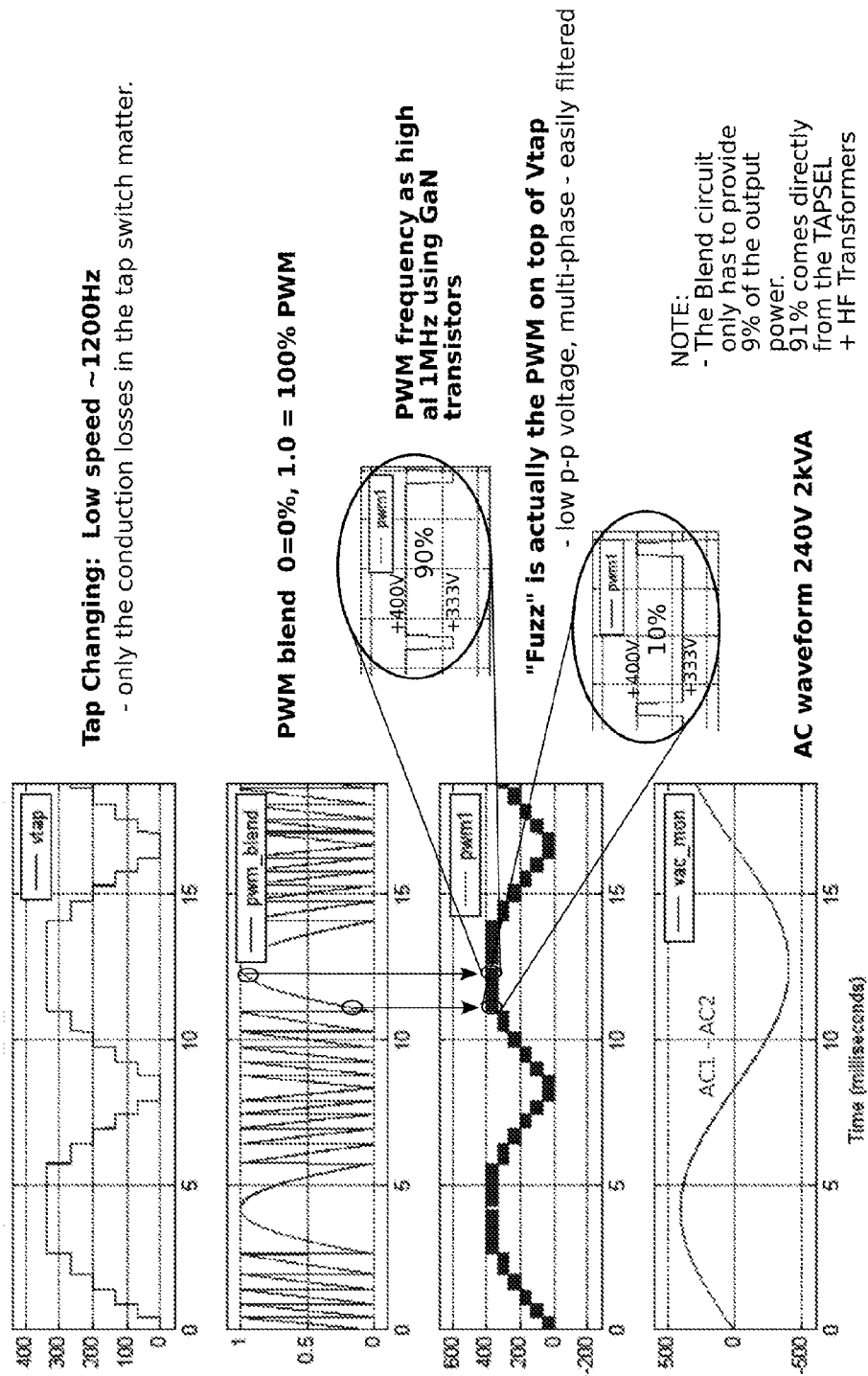
Figure 45:
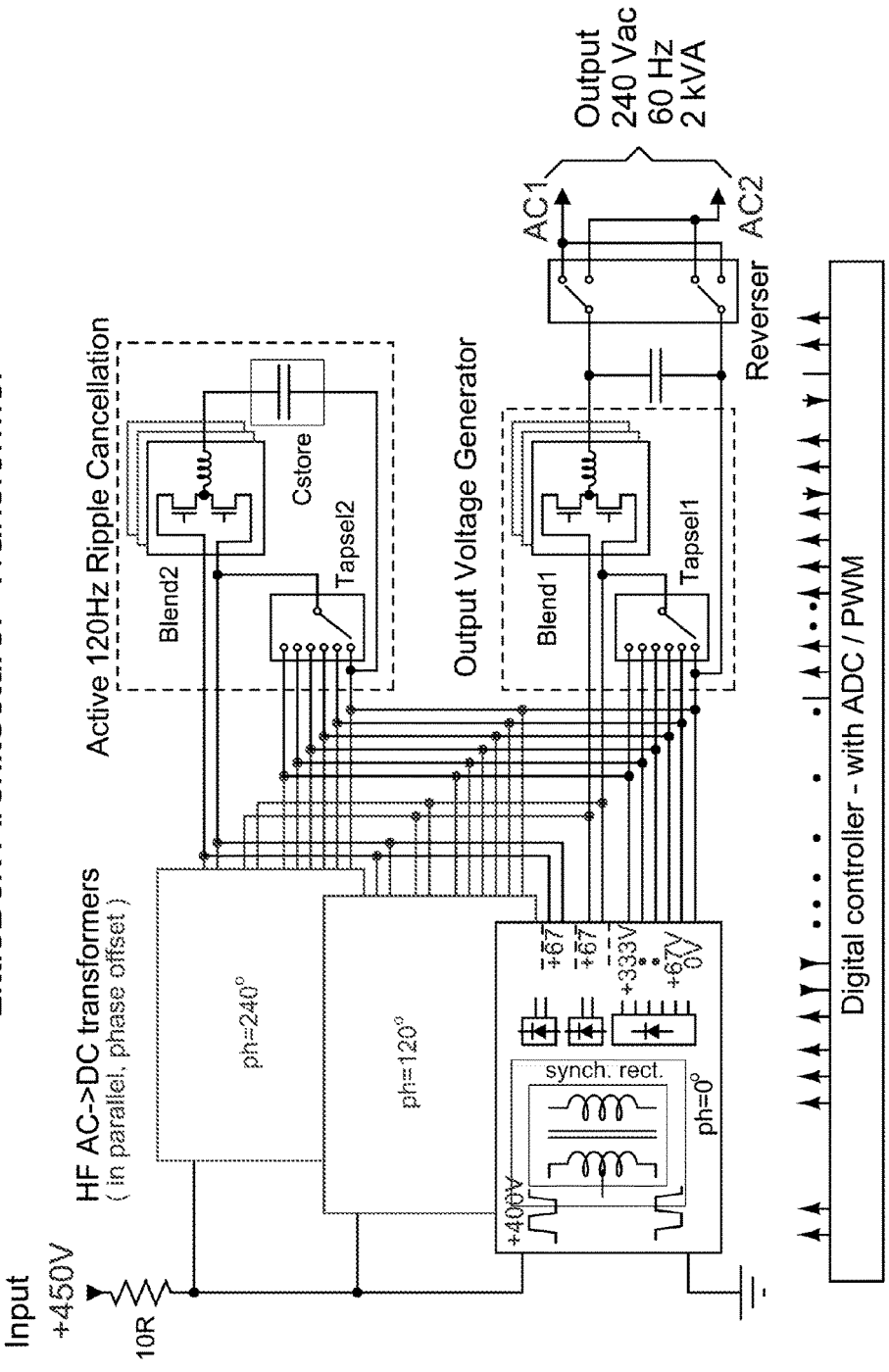
Figure 46:
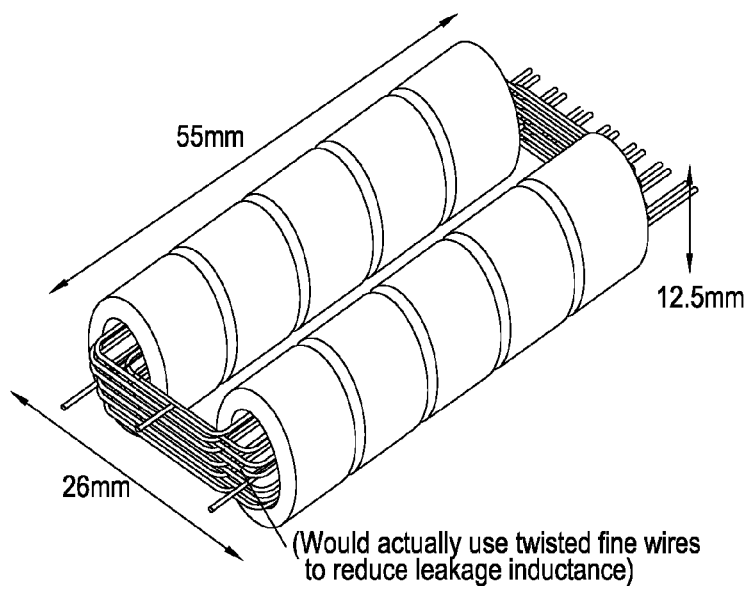
Figure 49:
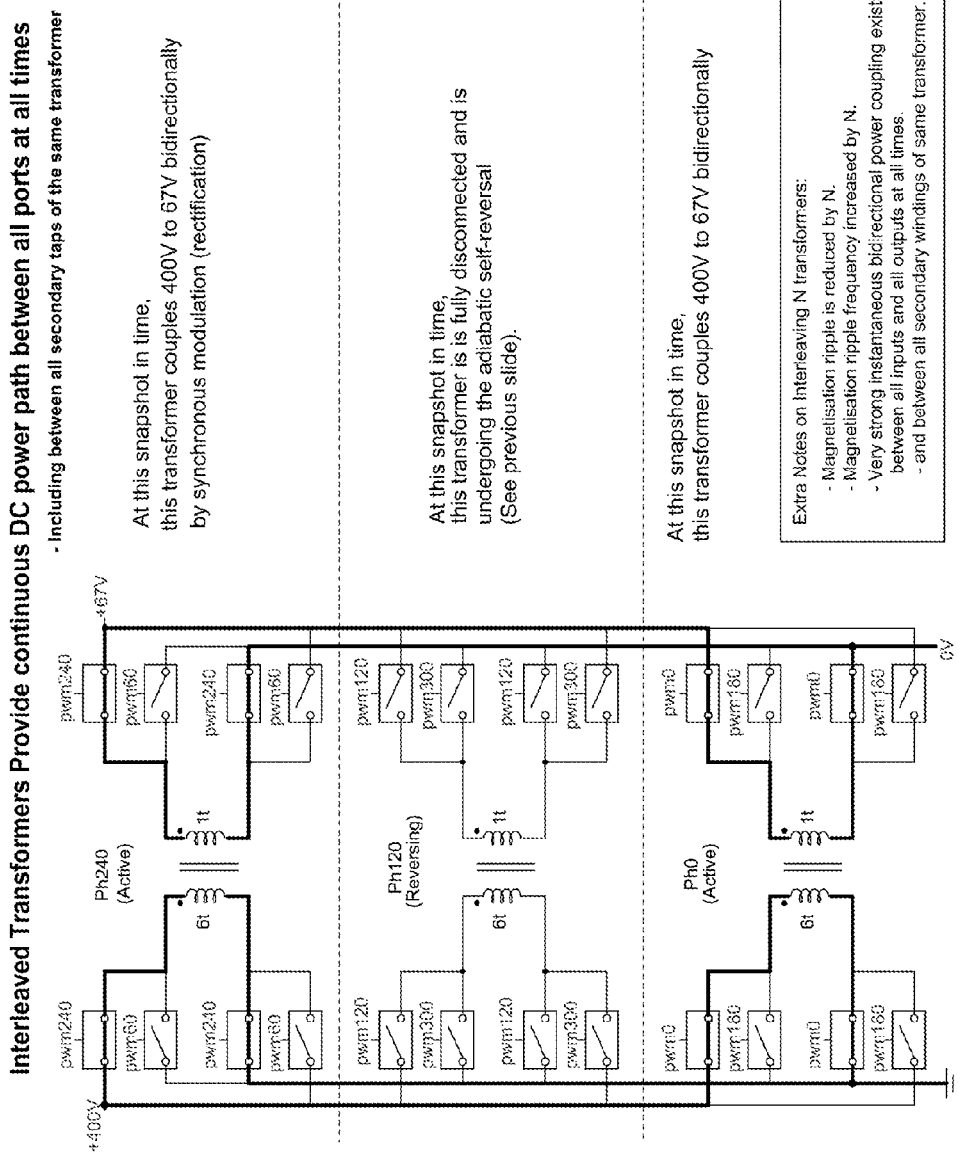
Figure 50:
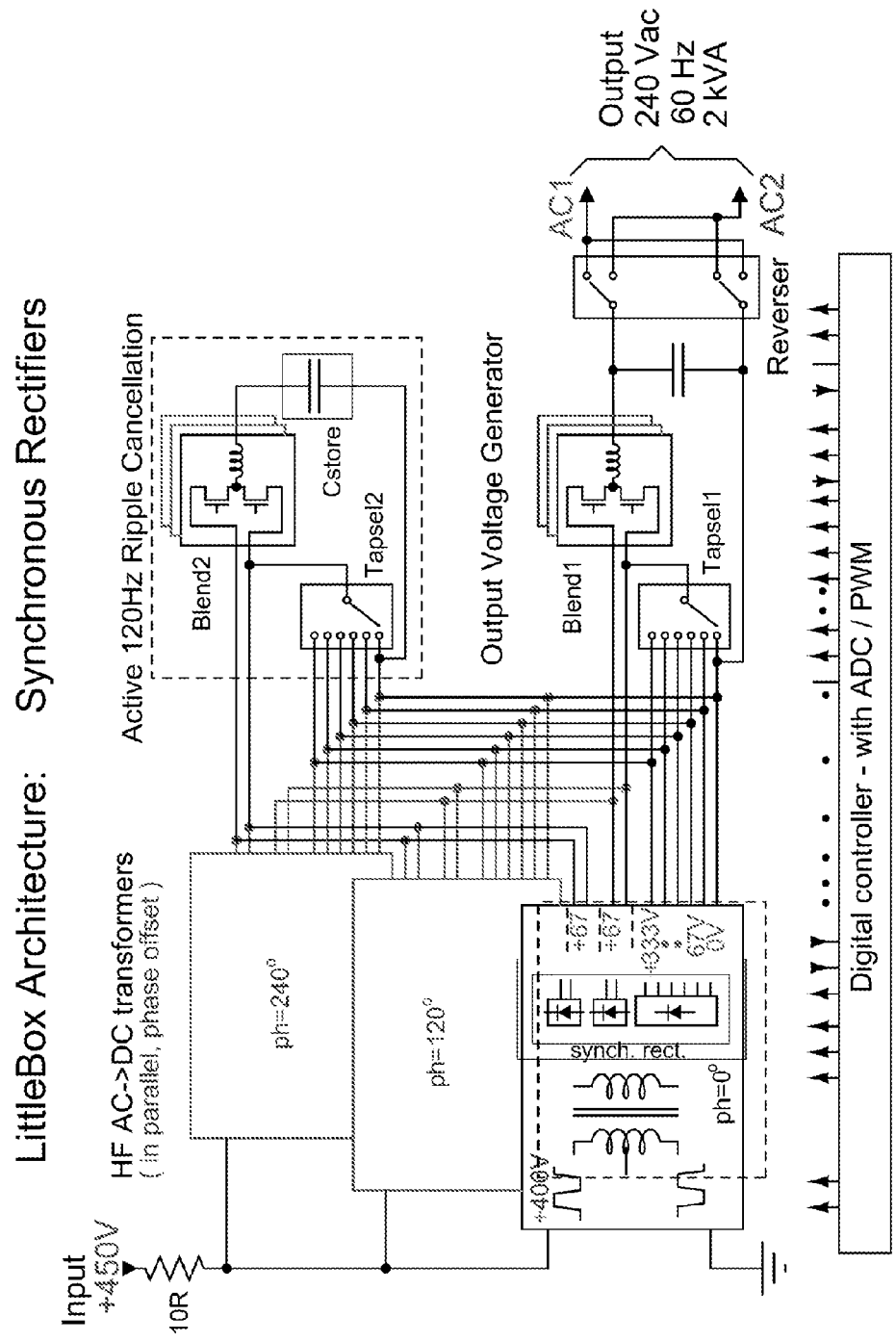
Figure 52:
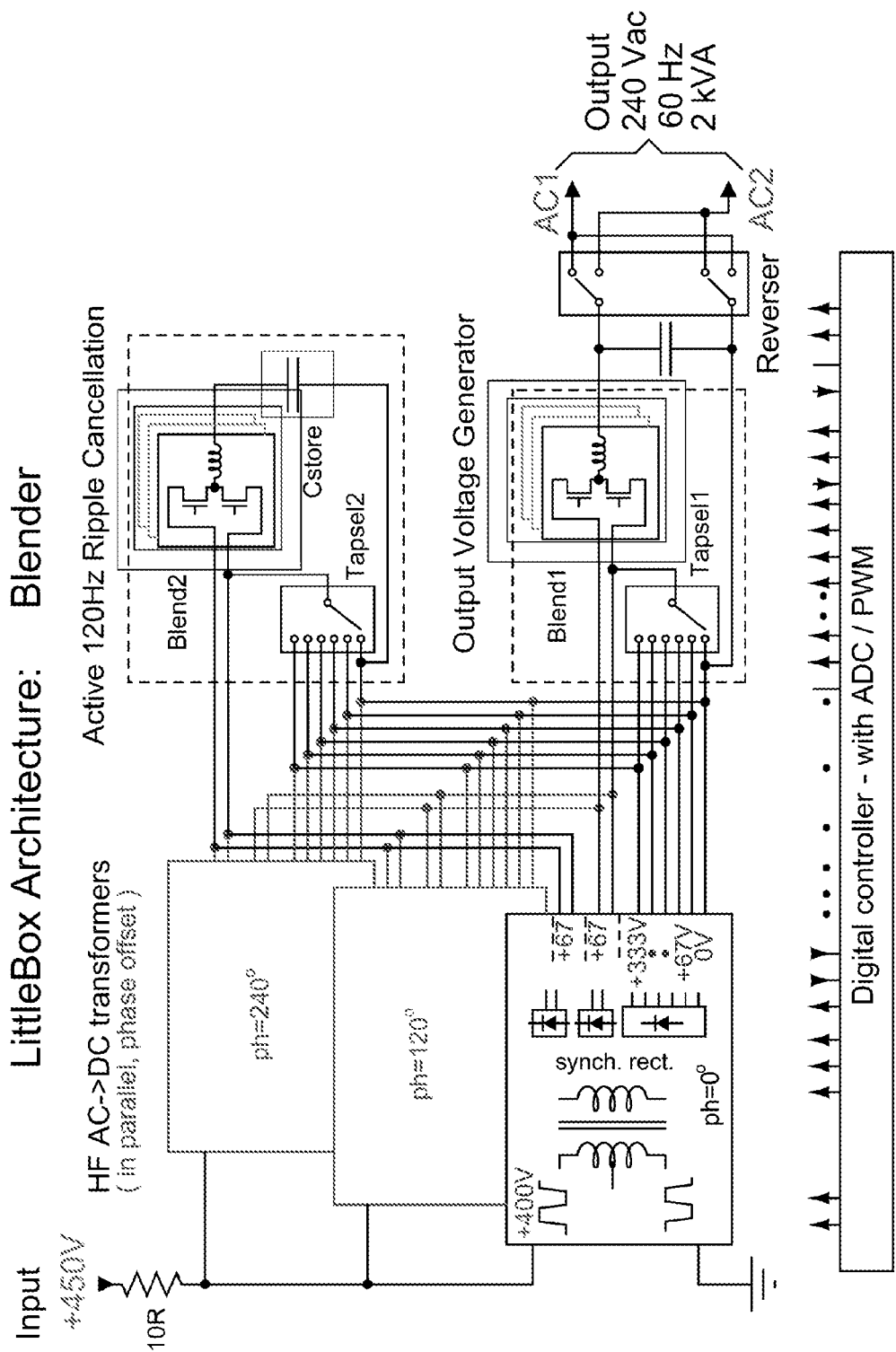
Figure 53:
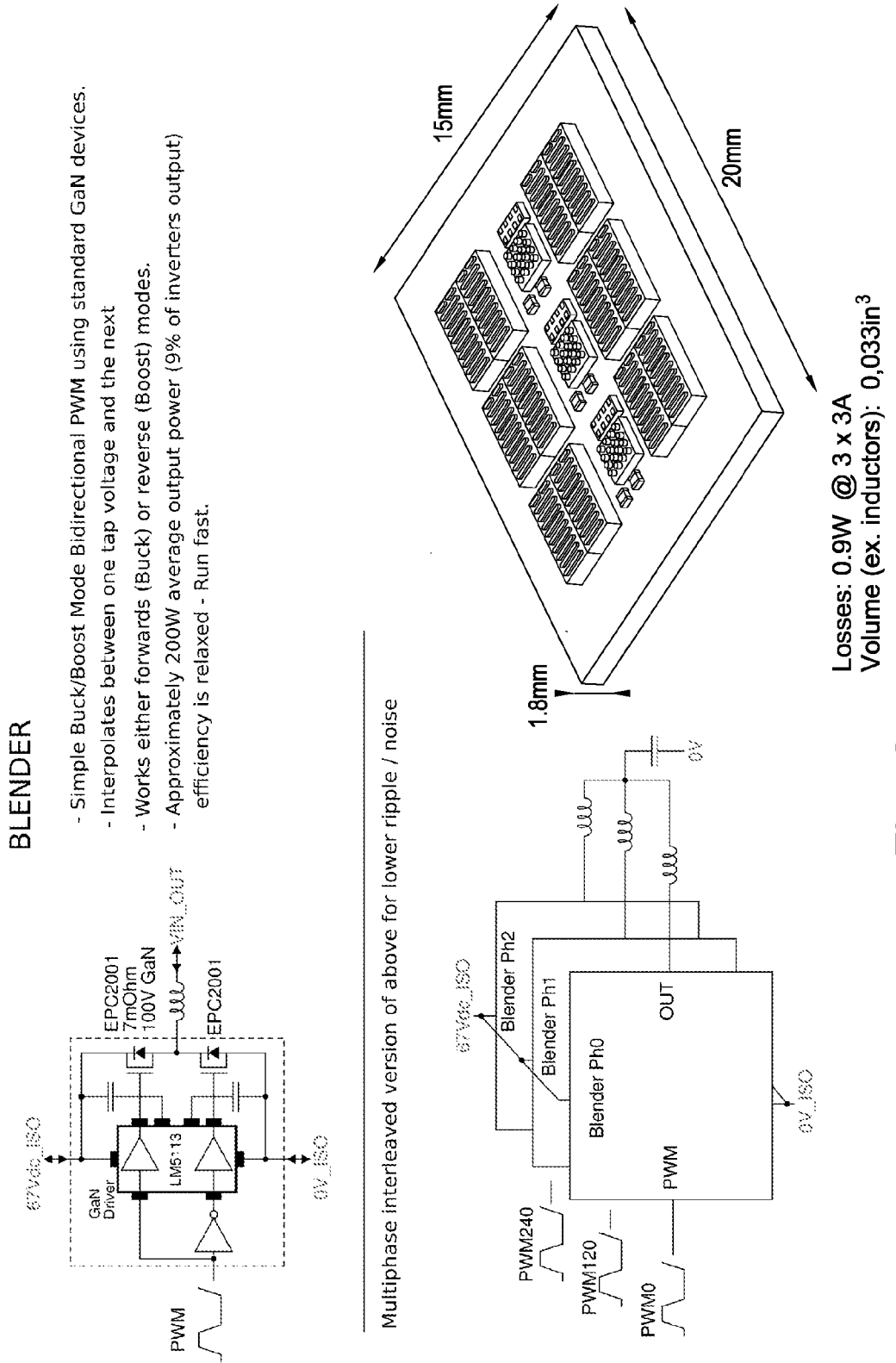
Figure 54:
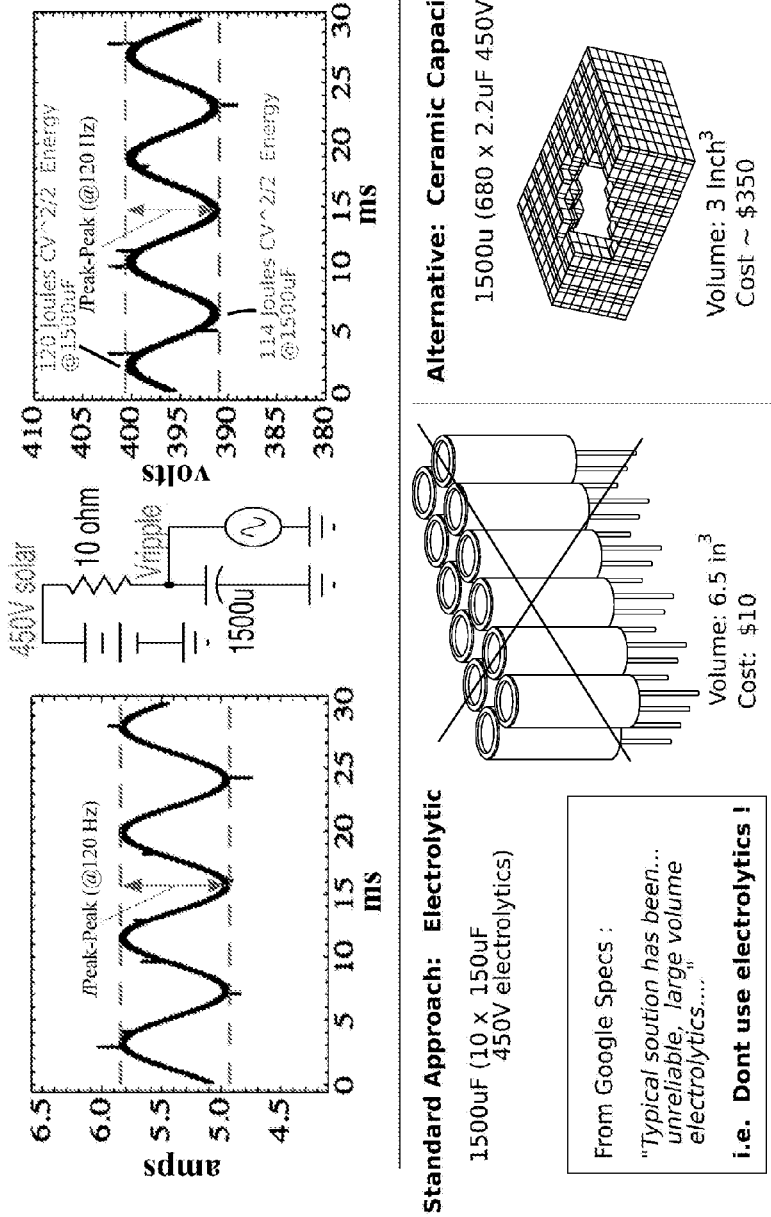
Figure 55:
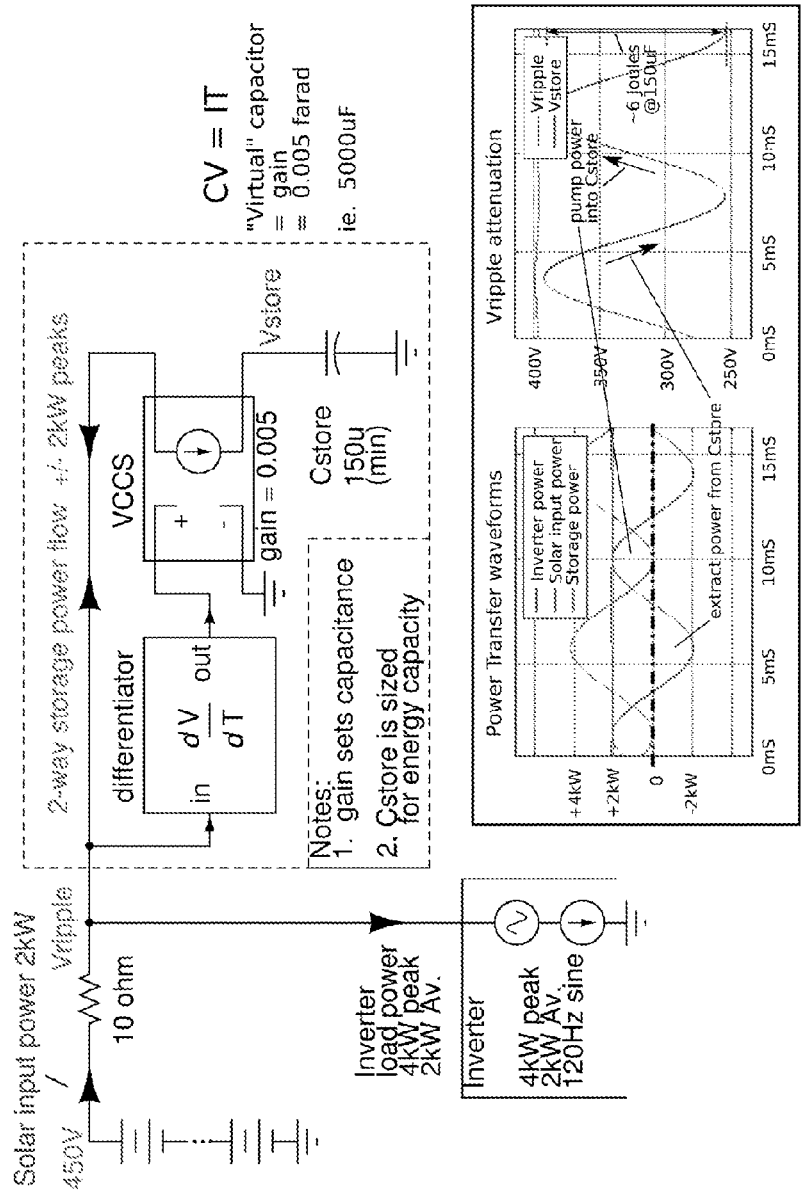
Figure 56:
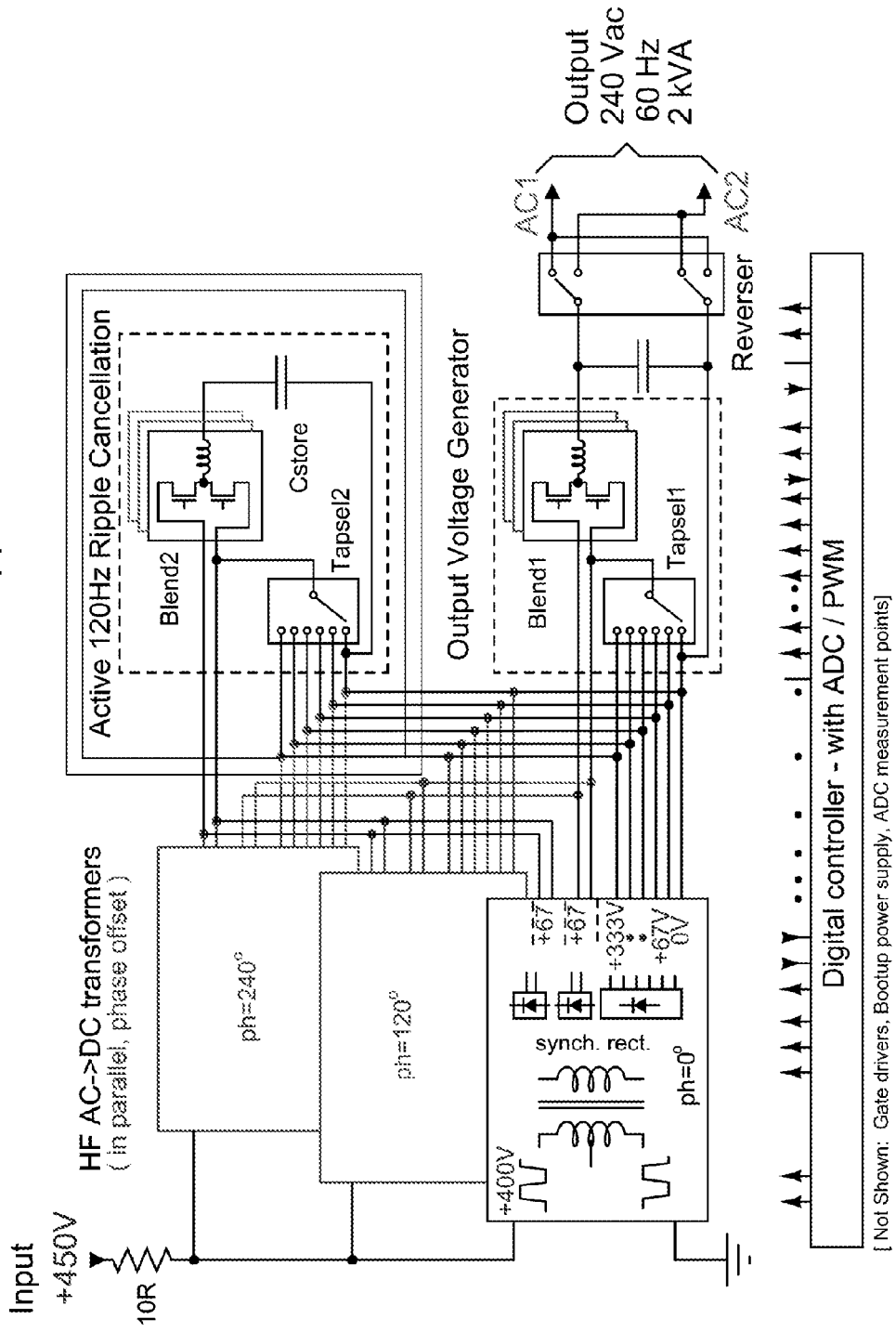
Figure 57:
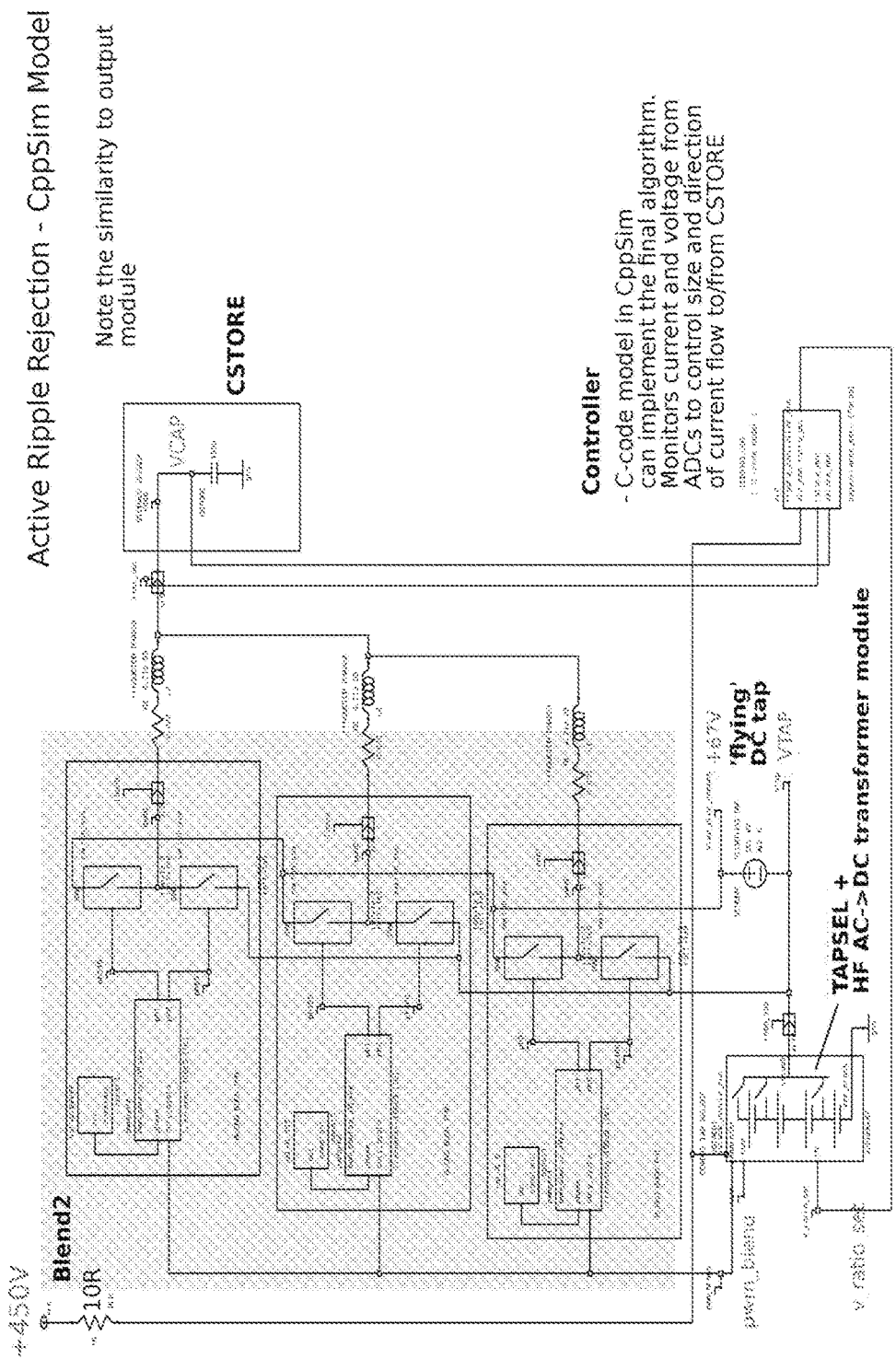
Figure 60:
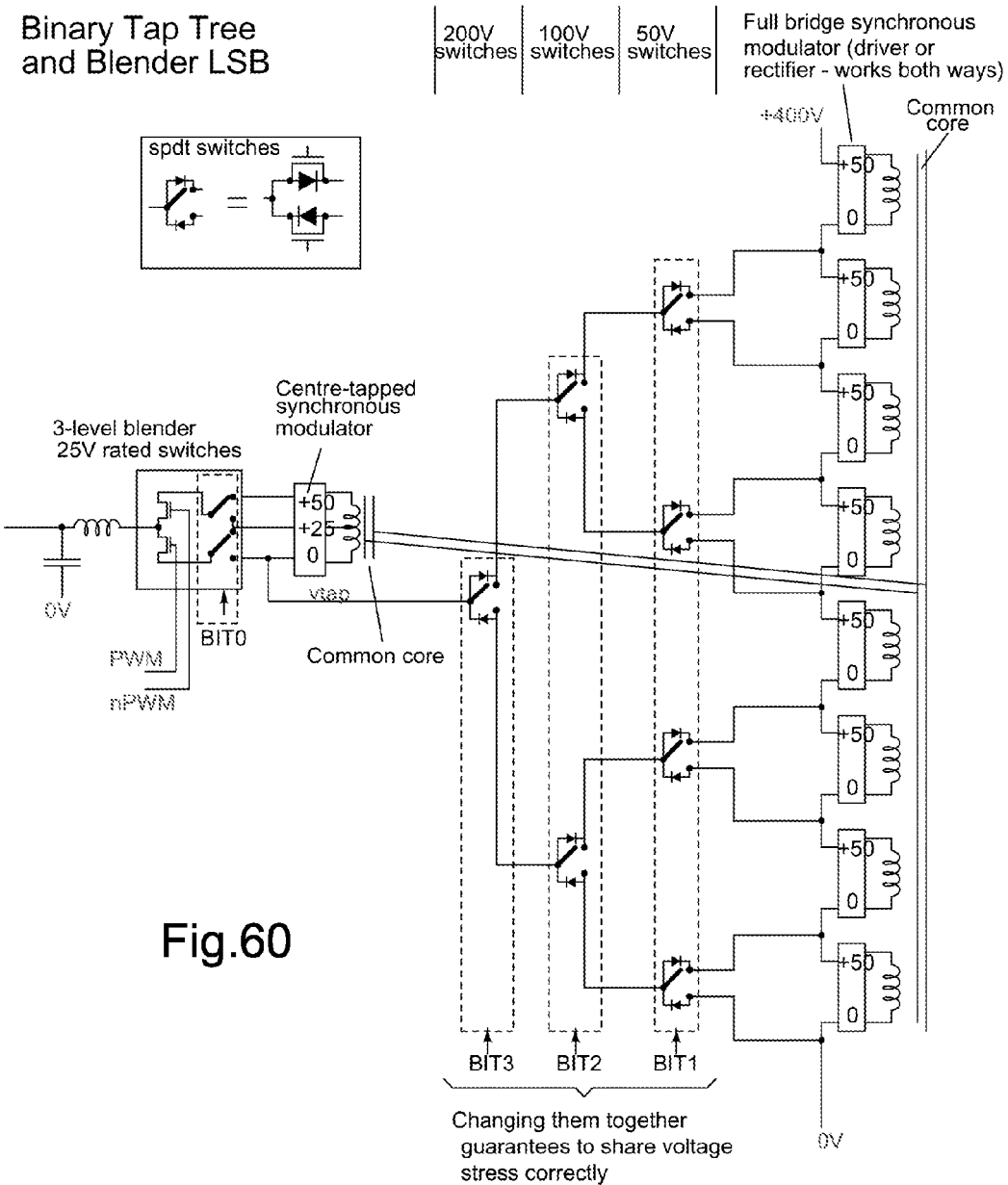
Figure 61:
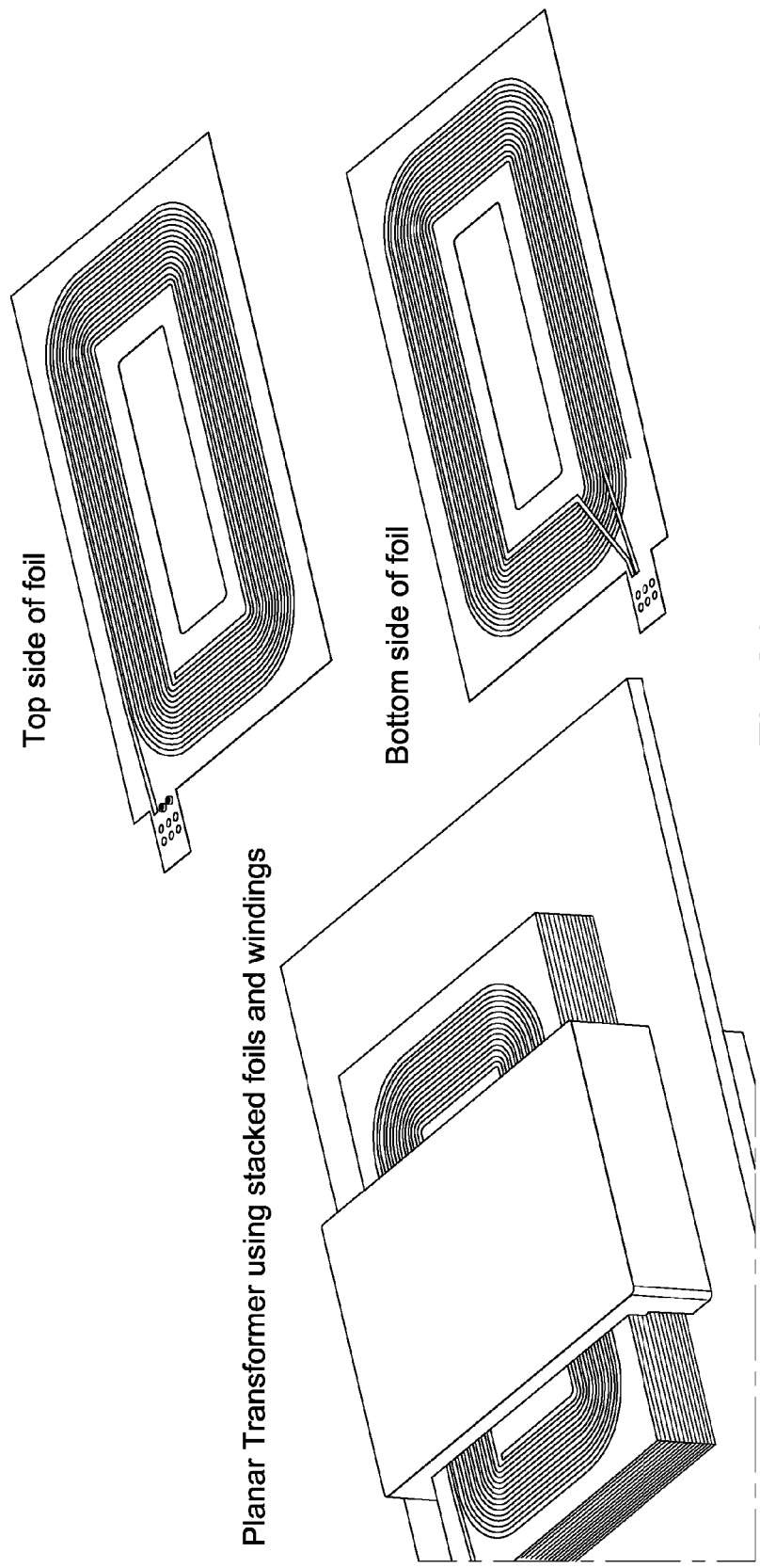
Figure 64:
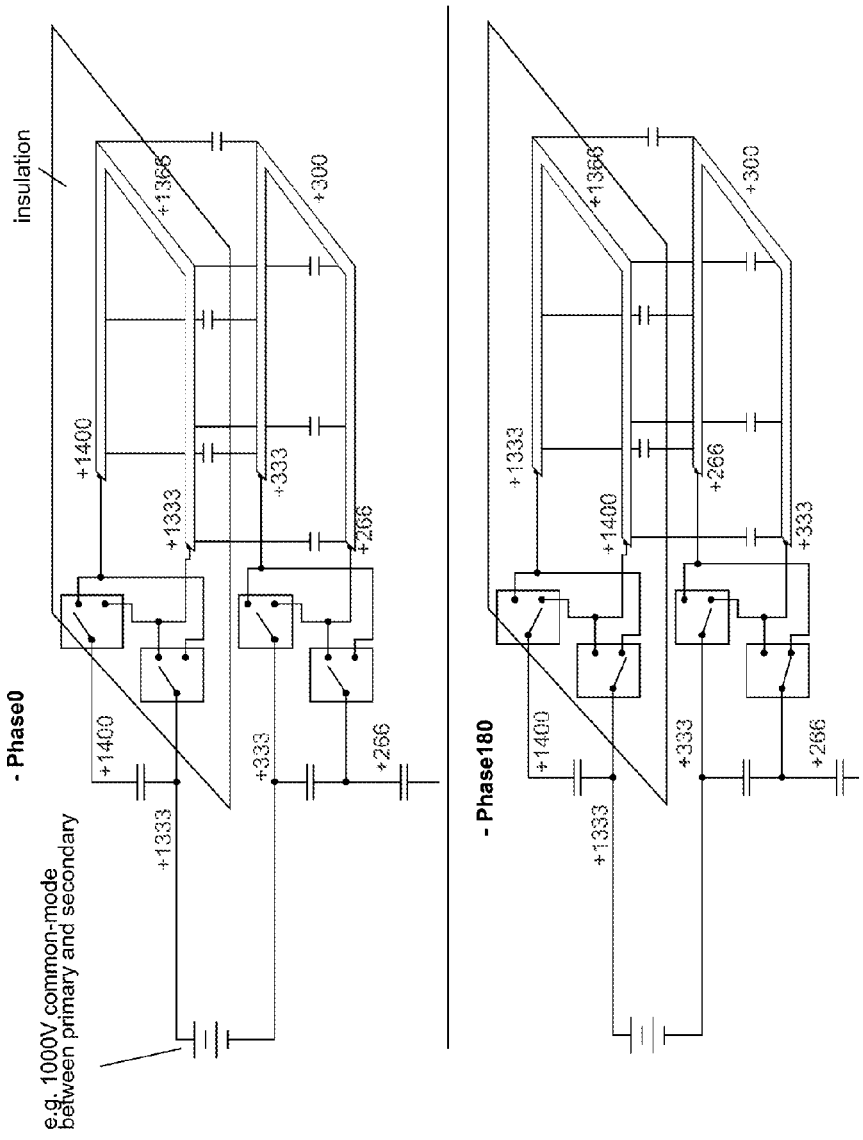

FIG. 30 illustrates a power circuit;

FIG. 31 illustrates alternative power switches and battery back for the modules;

FIG. 32 illustrates a 3D model of the main features of a hot-swappable module;

FIG. 33 are drawings of some optimised transistor physical constructions for this application;

FIG. 34 A illustrates the main parts of the universal converter;

FIG. 34 B illustrates a pair PST (Programmable Switching Transformers);

FIG. 35 illustrates an input ripple reduction method;

FIG. 36 illustrates a solar inverter application circuit with 99% efficiency in silicon and working from FIG. 1 source;

FIG. 37 illustrates the specification of the power coupler;

FIG. 38 illustrates an overall architecture of a power coupler;

FIG. 39 illustrates an inverter which is a finished article;

FIGS. 40 and 41 illustrate transformer and tap circuitry for one phase bank in isolated primary and secondary side;

FIGS. 42 and 43 illustrate the output voltage AC generation system at a high level simulation (CPPSIM);

FIG. 44 illustrates output waveforms from running the simulation which illustrates how the device works;

FIGS. 45, 46, 47, 48 illustrate how the transformer itself operates in a low-loss adiabatic mode;

FIG. 49 illustrates how there is always a low impedance, low loss, high bandwidth connection between input and output by using interleaved transformers;

FIGS. 50 and 51 illustrate a synchronous rectification (or synchronous modulation in case of bidirectional flow in operation);

FIGS. 52 and 53 show example embodiments of a blender using standard components;

FIGS. 54 and 55 illustrate the problem of input ripple current present on DC->AC converters in general and a conceptual solution to this problem using 'capacitor multiplication';

FIGS. 56 and 57 illustrate the diagrams of a scheme to implement the ripple current reduction scheme using components already described but this time feeding a storage node Cstore rather than the AC output path;

FIGS. 58 and 59 are pictures of some of the other components which may be needed according to the approximate sizes;

FIG. 60 shows an efficient method of selecting from one amongst N taps;

FIG. 61 shows a planar transformer and winding structures;

Figure 62:
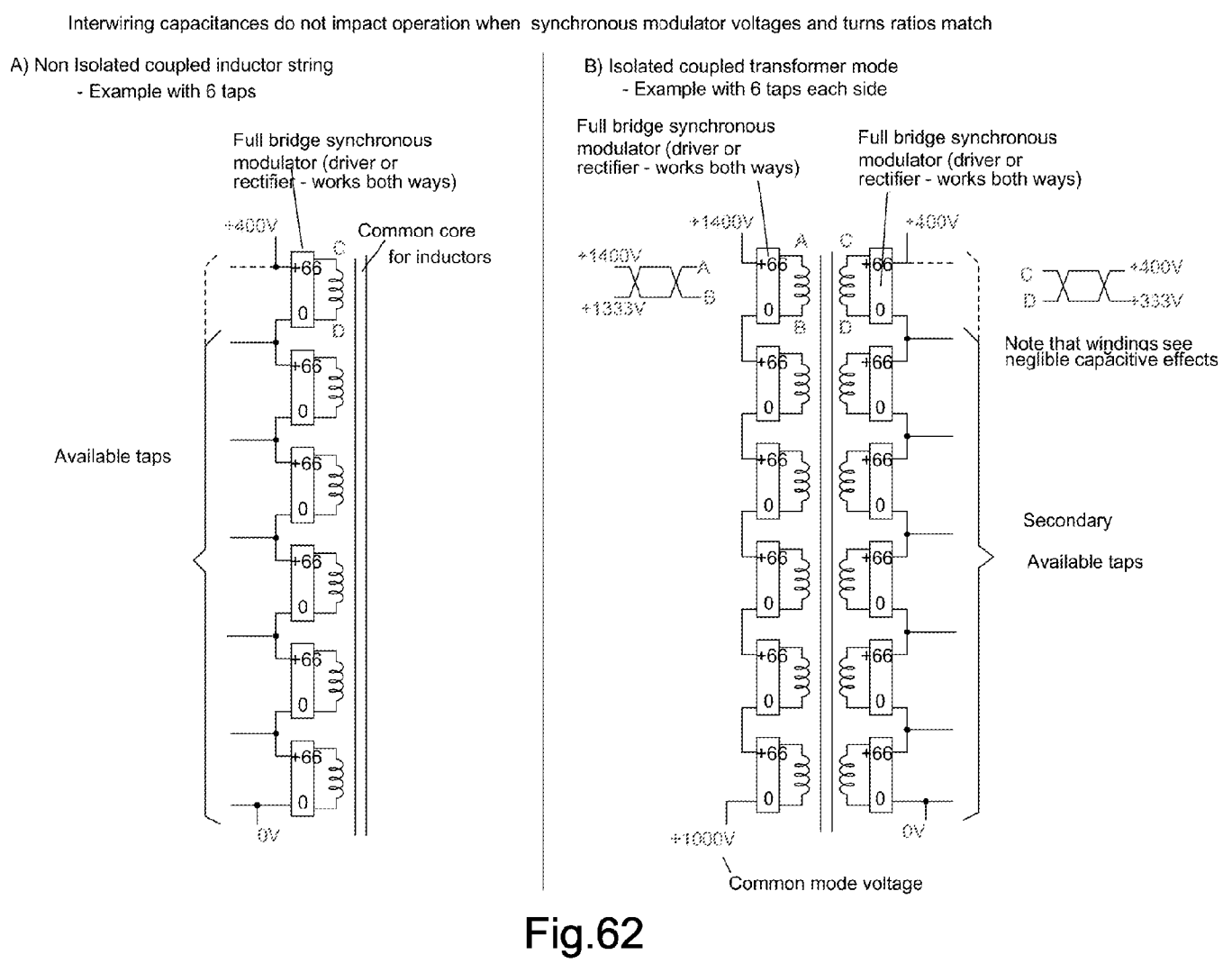

FIG. 62 shows inter-wiring capacitances which do not impact operation when synchronous modulator voltages and turns ratios match;

FIG. 63 illustrates that non-isolated version has very little voltage stress in the windings, so they can be packed close together; and FIG. 64 illustrates concept of FIG. 63 applied to isolated transformer where primary and secondary and identical structures.

Figure 65:
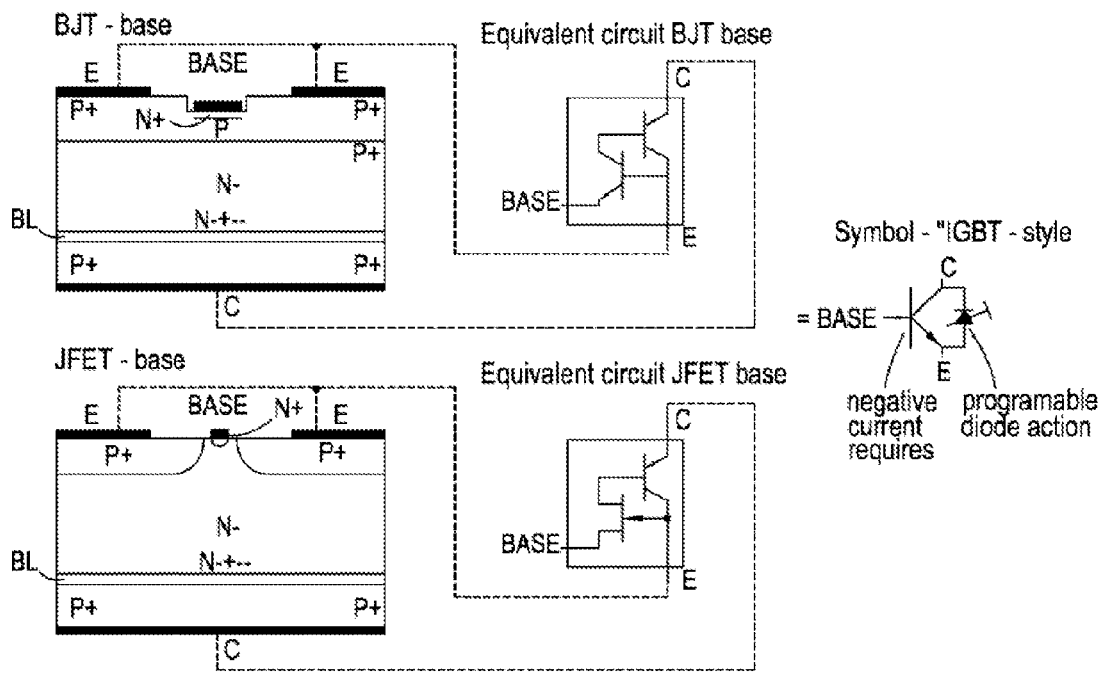

FIG. 65 illustrates cross-sections of an alternative BJT structure.

DETAILED DESCRIPTION OF THE PREFERRED EMBODIMENTS

New Design

What will be described is an invention which combines the best features of standard AC transformers with the miniaturisation and control found in switch-mode power supplies but without their attendant fragility.

High frequency digitally controlled switching circuits and HF transformers reduce the size, weight and cost of the finished article.

The new design is a bi-directional coupler of power and it is controlled using multiphase digital signals so it will be referred to as a 'digital power coupler' to distinguish it from both a standard switch-mode power supply and a standard AC transformer.

Like a standard AC transformer it offers Isolation and Voltage, Current, or Impedance conversion between its ports. They can be used in classic transformer circuits such as series or parallel for higher voltage or currents and Autotransformer configurations.

What follows are non-limiting examples of embodiments which implement the invention.

The basic system is then expanded for DC->AC conversion mode such as that needed for the LittleBox Challenge https:/www.littleboxchallenge.com/

Circuits:

Block Diagram.

FIG. 1 shows the block diagram of the device. It has two power ports X and Y either of which could be connected to an AC power line (e.g. 380 Vac 230 Vac or 110 Vac) while the other port is connected to a load. (When inserted into a power network the sense of source and load can change during operation depending on power flow direction).

The individual components are described briefly below:
A Power-coupler converter referred to as Sub-Module, 1.
  This is the building block of the design.
A high-frequency transformer TR1 is connected by switching devices in a full-bridge arrangement [half bridge is also possible described later]. The switches, 12, are sequenced at high frequency in the order shown on the timing diagram, 2., which conveys the line frequency power from port X to port Y and/or from port Y to port X carried on high frequency carrier set by the switches.

TR1 is designed as a high frequency transformer (KHz or MHz) and just like a conventional transformer, its turns ratio directly sets the ratio of port X to port Y voltage ratio.

Multiple units are interleaved—operated in phase-offset parallel mode [3 are shown] to increase power output and eliminate dead-spots in the conversion cycle thereby ensuring that the line voltage waveforms are conveyed continuously at low impedance between the port with a through-bandwidth from DC to many MHz.

Control board, 3.
  Is required to generate the multi-phase signals to control the switches described above.
  Has an on-board oscillator and a in this example a CPLD digital state machine to allow programmable phasing and non-overlap safegaurds. Microcontroller or discrete logic is another option for providing this function.
  Numerous inputs and outputs which are described in the later sections and state machines to operate on the I/O. A verilog listing appears in Appendix A.

Aux Power Supply, 4.,
  This is a small power supply running from power taken from either port X or Y and could be switchmode or conventional. At 3 W it is less than 1% of the typical total converter throughput power capacity.
  It provides power to the control board sufficient for the transistor-drive power requirements.
  The power coupler will power up as soon as power is presented to either Port X or Port Y.
  ** if it known that power always comes from just one port, one of the Aux power supplies can be dropped.

Basic Protection circuits
  Overcurrent detector, 5.,
    A simplified circuit is shown. The circuit can detect an overcurrent fault
      (overload or short circuit) in the PortX<->PortY path. Since it is AC sensitive the detector it will work whichever direction power is being transferred.
    Upon overcurrent detected, it signals to the control board to shut-down the conversion function.
  Thermistor, Over-temperature detector, 6.,
    Using a thermistor or similar to detect whether the housing incorporating the semiconductors are over a pre-set temperature. Shuts down the converter if true.
  RCCD detector, 8.,
    Residual Current Circuit Device. a.k.a. Earth leakage circuit breaker.
    Detects when there is a mismatch in currents from Line 1 and Line 2 and signals to the control board to shutdown (until a reset) in such event.
  In this example only one RCCD detector is shown on Port Y although one could also be added to port X to keep the unit symmetrical,
  Mains voltage monitor/Zero Crossing Detector, 9.,
    The mains voltage can be monitored isolated analog circuit making a signal proportional to voltage.
    Detecting a Zero crossing of this signal used to time the startup of the switching system.

Status LEDs, 10.,

A visual indication of fault conditions is presented to the user of the power-coupler through LEDs controlled by the logic device.

Reset button, 11.,

Used to reset the logic after a latching fault condition (e.g. RCCD) had been detected.

Circuit Features and Detail for Basic Embodiments

AC switch, 12,

A true AC switch shown in FIG. 2. is desired and this can be accomplished using series connected inverse power transistors. Although Triacs and Thyristors are possibilities these devices are largely superseded by IGBT and MOSFET transistors. Another common AC switch known in the art is formed by combining a bridge rectifier with any unipolar switching device.

Figure 4:
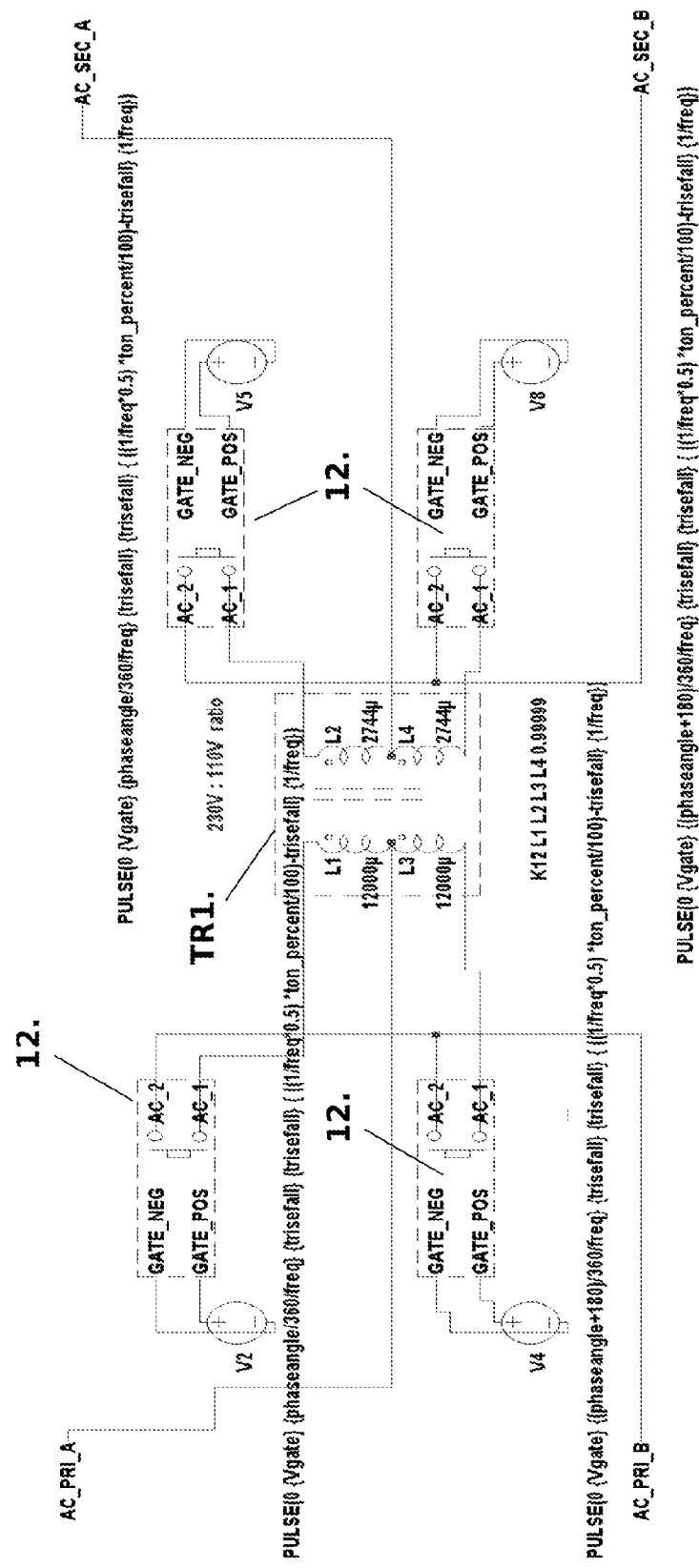
FIG. 4 shows a power coupler sub-module.

Power Coupler Sub-Module. FIG. 4.

AC switches, 12, are combined with a high frequency transformer.

Options are Half bridge or full bridge design. A full bridge design was shown in FIG. 1 block diagram but now a half bridge centre-tapped transformer design is shown here.

Note: In the schematic shown the transistors are given their own gate stimulus which would normally appear in the top level circuit from the CPLD device. One way to describe the circuit is a "duplex, transformer coupled digital synchronous modulator/demodulator."

Figure 5:
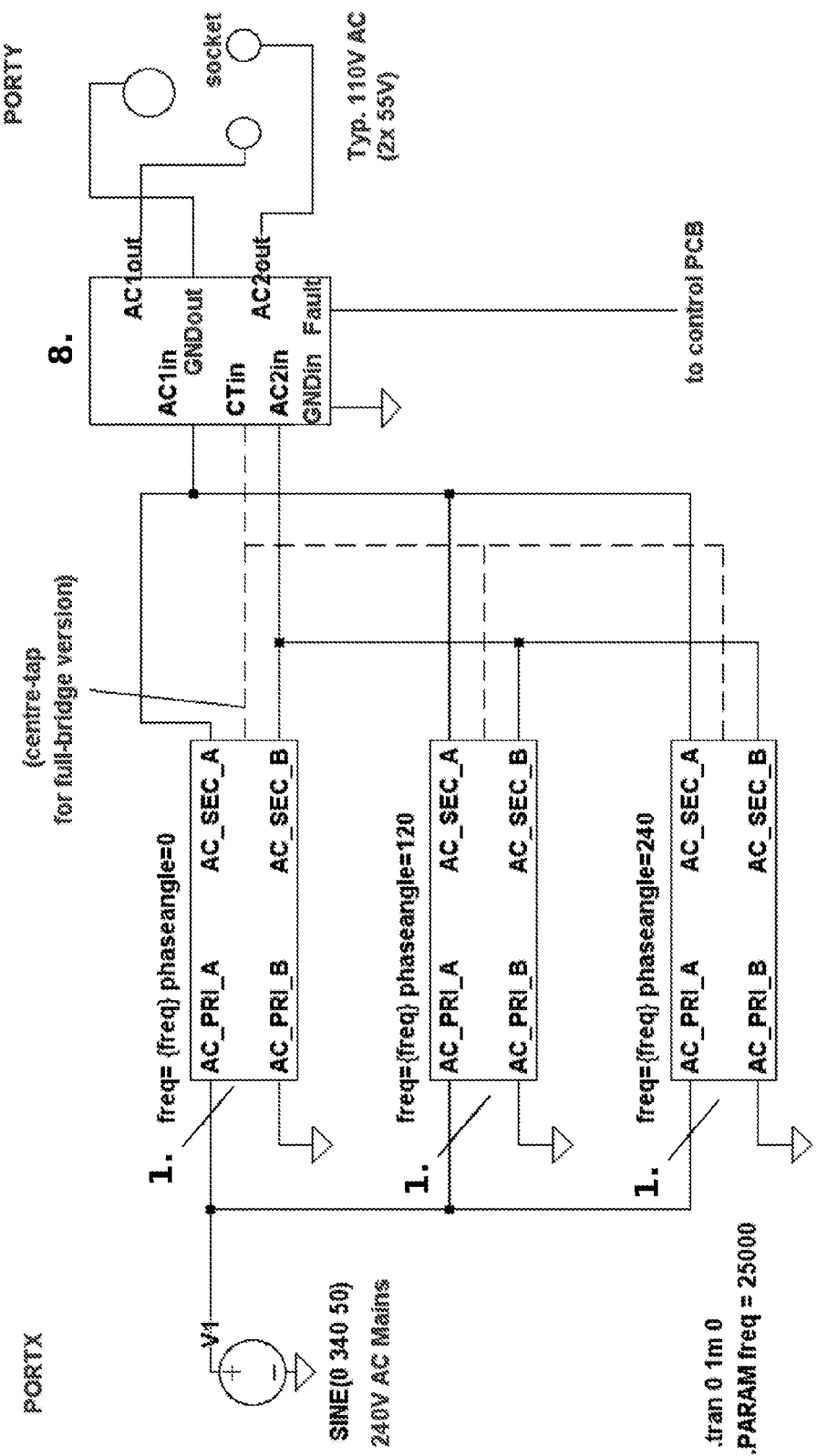
FIG. 5 illustrates the full schematic for a compete Module comprising 3-sub-module (3×1.), 6-phase interleaved implementation. This figure shows a centre tap for full-bridge version of the configuration.

Interleaving:

The control logic generates multi-phase outputs to drive multiple power stages as described, with each out of phase with the same sequence point of the other. Effectively this hides the 'off' period of one stage among all the other stages which are active. Therefore the input and output impedances of the unit will not have discontinuities which can cause EMI interference. Any number of phases are possible. More units working together increases the throughput power capability proportionally. FIG. 5 has the full schematic for a compete Module comprising 3-sub-module (3×1.), 6-phase interleaved implementation.

Soft-Switching:

By arrangement of multiple interleaved phase-offset sub-modules there is the benefit that turn-on and turn off processes are Zero-Voltage and Zero-Current.

On turn-on, all the transistors are turning on into a load voltage which is very close to the source voltage [since for any one converter turning on, the other 2 converters are actively holding the output]. This reduces especially IGBT turn-on losses since the current ramps with just a small typically 1.5-3 volt across the switch, On turn-off in this circuit, unlike the turn off into a normal resistive-load which will conduct and cause power loss for the entire switch turn-off time, is a low loss event with low voltage/low current progression.

Mains voltage monitor, 9

A signal proportional to the mains voltage is available at the control board. Setting a high threshold Vmx can create a signal which puts the converter into shutdown. This protection is useful in the case of half-bridge switching circuits which inherently must have a voltage rating of 2× the peak incoming voltage to cope with the 2× voltage transformer winding peaks while operating. This margin can be exploited when switching is inhibited where the 2× safety margin would allow for example accidental connection of a 120 Vac port to 230V ac, or a 230V primary to 380 Vac without catastrophic consequences.

Zero Crossing Detector, using 9,

Using the above signal with a ~0v threshold, the logic device can ensure that power switching startup happens synchronously around the next zero-crossing of the mains voltage waveform.

This avoids staring up at high instantaneous voltages which can lead to current surges.

Restarts from faults are also timed to happen at zero crossings.

RCCD detailed circuit, 8,

In FIG. 3 there are two options shown to easily add support for the Earth leakage detection function on the output. This affords a reduction in electrocution hazard beyond what could is already achieved with voltage reduction alone.

Option1 works when the power-coupler modules are full-bridge and where the centre-tap of the HF transformer is connected via RLeakTrip to GND. Because all 3 wires from the transformer are fully isolated, this connection of the centre-tap moves AC_SEC_A and AC_SEC_B to each become ½ of the AC amplitude relative to earth with 180 degrees out of phase. This is ideal for the UK site transformer application of 55V-0V-55V. While ever there is no earth leakage current and all AC1 current is returning through AC2 (or vica versa) then there is no current flowing through the GND (leakage path) and no voltage develops over RLeakTrip.

However, if there forms a leakage current path from either AC1 or AC2 to GND anywhere downstream of the converter (E.g. a person with wet hands touching either of AC1 or AC2) then this current has to be returning to the transformer via RLeakTrip since this is the only other current path back to the transformer.

If the current is sufficient there will be enough voltage to trigger the opto-coupler resulting in an RCCD trip event at the Control board. ZNA,B are set for perhaps 5 volts to give a solid connection between the centre-tap and true GND in case of higher fault currents.

Option2 is similar but is used when the power coupler using a half-bridge configuration and the centre-tap point on the HF transformer is already used.

Instead a low (line) frequency inductor is used to get a low-resistance centre-voltage mid-way between AC_SEC_A and AC_SEC_B. Again, while ever identical currents are flowing in a loop between AC1_out and AC2_out then the current at RLeakTrip will be zero. A mismatched current must be an earth leakage current and is detected as described about for Option1.

Distinguishing Characteristics—

An interesting characteristic is that the power coupler as described can transit DC as well as AC while converting voltages bidirectionally. It can also convert power waveforms above the switching frequency of its high frequency transformers since at all times the two power ports are connected electromagnetically with no 'dead-spots'. The upper line frequency transmission limit is set by the bandwidth of the ferrite material chosen for the transformers, not the chosen modulation/switching frequency.

Reliability features:

For reliability sake, no significant power storage by way of highly unreliable electrolytic capacitors is needed in the design. The circuit is solid state and can be implemented purely with ceramic capacitors. There is very little energy storage in any of the circuits which again distinguishes the design as a power-coupler not a switch-mode power supply.

Surge rating of the power devices are >10× the average current rating of the AC-AC power coupler.

Voltage rating of the power devices are ~2× the expected peak voltages expected in normal operation and beyond this have avalanche capability sufficient to absorb transients of such short duration which are not able to be absorbed by the feeding mains AC supply. This capability can be augmented with MOV (Metal Oxide Transistor) devices.

The true bi-directional power transfer mechanism gives the inherent reliability feature of a conventional AC line-frequency transformer.

Series/Parallel Combinations of Power-Couplers.

Figure 12:
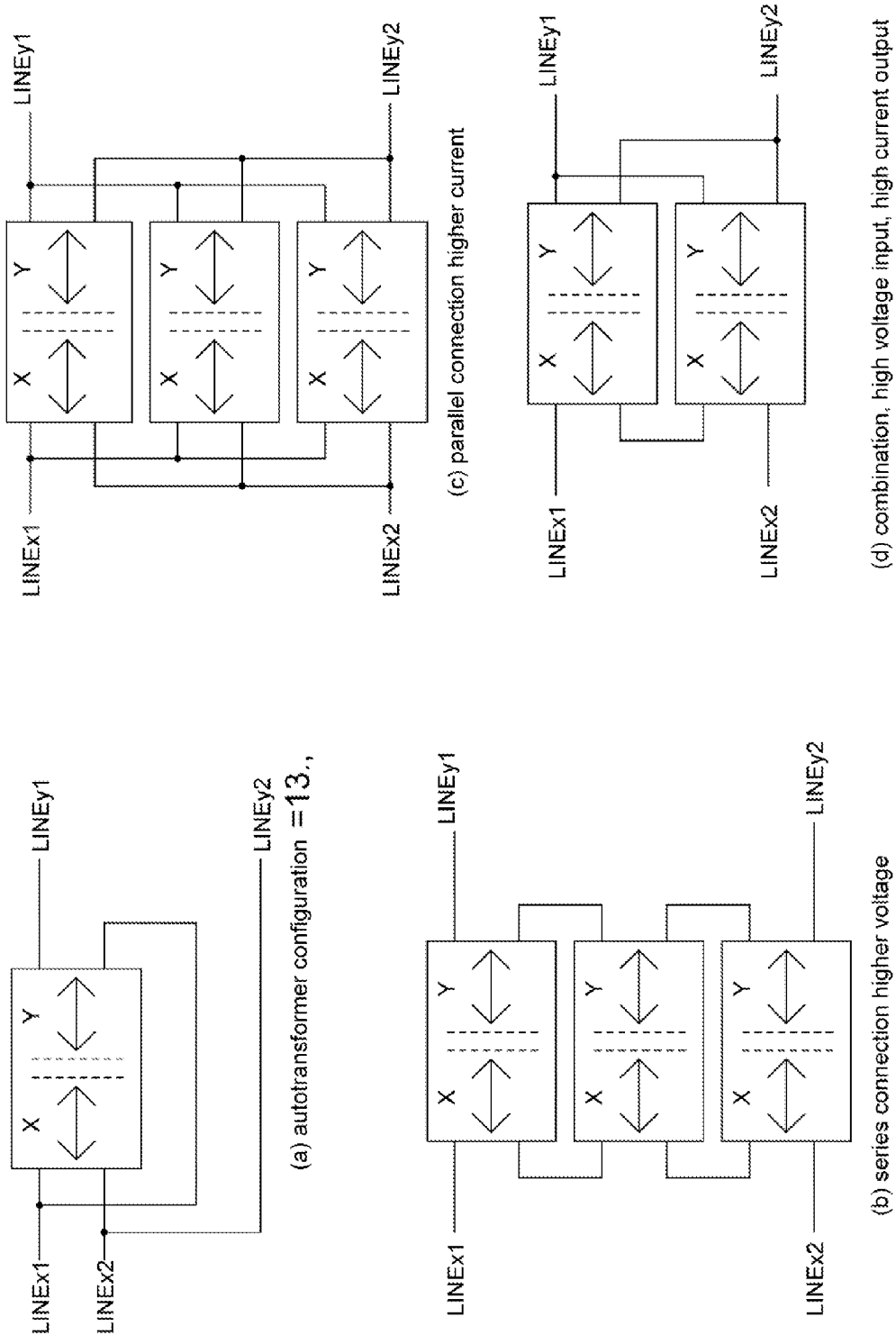
FIG. 12 shows how standard transformers can be replaced directly with the new power-couplers in several different examples.

FIG. 12 shows how standard transformers can be replaced directly with the new power-couplers in several different examples. Series connections where each power-coupler module is fully floating with respect to earth potential allows very high voltage (100 kV) mains distribution transformers to be replaced. Autotransformer circuit, 13., including multi-tap voltage stabiliser can be effected in the usual manner.

Mechanical/Thermal Design for 230V: 110V Converter Example Embodiment

Preferred mechanical housings will described in general principles as non-limiting examples.

Heatsinking:

All semiconductors generate heat while conducting and switching current. In the circuits described previously this heat is low and distributed amongst many semiconductor devices each taking its share of the power dissipation.

By exploiting the distributed nature of this heat source (the multiple semiconductors) it is possible to come to the mechanical which reduces the amount of metal considerably over a conventional heatsink which is usually designed to conduct a lot of heat from a centralised source to its fins using thick metal cross section.

Two example embodiments are shown.

The first (FIG. 6) s a stacked aluminium fin heatsink arrangement which accommodates 16 transistors, 14., (TO220 package shown). Between the fin plates, 15, there are aluminium thermal conductor blocks, 16, to spread the heat to adjacent fin plates e.g. those surrounding the transformer which itself doesn't dissipate so much heat. The sub-module with the transistors is labeled as 17.

FIG. 7 has a ferrite transformer TR1., located inside a similar heatsink fin stack to become sub-module 18.

Figure 9:
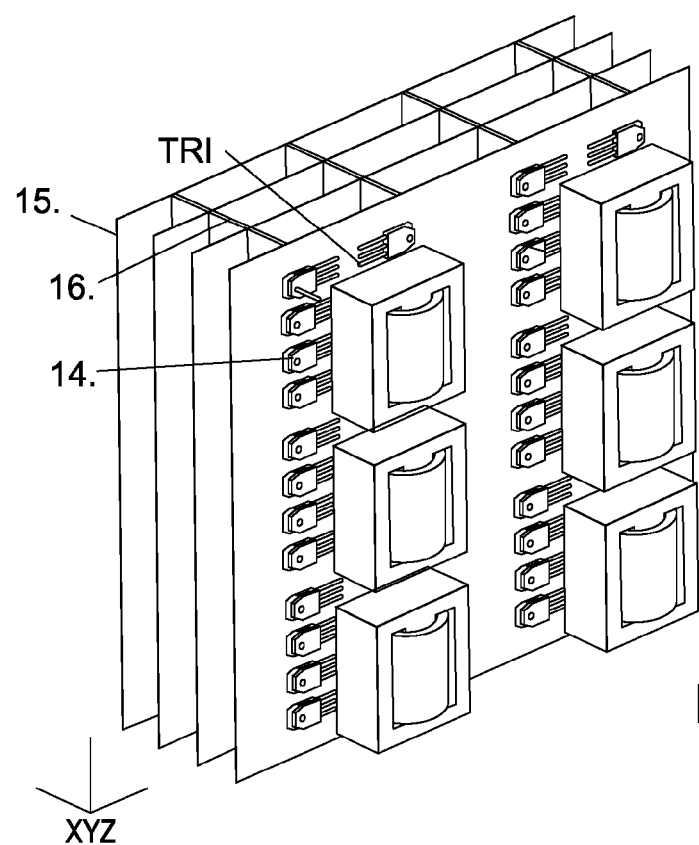
FIG. 9 and FIG. 10 show distributed heatsinking for a higher power unit.
Figure 10:
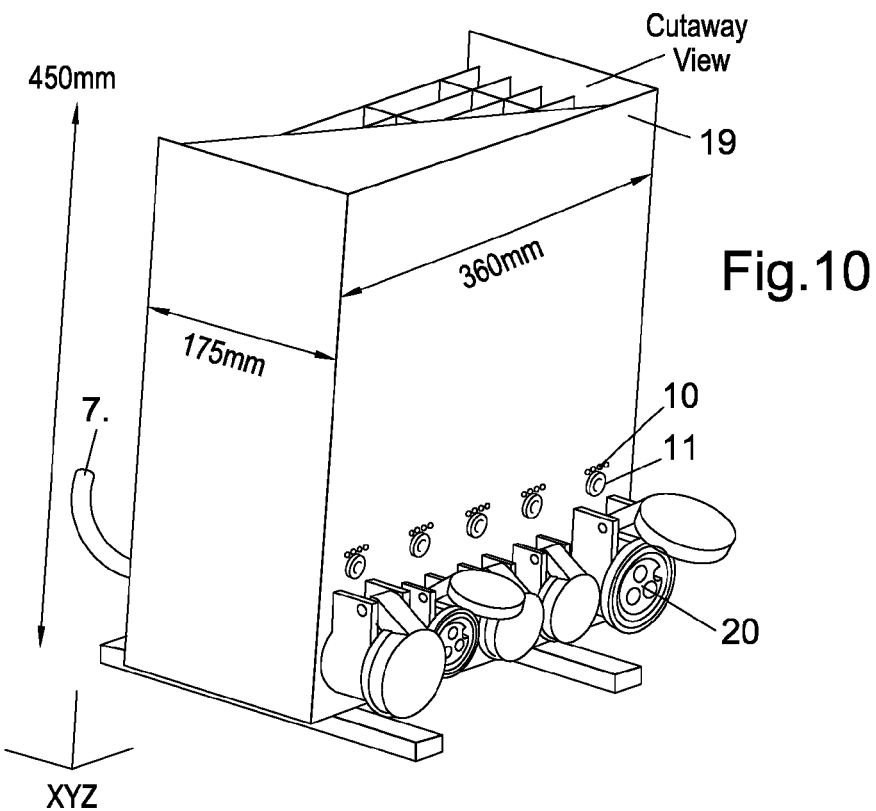

The second example of distributed heatsinking for a higher power (10 kW 6-module unit) is FIG. 9 FIG. 10 represents a finished article in its case, 19., IEC connectors with sprung loaded dust cover 20., feed the loads. Input power comes from flying lead, 7.

Design choices are done based on economics. A trade off is possible between the cost of thicker metal to conduct heat vs. more distributed structure with greater number of transistors. The economics favour quite distributed designs using multiple modules since the cost of many lower power devices can be cheaper than high power devices since the former are produced in very large volumes. Fan cooling is not essential but can reduce the size of heatsink further.

Incorporation within a connector.

Another aspect to the invention is the miniaturisation and configuration of components for incorporation into a connector assembly.

In the UK one very common AC transformer is known as 110V safety "site" transformer. These units convert 240 Vac to 110V ac, centre-tapped for use with power tools on construction sites.

Today's transformers for doing this conversion can be very heavy (15 kg for a 1.8 kVA unit) and these units are a nuisance when working with portable power tools since they must be frequently moved, upstairs and up and down scaffolding.

Using the circuit and mechanical techniques described previously, a new design compact enough incorporate the power-coupler system inside an extended length IEC 110V connector would give a lightweight flying-lead with attached connectors and dispense with the bulky yellow AC transformer entirely.

By incorporation of the power coupler electronics with an IEC 60309 standard connector a 1.8 kW continuously rated unit in a dimension of 75 mm×75 mm×275 mm weighing 1.5 kg.

FIG. 8 shows the control board which can be stacked with the multiple copies of items in FIG. 6 and FIG. 7 to form the body of the connector-converter.

Figure 11:
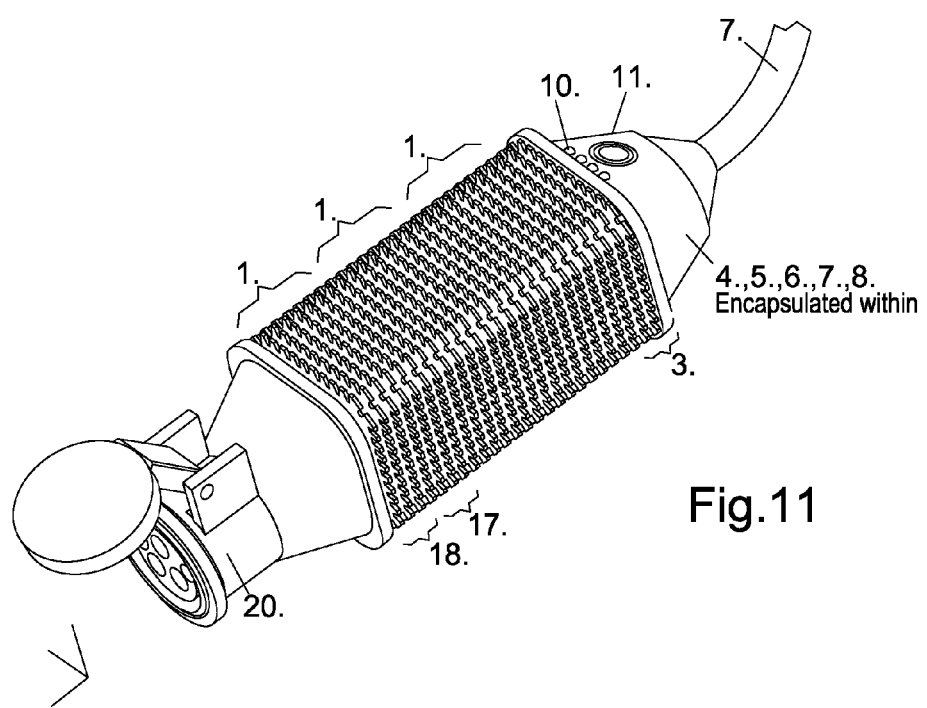
FIG. 11 is a representation (picture) of the final assembly after the unit is potted and covered in a yellow plastic coating for electrical sealing and identification as 110V socket (IEC60309)

FIG. 11 is a picture of the final assembly after the unit is potted and covered in a yellow plastic coating for electrical sealing and identification as 110V.

Potting (encapsulation) keeps all the electronics sealed and by using an elastomer e.g. silicone the unit can be protected against mechanical shocks.

Distribution Transformer Applications and Embodiment.

Power transformers used in the electrical power grid are very efficient devices operating around 98% to 99.3% efficiency. However since there are several such devices between the power station and the end-user that on average of 2% to 3% total energy wasted in distribution transformers. In the UK there are more than 400,000 distribution transformers, accounting for 3.3 terrawatt-hours of losses, 3 million tons of $CO_2$, and £300 M worth lost electricity per year. Worldwide the figures are 50× these numbers since the UK consumes 2% of the worlds electricity.

Up until now, power electronics has not been able to compete against a well designed standard low frequency copper+iron transformer. It is often thought futile to try and compete on efficiency alone. Especially as recent developments in standard transformers using amorphous core materials reduce the standby energy greatly. However this only applies to reduced standby power—overall efficiency under load is not improved and most transformers are loaded at around 35% of full load on average.

The new circuit inventions here described to directly address the shortcomings of high frequency solid-state-transformers using fully adiabatic high frequency transformer circuitry.

Losses in the Previously Described Circuits

Losses in a high frequency electronic transformer come in three main sources (MOSFET is the example device given).

1) Transformer Magnetisation Losses.

Hysteresis losses from AC magnetisation reversal can be a large component of losses. Can be reduced using better materials such as amorphous metal ribbon or ferrite rather than steel, or can be reduced using larger cores and lower flux density. [core losses proportional to $B_{max}^2$]

2) Transformer Copper Losses

Come from the $I^2 \ast R$ losses of the winding conductors. Can only be reduced by adding more copper (reducing current density), or moving to a higher frequency where a similar amount of copper can be deployed in shorter lengths of larger cross-section in the shrunken magnetics.

3) Semiconductor conduction losses. In the case of a MOSFET these are $I^2 \ast R$ losses from the MOSFETs on resistance. Larger or more numerous MOSFETs reduce this at the expense of cost although oversizing of the switching elements has a secondary advantage of reducing their stress levels to the point where 25 year operation is practical and continuous overcurrent ability of 3× (at reduced efficiency).

4) Semiconductor switching losses. Occur during the times the semiconductor switch is in-between its fully on and fully off state and therefore conducting in a very wasteful manner. Also there is a Coss output capacitance to be charged/discharged which is generally results in an energy loss per switching transition of $0.5 \times Coss*Vds^2$.

5) Semiconductor gate drive losses. It takes energy to turn on then turn off the semiconductors. Power dissipated driving the gate of a MOSFET transistor given as $C*V^2*F$, or $Qgate*F*Vgate$. Where Cgate is made up of Ciss and miller capacitance.

From the list above items 1 and 2 can be taken arbitrarily low by up-sizing the volume and weight of transformers used—adding more ferrite and copper to the equation. The lowers the flux density and the current density respectively with losses being proportional to the square of these figures, they can be taken quite low (<0.1%). Since switching at a very high frequency drastically reduces the initial size and weight of the transformers vs a low frequency transformer design there is ample scope to up-size those components to the required levels of efficiency. Overall the weight reduction might be limited to around 2 to 5× rather than the usual 10× normally seen for high frequency switching techniques which usually aim for smallest possible size and cost.

Items 3, 4 and 5 are related:

The simple idea of 1) up-sizing the power MOSFET devices to reduce overall on-resistance works but eventually around the 99% efficiency point no further improvement is possible because the attendant 2), 3) increase in switching losses, gate drive losses respectively which will tend to consume any such improvement to conduction losses—given that the switching losses are proportional to the total size of the switching semiconductors deployed.

Several new techniques and mechanisms are described here to reduce those loses by several factors to allow adding more MOSFET capacity to drive down losses.

Adding more MOSFET capacity adds initial up front cost to the transformer but the costs are recouped quickly through return on investment from saved energy. A good trade-off exists at the 99.75% efficiency point where a typical 1% electricity saving vs standard transformers pays for the upfront cost within 5 years.

Most distribution transformers are expected to last for 25 years so it makes sense to upgrade to a such a high efficiency transformer as soon as the old style unit fails.

With the advent of Superjunction MOSFETs [1] and the rapid pace of improvement of these devices a crossover point, where even the initial cost advantage of standard transformers will be gone, is fast approaching.

New Inventions

Improved drive techniques relate to the MOSFET gate drive and to the power transformer drive. These circuits are interconnected but can be documented separately for the most part.

FIG. 14 represents an augmented design similar to the modules in previous diagrams where a complete module 20., is made up of several interleaved sub-modules each operating on a different phasing.

High frequency transformer, 21., couples the primary to the secondary sides. Control electronics 22., has a microcontroller (uC), an FPGA, and ADC and control software to implement localised control functions while under overall control of an external touchscreen computer 23., via fibre-optic control lines (for voltage isolation) and RX and TX electro-optics 19., Output voltage and current can be digitised from points 24 and 25. respectively in the modules.

FIG. 16 contains a modified transformer drive circuit where the transformer inductance is noted 32, and with optional capacitance 33. These L and C values can be absorbed into a fully adiabatic drive system. MOSFET gates are to be driven by transformer circuits.

Figure 17:
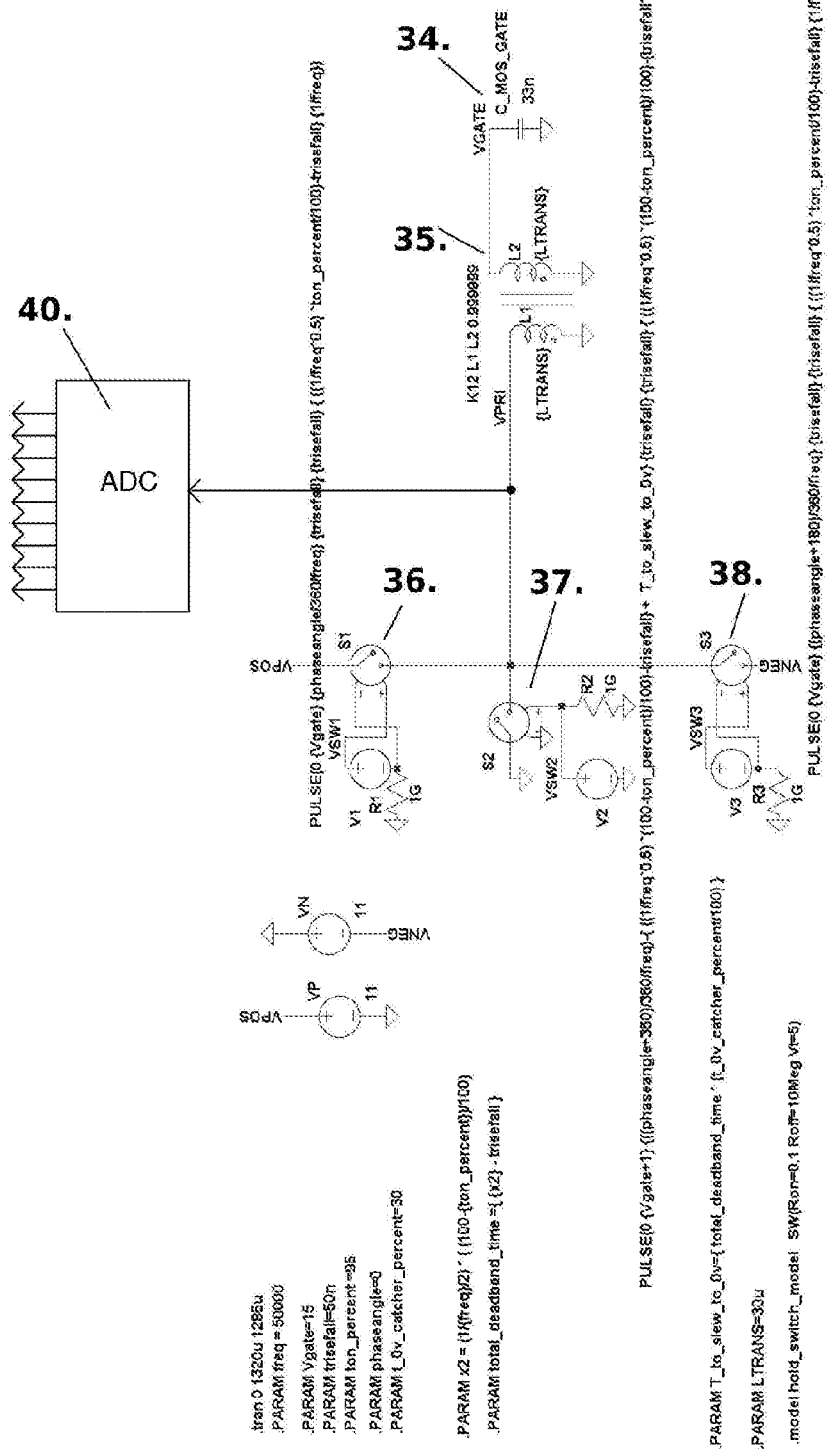
FIG. 17 is a gate-drive transformer circuit for driving the MOSFETs of FIG. 16.

FIG. 17 is a gate-drive transformer circuit for driving the MOSFETs of FIG. 16. Gate capacitance 34., represents the total capacitive load which will in fact be made up of the combined MOSFET gate and miller capacitances of all the MOSFETs even if they are driven by different windings of the same transformer. 35.

It is an aim of the circuits to avoid the usual $C*V^2*F$ power losses of driving power MOSFET the Ciss and Coss capacitances and any other added capacitances plus any transformer inter-winding and other so-called parasitic capacitances.

Ideal switching behaviour would be achieved dynamically by controlling the timing of gate and drain charge flow to synchronise together. Optimisation is aided by the interleaving where of phase-offset paralleled sub-modules as described previously.

Improved Gate Drive Waveform
  tri-level switching using switches 36,37,38 suits adiabatic and even non 50:50 duty gate drive waveform (waveform with deadbands) and can allow for a single transformer to drive a whole set MOSFETs by using multiple secondaries phased accordingly. While one set of MOSFETs are switched on [primary-side MOSFETs and secondary-side MOSFETs], the opposite-sense set of MOSFETs are turned off with a full −Ve bias for lowest leakage currents.

The waveform offers the advantage of zero DC component even with varying active periods since the +Ve and the −Ve components are of mutually equal but variable length and equal but opposite magnitude. In this example, magnetisation flux, which when converted to current does the driving of the MOSFET gate capacitances. Only after sufficient charge has flowed to/from this adiabatic energy source do the 'holder' switches 36, 37 or 38 activate to maintain the desired transformer primary drive voltage [and hence the secondary voltage by virtue of a turns ratio] and this holding either replenishes/reverses the magnetisation current for a +Ve or −Ve hold or simply maintains the current i.e. flux in the core during the GND phase.

FIG. 18 has the controlling and resultant Vgate waveforms of the circuitry.

FIGS. 19. 20, 21 are the different waveforms at Vgate with undershoot. Overshoot and ideal waveforms respectively.

It is known that waveforms for the gate are accurately represented on the primary of the gate-drive transformer where an ADC, 40 can measure similar waveforms and these results can feed back into an algorithm which can adjust timing in the CPLD circuit if needed to optimise adiabatic operation. (see FIG. 25 described later). The correct time to switch the 'holder' switches is that which 'catches' the swing as it a) approaches or slightly passes V+, b) as it approaches or slightly passes 0v, c) as it approaches or slightly passes V−. So long as the swing is caught very close to the actual holding voltage there is very little energy loss and $C*V^2*F$ power losses do not apply. For lowest loss, the transformer should have high Q-factor in its inductances.

Startup is in a non-adiabatic mode until the magnetisation flux waveform settles.

Magnetic energy source is not the only known adiabatic energy source. Alternatively a multi-level DC supply e.g. 10-DC levels can be sequentially switched to drive the gates with a stepped voltage waveform. This reduce the dynamic energy consumption by for approximately 10 fold in this example.

A final detail might involve fine-tuning the +Ve to −Ve polarity timing ratio together with the +Ve or −Ve pulse height ratio if ideal switching can only be achieved with slightly varying +Ve to −Ve timings.

FIGS. 22-24 are simulated waveforms from the power transformer drain connections.

The power transformer timing is related to the drive-transformer timings but can be controlled independently. Added capacitance can reduce the slew rate of drain voltages which again are driven adiabatically by the power transformer's magnetisation currents. The lower the slew rate is vs. the turn-on or turn-off time of the semiconductor, the less lossy partial conduction time periods become.

ADC 39 can read the voltage waveforms to act as digital feedback to achieve optimal functioning. Alternately a measure of the current waveform (voltage across resistor e.g. 140., or a current transformer) a signal which will show by the sign and magnitude just how out-of-time the MOSFET turn on events are—early or late and by how much.

The energy recovered from the MOSFET gate capacitance is exchanged with magnetic energy in the core and, absent secondary losses, no energy would be taken from the power supplies to drive the MOSFETs.

A digital scheme to implement variable timing shown as FIG. 25 although it would likely be implemented in verilog on a CPLD or FPGA. In this a free-running oscillator (possibly adjustable speed) clocks a high speed counter up to 16 bits wide 41., clocked at perhaps 10 nS intervals and its output is delivered to a series of magnitude comparators 42., each of which is fed by an independent digital control word (44 to 51.) from the microcontroller or computer Each "=" output of the magnitude comparators either sets or resets a S/R latch like 43. This allows the exact on and off times to be set for the +Ve and the −Ve gate drive within a cycle, and it allows for two pairs independently timed on/off pulses for the 0V switching part of the waveform. This gives fully independent tuning of the adiabatic gate drive and the timing allowed for the main transformer adiabatic swings.

Algorithmic feedback to a state machine to offset the timings of the firings of the 'catcher' switches would only need occasional updating to maintain the operational point of ideal catching and fully adiabatic operation based on non-realtime under-sampling of the repetitive waveforms involved via ADCs.

Drawings showed digital techniques but the possibility of non-computing (i.e. analog) feedback mechanisms with variable delays and oscillator periods is possible given the simplicity of the loops The system need not be real-time closed-loop. Probably a one-time design-point or production-time calibration procedure with later lookup tables against input and output conditions would achieve a similar result.

As a worked example of the gate-driving losses with 11 volts drive level and 50 KHz
Losses:
30 uH=70 mW—best waveform as per FIG. 21
60 uH=150 mW (undershoot) as per FIG. 19
20 uH=200 mW (overshoot) as per FIG. 20
C*V^2*f×2 would be 400 mW Overall energy savings approx. ~70% versus C*V^2*f drive when including other losses.

To compete with Amorphous cores, the no-load (gate and switching) losses should be less than 0.05% of the transformer nominal power rating. To go below this level it is possible to disable selected sub-modules of the converters. E.g. a six-sub-module module could be switched to operate on 2 phases at low load reducing the standby losses by a further factor of 3.

FIG. 16, padding capacitance C1, C2 (33.) can be split between primary and secondary sides if desired. Also carefully balanced transformer windings technique can result in capacitances which too are absorbed into the adiabatic system and therefore wont contribute proportionally to switching energy losses.

This extra capacitance can reduce slew rate and EMI noise.

A worked example on the main transformer (power loss with no loading figures) accounting for Coss and other switching losses
with insufficient time allowed for magnetisation to swing the winding (undershoot) as per FIG. 23
losses=1.5 W (ton=98%)
with too much time allocated to swing the core winding (overshoot) as per FIG. 22
losses=1.5 W (ton=90%)
ideal timing as per FIG. 24
losses=35 mW. (ton=94%)
for reference CV^2F would be 2.3 watts.

Another advantage of adiabatic system is a potential for optimisation to MOSFET construction (i.e. engineering a custom MOSFET silicon structure) which favours Ron even if it impacts Coss and Ciss Crss since these latter parameters are largely cancelled by adiabatic operation. Also, some proposed super-junction MOSFET structures with very low losses are not currently commercial due to the hard recovery of the body diode which is a side effect of optimisation of Ron. In the circuits described here, the reverse body diode only has to conduct small magnetisation currents and turn-off is natural and not hard commutated allowing such low resistance MOSFET constructions to be used.

A customised MOSFET construction could be imagined where a complete AC switch with common drain [back side of wafer] is produced saving packaging costs.

Improved Topology:

Overlapping multiphase paralleling of sub-modules and the simple resistive paralleling it brings (no series inductors prior to the combine points) lets each subconverter switch in and out cleanly to the parallel common point.

Distribution Transformer Designs with Redundancy and Surge Protection.

FIG. 13 is a string-of Module (20) design for high-voltage series-input, low-voltage parallel output.

FIG. 14 shows a uC (microcontroller) based system 22.

Monitoring of voltages and currents in the respective bridges via isolated sensors or optocouplers is possible or as shown as 24,25 the uC module could be biased on the secondary, low-voltage side of the transformer which is at a relatively low voltage with respect to true ground potential and where it can directly monitor voltages and currents. The uC itself communicates with a central control computer using fibre-optic connections 19, which can withstand the high voltage potentials involved. Monitoring relative to pre-programmed norms can establish if there are any faults developing in the circuits and can activate redundancy programs in the main computer.

The module 20 shown comprises multiphase sub-modules 1., designed as described previously.

A N+1 or N+M redundant system can be created which as a side-effect also gives what is equivalent to a On-load tap changer for a conventional distribution transformer. FIG. 13,14 shows the idea.

An example distribution transformer replacement FIG. 15 52, has an input voltage of 6.6 kV line-to-earth 3 phase system (11 kV between phases) using a delta-connected high voltage input. high voltage step-down 3 phase transformer could comprise of 48 series connected modules per phase with a nominal 230V input each unit. To add redundancy of 6% failure capability (3 spare units) and a +10% output reduction range (5 extra units) a total of 56 modules would be connected in series. Modules held in reserve would have the uC simultaneously operating transistor pairs A+C and B+D which effectively short-circuits the input side of a module taking it 'out' of the series connection but does not break continuity.

It also must turn-off transistor pairs E,F,G,H to avoid any unwanted current flows.

Any unit can be bypassed using a command over the fibre-optic link to the on-module uC (microcontroller) if the overall system detects a failure. Any in-reserve module in the chain can be switched in its place by "un-bypassing". In case of complete uC circuit or open-circuit failure mode an independent fibre-optic triggered Triac 26,28 circuit can be used.

Ordinarily a module taken out of service would not present a load on the secondary to the other modules which are parallel-connected to the outputs, but there may be a fault causing reverse-currents passing into the output port. A fuse 30 should clear in this eventuality. To be certain of this, the local uC can be instructed to drive pairs E,F,G and H on simultaneously to force a fusing.

As a fall-back in case of a complete uC circuit failure, a second independent circuit a fibre-optic triggered thyristor (triac) 29 arranged to force a short circuit can be engaged.

Preferably any short circuit mechanism will be engaged at the zero crossing point of the mains output voltage waveform. The fuse will clear without a large stress or breaking-capacity problem when the output voltage and hence fuse current build up passes the I^2*T rating of the fuse. Such a clearing of the fuse will not impact the output waveform quality since the short-term drive capability of the ~50 other modules can both clear the fuse and maintain the output voltage required for the load.

The redundancy system can be employed also in a different way as the equivalent of the "On-load tap changer" used on conventional transformers. Whenever a series-connected modules is switched-out by a bypass-command from the central processor, the imposed voltage per remaining module is increased. Likewise if other modules are switched-in (up-bypassed) then the primary voltage per module is reduced since more modules share the line voltage in series. With a paralleled-output scheme, the output voltage increases and decreases in the two cases respectively since the outputs a scaled value of the primary input voltage of each module. A nominal 50-module string will give a +2%,−2% change in output voltage in the two cases respectively. Switching in and out more units gives a greater range. One or more of the units could be multi-tap units for finer control or even a proportionally controlled analogue AC buck or boost regulator for infinitely variable voltage changing and regulation. Closed loop control can be achieved by the central computer having a measurement of the instantaneous output voltage and can possibly run one of the commonly used algorithms used for the current tap-changing transformer systems. [picture with central computer]

Fine Tune Tapping.

FIG. 26

With addition of at least one extra primary turn tap on 21 and at least two low-voltage AC switches 53 per sub-module, each module can have a small step adjustment in its turns ratio. Signals K and J work to make a SPDT switching arrangement. For example switching in one extra turn on a 20 turn primary gives a 5% turns ratio adjustment for a single module. Where there are for example 20 modules operating in series for a module-string transformer it represents an adjustment step of 0.25% in the overall turns ratio. By coordinating both the integer number of full modules switched-in and switched-out and the number of units in the string with a +0.25% turns ratio boost a fully variable turns ratio and hence overall voltage regulation can be achieved with 0.25% accuracy which is 10× more accurate than normal tap changing transformer. Like many of the configuration changes, it is preferable to change taps on a zero-crossing point of the AC mains waveform.

Hot-Swap Plugin Modules.

Modules 20 can be constructed as plug-in form factor. Triac circuitry 26,28 can be outside of each module such that it is possible to bypass a module while it is unplugged temporarily for 'hot-swap' replacement of defective module. Additionally for even higher redundancy, a mechanical switch contact could be wired over the triac such what when the module is partially removed the switch contacts connect. An MOV (metal oxide varistor) 27 is used to clamp small overvoltage transients. The touchscreen control computer 23 can display to a service technician which module is defective and can coordinate the swap interactively, switching in one of the spare modules during changeover. Remote internet diagnostics can be supported e.g. via 3G network from the computer.

Apart from the servicing advantages of the modular system, the construction lends itself to quickly configuring customised transformer design in terms of input and output voltages from standard modules. It also aids installation because a large transformer can be assembled on site with each piece being easy to transport in typically 1 to 2 kg module increments.

PIGGY-BACK converter.

A large market is the replacement distribution transformer market. Given the 25 year average transformer life, in the UK there is a turnover of approximately 25,000 units per year. Rather than waiting for a complete failure to occur, many of these replacements can be anticipated from early indication of transformer degradation (e.g. contaminants in the transformer oil being detected or high thermal-imaging temperatures found during routine maintenance).

One concern over moving to a semiconductor based transformer is the unproven reliability of any new device coming onto the market. Redundancy features described previously should help allay concerns but for critical applications, adding a DPC transformer in piggyback fashion to an existing not-yet-failed transformer together with switchover circuits would allow for an upgrade without having to remove the old transformer. Should there be a failure with the new DPC transformer, the old transformer can act as a backup.

The normal clearance allowed around high voltage electrodes in a substation is 750 mm. to the outer. So long as the new unit fits inside this restriction and can provide enhanced insulation levels by its addition into the space then it can be piggybacked onto an existing transformer with using a changeover switch (possibly automatic) or quick release terminals for a service technician to perform the changeover. Using a slender form factor and a fully insulated outer casing made e.g. with GRP it should be able to withstand the full electric field potential and shield the walls.

TRANSIENT PROTECTION against lightning and other surges.

FIG. 27 has surge arresters configured to protect the device in the common configuration where a high impedance earth connection at the remote source of the MV voltage experiences a fault of one conductor to ground— which can cause the full nominal line-line voltage to appear from the non-faulting line to earth.

Lightning-class high capacity surge arresters (heavy duty MOV type typically) 54 will clamp voltages to maximum of 3× nominal to-ground potential e.g. adding a 6.6 kV nominal AC to-ground line voltage surge arrester limits a 10 kA lightning strike to a potential of no more than 28 kV to ground peak DC @ 10 kA.

These transients voltages can be measured using voltage divider type 55 installed on each phase. Transient currents can be measured using current transformers 56 and ADC 57 can feed the result to a computer based self-protection detection algorithm. The rise time of a typical lightning pulse is of the order of 1 uS which is ample time to switch off power MOSFETs (100 nS turn off time) especially by detecting a rate-of-rise.

FIG. 28.29 diagrams 'dummy' voltage-sustaining series modules which can stand in for normal modules (e.g. 20) and added in the strings shown for FIG. 13 and FIG. 16.

System programming can prevent exposure of the normal modules string to overvoltages by turning off these 'dummy voltage sustainer' modules switches in case of input overvoltage. This can happen very quickly by driving pulse on 59.

The voltage-sustain-only stage, for the same amount of MOSFET area, would have ¼ of the conduction losses of a real stage, so with a 50% extra number of MOV-only stages to support a full 3× overvoltage increases the condition losses by only 12.5% MONITORING and control of the overvoltage protection High speed ADC 57 can measure a voltage-divided 55 version of the voltages over the phases and logic or software can decide when to un-bypass the MOV stages. A low latency 50 Msps converter (20 nS) is adequate for this purpose. By monitoring the rate-of-rise of voltage by comparing successive digital samples it is possible to predict the arrival of a lightning pulse even before it has fully formed and the series input circuits can be turned off and into a high voltage sustaining mode before the full voltage has arrived. Furthermore it is known that the first lightning stroke tends to have a slower rise time (typ. 8 uS) than secondary strokes (~1 uS) which can occur a short time later down the same discharge path. Usually all the events occur within a second of the first strike so it makes sense to keep the overvoltage protection active for a second or so after the first strike which reduces the need to detect and for act on the <=1 uS events.

Recording high-current pulses through the surge arrester measured with current transformers 56. These and other useful data can be logged to a flash memory on the microprocessor system for later analysis.

With ADC results feeding an algorithm inside the control computer, there is the opportunity to regulate-away some of the smaller transients (using the tap-changer techniques mentioned previously) and ultimately to disable normal transformer function for the larger transients.

Extremely fast pulses <100 nS risetime are rare but to cope with this L,C filtering can be inserted as shown in FIG. 27 in the Ph clamped lines, the lines which are connected to the sensitive electronics.

Protection system has been shown with ADC and MOVs on on the primary side but the same scheme can be applied to the secondary side in situation where surges are anticipated from back-feeding or lightning earth-strikes for example. Alternatively, a secondary overvoltage can be clamped by activating switches E,F,G,H on the secondary side (see FIG. 14) of all paralleled modules/sub-modules since the parallel on-resistance would be in the order of a few milliohms which can withstand 20,000 amps short term. The accompanying triac 29 can also be fired to withstand longer spikes with the probability of fuse rupturing.

Data Over Power Circuits

FIG. 30 includes component inductance 59 to allow the wiring from the DPC distribution transformer to serve as both power and data source for internet type connections. High frequency data is input on coax connectors like 61 and coupled via capacitors like 60 into the various output phases feeding houses in different streets (as is typical with 3 phase power distribution). Similar inductive high impedances can be added at the house and data coupled bi-directionally with similar capacitive means. The inductances give a high impedance to high frequency signalling components but pass the low frequency mains power with low losses.

Alternate Power Switches and Battery Backup for the Modules.

By rearranging the switching, an AC<->DC<->AC<->DC<->AC converter is built still without needing electrolytic capacitors. In FIG. 31 the input AC goes through 4 MOSFETs rated typically at 600 Volts 63, The body diodes act as a bridge rectifier from the AC side but by using the comparator 66 output to decide to switch either Q+R or T+S MOSFETs the voltage drop over the 'bridge rectifier' can be dropped to ohmic levels (below ~0.7V) for high efficiency and a true bidirectional power flow between primary and secondary sides is established. In the opposite direction, power from the VDC side can be steered by the MOSFETs to the AC lines in either polarity to implement the low frequency e.g. 50 Hz, 60 Hz AC input/output voltage reversals. A half bridge arrangement with typ. 1200V possible compound-semiconductor devices 64,65 driving a centre-tapped HF transformer 21.

A mirror image of 62 (62 mirrored) can be placed on the secondary side of the transformer to perform synchronous demodulation and overall final polarity inversion on demand using the Q to T signals on the secondary side.

With the DC point available, battery backup can be added to protect against brownouts and short duration blackouts.

Battery 67 could be Lithium Polymer with a high discharge rating or similar lead acid. To sustain the output for approximately a minute at full power is enough under most circumstances. This gives time for a backup generator to switch in for cases where long interruptions are expected.

PWM controller 68 with feedback resistors for closed loop control and set-point input coming from DAC converter 69 fed from a digital microprocessor or ROM fed data-stream can generate a half-sine, 2×F waveform on the VDC line which can be low-frequency alternated onto the AC outputs after high-frequency isolated transmission over 21. This circuit could be responsive to external input from a standby generator so that the locally generated sine wave is phase-locked exactly in synch with the generator to allow for glitch free switchover between battery and generator power. Battery and boost circuit is shown on the primary side, it could be on the secondary side just as easily.

Picture of a Hot-Swappable Module.

FIG. 32 is a 3D model of the main features of a hot-swappable module. Batteries 67 sit at the low-tension (LT) side of the unit. LT plugs 70 will mate with a suitable chassis. Guides 72 are part of the chassis and aid the module's insertion and removal with handle 73. Medium voltage connectors 71 and fibre-optic connectors 19 are also designed to mate to the chassis when inserted. The chassis (not shown) would ensure interconnections between the modules and additional circuits as described for FIGS. 14 and 15.

FIG. 33 are drawings of some optimised transistor physical constructions for this application. A dual gate arrangement on either side of the semiconductor gives an inherently AC switch which gives the same sustaining voltage as a standard device but in both directions, obviating the need for a second inverse-connected semiconductor device usually used to implement an AC switch. This gives a factor 4 improvement (2× fewer devices and ½ the total series resistance). 33(a) is basic device in a JFET configuration typically a compound (e.g. Silicon Carbide) semiconductor (b) is a lateral device with 'super-junction' P implants. (c) is vertical MOSFET version of (a). (d) shows (a) biased for one of its directions of conduction. Standard low-voltage low cost MOSFETs have been added to permit normally-off operation of the often-found normally-on high voltage JFET device. (e) is the same circuit for a insulated-gate MOSFET dual gate, this time of super-junction type construction which is inherently a normally-off device. Drive transformers are shown.

Reference: [1] Chen J, Sun W, Zhang L, Zhu J, Lin Y. A Review of Super-junction Vertical Diffused MOSFET. IETE Tech Rev [serial online] 2012 [cited 2012 Dec. 17]; 29:44-52. http://tr.ietejournals.org/text.asp?2012/29/1/44/93137.

Universal AC/DC Input/Output Converter

Working with the building blocks and control methods previously expounded see also FIGS. 1, 2 and 4, there is a potential to build a quite universal power converter. It could be used singularly or in 3 phase grid systems.

The following write up is in relation an 'inverter' i.e. the conversion from a DC source typically a solar panel array to an AC output typically the AC mains of 230V 50 Hz AC. It should be apparent that the circuit energy paths are fully bidirectional and reversible and as such the unit can just as easily convert sinusoidal AC source into a programmable DC output such as for a Power-Factor-Corrected DC bus.

Not shown specifically are the controller, or the multitude of instrumented points which the controller uses. The control algorithm is expressed in words with references to the various switch points and circuit nodes being instrumented.

General techniques described for previous controllers and strategies can be applied.

FIG. 34 A has the main parts of the universal converter.

Figure 34B:
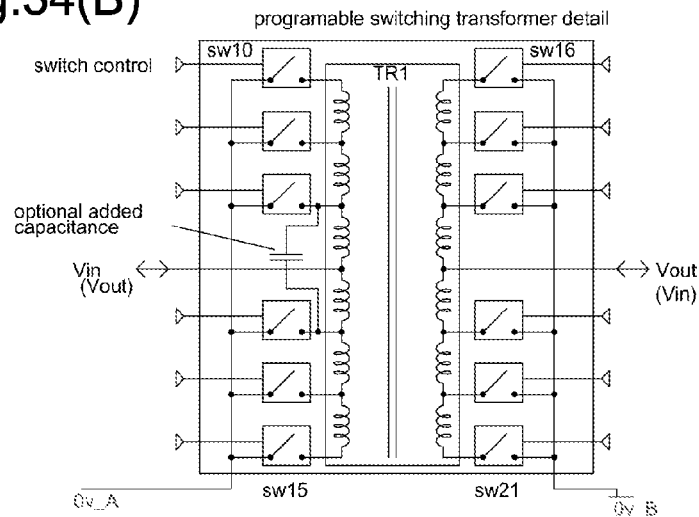

The essence of the unit are a pair PST (Programmable Switching Transformers) shown in detail in FIG. 34B. The transformer is just a multi-tap version of a standard design and in this example it operates as a full-bridge centre-tapped on primary and secondary. One switch from either Sw10, 11,12 is turned on together with one switch from Sw16,17, 18. Then one switch from the Sw13,14,15 group and one switch from Sw19,20,21 are be activated. The process repeats with in-between soft-switching event where the transformer magnetisation inductance and possible additional capacitance reverses the polarity unaided. Choice of primary and secondary ratios through choice of which tap switch to activate gives a large number of discrete transformer voltage gains/reductions. V1 and V2 can be set on a cycle by cycle basis. All of the taps could be on one side of the transformer or, as shown, the output and input taps can form a matrix of available ratios.

High efficiency is achieved with the soft-switching method on the high voltage side and good transformer magnetic core utilisation comes from the full bridge. Also EMI generated is very low due to the soft edges.

PST1 and PST2 have their active taps changed during the coarse of a each mains ½ cycle so that V1 and V2 move up and down in step, and the two voltages are offset so that at most times they straddle the instantaneous mains voltage to drive into. This is shown in the figure. It is possible to have V1 larger than V2 or vice versa so long as the voltages straddle the mains voltage and the controller is programmed to flip the PWM ratios accordingly.

The intelligent controller working on instrumented readings from around the circuit also controls Sw1 and Sw2 comprising a synchronous buck regulator which 'blends' the V1 and V2 voltage to match the output waveform. When the mains waveform begins to move outside of the currently selected V1/V2 voltage window, the taps are changed so that again V1 and V2 straddle the mains voltage. The Sw1, Sw2 PWM ratio is controlled at all times to keep a low ripple continuous L1 inductor current, the ratio being the expected one from standard buck regulator equations.

After one mains half cycle is over, the setting of the reversal circuit of SW3,4,5,6 is updated to change to the opposite polarity to drive the other mains half cycle. The controller repeats its half cycle over again but this time it appears negative in the mains. SW3 to 6 also form a disconnect relay function which can isolate the unit from the mains. The reversal circuit is not strictly necessary because the same thing can be achieved altering relative the phasing of primary and secondary switches on TR1 control in both PST1 and PST2. This leads to a requirement for bidirectional synchronous rectifier switches but is otherwise straightforward.

A big advantage of this architecture is that the secondary synchronous buck regulator can be built with low-voltage (typ. 150V) rated MOSFETs since the only potential the buck regulator sees are between V1,V2 and the mains output voltage—all within 100 or so volts of each other. These MOSFETs are low cost quick and efficient switches.

The low switched voltages also reduce EMI and minimises the size of the filter inductor compared to full-line-voltage-swing PWM systems.

A slight complication exists in that the DC voltages on V1 and V2 are not available during the transformer reversal soft-switch period and yet inductor current in L1 must flow continuously. For this reason, the switching of PST1 and PST2 should be 90 degrees apart so their reversal periods are not coincident and then the controller IC can briefly switch over to the non-reversing V and quickly reconnect with the previous V afterwards and the controller can compensate for this by tweaking the PWM ratios accordingly.

This approach uses a lot of silicon switches on the transformer drivers but these are low cost minority-carrier switches, some of which e.g. the low-voltage ratios drivers are small and total semiconductor cost is no more than $25 for a 4 kW design For solar panel inverter use, the MPP (maximum power point) control algorithm should be used for best conversion efficiency and can be implemented by the controller regulating the output current up and down which reflects back onto the DC input current. The load-line characteristic of the solar array causes a change in the DC input voltage and the highest power point can be established by monitoring voltage/current measurement during an adjustment period. Maintaining the optimum MPP input voltage is achieved by adjusting the transformer taps and the PWM ratios together to get the required current through L1.

A proposal for transformer based converter was put forward by.

Deepak, E. S.

A novel multilevel inverter topology based on multi-winding multi-tapped transformers for improved wave shape requirements Power Electronics (IICPE), 2010 India International Conference on 28-30 Jan. 2011 Page(s): 1-5

Amongst many differences between Deepak and to the proposal here are:

Deepak describes taking several DC voltage sources and putting them in series (additive or subtractive) and sending them to a common output core. Deepaks' output core is low (line frequency) transformer making it roughly 50× bulkier than our proposal for high-frequency cores for the same power throughput. Also it is questionable whether the series summations of the voltages are possible in the manner drawn in his FIG. 4 because it would mean imposing different volt*turn ratios on the same core from first appearances.

Challenge and other such low-loss, miniature inverter application.

Ripple Current Reduction Circuit Particularly Suitable for Solar Inverter.

This invention relates to a specific example of Solar inverter comprising a DC to AC circuit converting typically 400 Vdc from a string of solar panels into 120V,230 or 380Vac for connection to the grid or to power local mains-voltage appliances. The methods here are applicable to other topologies and operating voltages and voltage types. Descriptions here are generally further to ideas described in application PC927170W0 PCT/GB2014/050368 hereby included by reference.

A known problem in DC->AC converters stems from the fact that the output current is AC sinusoidal while the input current is DC. What happens is that the sinusoidal output current results in an equal sinusoidal-squared input current on the DC side. Such a large ripple current causes extra losses when driven from a high impedance source such as a string of solar panels.

The typical remedy is to arrange a bank of electrolytic capacitors to be placed over the DC input to the inverter totalling several 1000 s of microfarads on a 2 kW inverter. Such a large capacitance is needed to keep ripple current down by keeping the voltage ripple below about 12 Vp-p on a 400V bus. It is easy to calculate from CV=IT the capacitor needed to maintain this input ripple voltage while delivering a 2 kW AC sinewave.

That the standard scheme is inefficient is obvious from calculating the energy on a maximally-charged input capacitor and the same capacitor at the end of the ripple cycle. Given that E=0.5*C*V*V. 400V on a 7000 uF capacitor=560 joules, and 388V=527 joules. So only 33 joules of storage energy is actually utilised.

The actual capacitance needed to store 33 joules at 400 VDC=415 uF. Which is around 17× less.

Electrolytic capacitors are also bulky and unreliable and prohibit the creation of inverters exceeding much above 5 watts per cubic inch power density.

The invention here replaces the electrolytic with a switching converter topology which can operate with a much smaller total capacitance easily made up with ceramic, film or higher-reliablity forms of polarised capacitors.

Input Ripple Reduction Method

FIG. 35 gives the input ripple reduction method. Cstore is a 400V rated ceramic capacitor (possibly made up of series/paralleled devices) to achieve 415 uF in this numerical example.

Switches SWA and SWB together with L1 form a Buck/Boost linkage from capacitor Cstore and the 400V bus which itself only needs minimal capacitance Cbus—just enough to filter out high frequency ripple currents.

The SWA:SWB time ratio during closed-loop control will tend to be around (Vmeasure-Vstore):Vstore and moves from this position on demand to move the average inductor current up or down, sending it +Ve or -Ve as needed.

A control microprocessor, monitoring the various circuit voltages and currents as is known in the art with ADC converters and driving its PWM outputs from a control software is able to close a control loop as follows:—

Control loop target is to maintain a steady input current from the solar input during the coarse of a mains cycle even when the output current goes from 0× to 1.41× the nominal output RMS current level at 120 Hz rate (when generating US frequency electricity). Since the input is fairly high impedance (e.g. 10 ohm) then it is safe to control the 400V bus voltage within certain limits and know that this will reflect directly onto a limited input ripple current.

Control loop, seeing the 400V dc bus drift higher that nominal [the output instantaneous power is lower than input instantaneous power—as occurs towards the zero point of the sine wave output current] will change the PWM ratio and hence SWA:SWB time in order to pump energy into Cstore. Cstore is able to absorb say 33 joules and not exceed 400 Vdc at the end of the storage period. Proportional PWM control will be stable.

Control loop seeing the 400 Vdc bus drift lower than nominal [that output instantaneous power is higher than input instantaneous power—as occurs towards the peaks of the sine wave output current] will change the PWM ratio and hence SWA:SWB time in order to take energy from Cstore and put it into Vbus. Vbus is therefore reinforced and will not droop.

Proportional PWM control will be stable.

Input ripple control loop to have low responsivity to low-frequency input voltage changes i.e. high-pass or bandpass characteristic to eliminate short term response to the power variation from the panels themselves.

An outer additional or augmenting control loop can slowly adjust the 400V set-point to actually vary in the range optimal for the output characteristic of the solar panels in the illumination conditions prevalent at the time.

General Topology.

FIG. 36 is a general 'transformerless' solar inverter topology which can work from the nominal 400 Vdc bus. Features are the high speed special BJT devices and the 'backing switch' on the freewheeling diodes which reduce conduction losses substantially. Control can be affected with the same processor board as FIG. 1 and generally well known techniques. The devices incorporated in the topology are described in PCT application no PCT/GB2014/050368 (published as WO2014/122472), which is incorporated here by way of reference.

What was described in our application so far is switching quickly between DC voltage sources and direct coupling to the AC output without a core instead using a line frequency voltage reversing mechanism at the output.

Adiabatic techniques were applied to largely eliminate the $C*V^2*F$ losses attributable to capacitance at the switch gate and output to allow up-sized power switches to reduce overall losses through conduction loss reduction.

A selection of taps of a high-frequency transformer and two of these were required to get the effect in the previous descriptions.

What now follows is an alternative arrangement of transformers/inductors and synchronous modulation/demodulation together with active low-frequency ripple cancelation based on multi-step, multiphase binary-tap selection with clear advantages for the LittleBox DC->AC inverter but useful more widely.

The following diagrams are meant to be largely self-explanatory.

FIG. 37 LittleBox Challenge specifications.

FIG. 38 Overall architecture. Featuring a DC supply via a 10 ohm resistor for a nominal 400V dc rail. Three interleaved HF transformers operating at different phasing have multiple DC tap levels available. A digital controller running a control program is able to monitor voltages, currents to control the taps and 'blenders' (described later) to generate sinusoidal AC output power and to control flow to/from energy storage ripple cancellation system.

FIG. 39 Has an illustration of the inverter finished article.

FIG. 40 and FIG. 41 focus in on the transformer and tap circuitry for one phase bank in isolated primary and secondary side (though this is not required by the Littlebox spec.)

FIGS. 42 and 43 show the output voltage AC generation system at a high level simulation (CPPSIM). The 'blender' is simply a PWM Buck/Boost circuit which here has been split into 3 interleaved phases. The controller produces a signal which is broken down into tap-select signal with a remainder signal (the modulo) which gives a 0 to 1.0 PWM drive to the blender to produce, in theory an infinitely variable overall transformer tap ratio.

FIG. 44 has the output waveforms from running the simulation which should illustrate how the device works.

FIGS. 45,46,47,48 show how the transformer itself operates in a low-loss adiabatic mode.

It will be appreciated that adiabatic operation is not the same as resonant operation. Adiabatic operation has fairly linear slew-rate-limited ramps and is not allowed to peak like a sine-wave. There is no particular resonant frequency so frequency can be changed over quite a large range.

Figure 47:
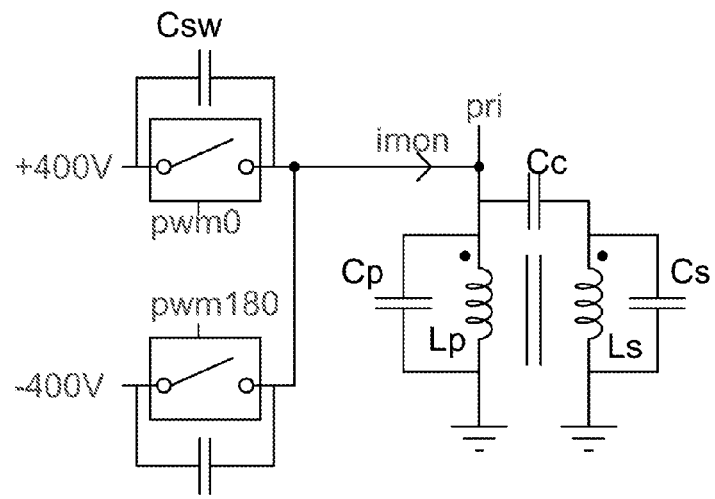
Figure 48:
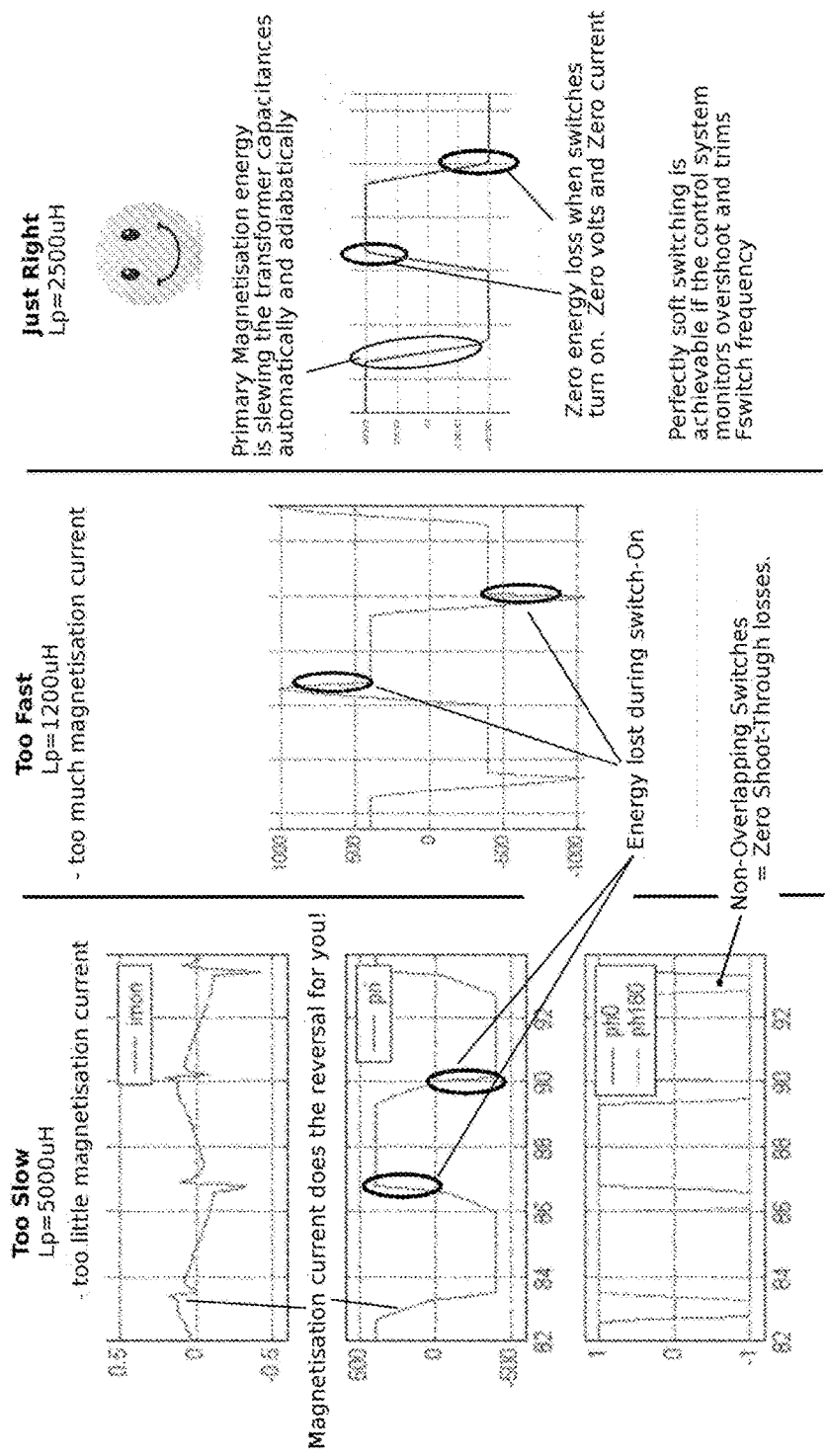

FIGS. 47 and 48 are just a 'half-bridge', DC only version (+/−400V) of what is going on in FIGS. 22,23,24 which is a "full-bridge" implementation using AC switches (although at the point of operation shown by the waveforms in FIG. 22, 23, 24 VAC happened to be at the +400V point.)

Gate Drive Adiabatics:

This is slightly more complicated than the power drive adiabatics due to the 'deadband' pause in the slews but otherwise very similar.

In FIGS. 16 and 17, the gate drive system is explained in see (p8),(p9) of the other document section beginning "—improved gate drive waveform". The adiabatic system for driving the gates at high frequency is exactly the same method of energy saving as for the power waveform except for the "deadband" or tri-level where the slew from a −Ve polarity to a +Ve polarity is paused mid-way to give a point where all of the power mosfets in the bridge are off—and note that on adiabatics systems the voltage slews should occur ONLY when power transistors are OFF—so this 'deadband' when coupled by the gate drive transformer to the switching devices sets the point where the power waveform is allowed to voltage-slew.

Power Drive Adiabatics:

FIG. 47 is a half-bridge implementation of the same system as was described in FIGS. 22,23,24 but now using DC switches as a simplification of using +400V and −400V DC supplies to two switches—because it's easier to display the voltage and current waveforms for a half bridge.

The power transformer is assumed to have low leakage inductance—ensured by twisted or otherwise intermingled windings—which is important for best adiatic operation and hence no leakage inductance appears in the equivalent circuit.

Lp is primary inductance measured on the primary side. Ls is the secondary inductance looking into the secondary side. Assume a 1:1 transformer makes Lp=Ls. Cp is parasitic inductance between primary terminals, Cs is parasitic capacitance between secondary terminals. Cc is coupling capacitance between primary and secondary windings. Csw is parasitic capacitance of the drive switches e.g. for a Mosfet this would be Cds. Imag (a.k.a. imon) is the magnetisation current of the transformer given by d Imag=V*T/Lp. This means the change in magnetisation current is proportional to the voltage and time and the energy stored in the transformer core is $0.5*Imag^2*Lp$.

Description below is with respect to one direction of magnetisation, the other direction is equal and opposite voltage and current signs.

The three panels, left, middle. right of FIG. 48 illustrate the same effect as that being shown in FIG. 23, FIG. 22, FIG. 24 respectively.

FIG. 48, left panel, is the result of a spice simulation where Lp=5000 uH and shows the Imon (which is identical to Imag in this case because the transformer is unloaded at the secondary). Ph0 and Ph180 are shown −1/+1 binary Off/On control of the +400V and −400V switches respectively. All of the capacitance components are set to capacitance values typically expected in the system.

The first thing to point out is that only in the short intervals where Ph0 and P180 digital bits are off (power switches are off) are there voltage slews visible on pri voltage waveform.

Current builds up when Ph0 is on (pri=+400V) as is expected from the previous equation and when Ph0 switch first turns off, there is still a voltage at pri (from the various capacitance holding up the pri voltage) so the build-up of current persists. Meanwhile, since Ph0 switch is off (all switches are off) and because the inductive magnetisation current by definition must continue flowing [inductive current flow can never be interrupted instantaneously] it does so at the previous peak value and this current is the current which reverses the polarity of transformer without any outside help. Unfortunately at Lp=5000 uH the current build up was not sufficient in the time allowed and the 400V to slew the capacitances by the required 800V slew in the time allocated (the dead band time) and it can be seen that ph180 switch is turned on too early and now most of the slew required to reverse the transformer polarity is achieved non adiabatically through the ph180 switch. It breaks adiabacity because there are now obvious voltage slews occurring when some of the transistors are ON. This wastes a quantum of energy $0.5*C*dV^2$ because of the resistive, dissipative nature of the switch with such a large voltage over it when it is turned on.

FIG. 48 mid panel, does not show the imon (imag) trace and has Lp set at 1200 uH (achieved with reduced number of turns, bigger airgap, different magnetic material perhaps) and for the same timings as before the peak currents will be 4.17× higher and therefore the slew rate when all power switches are off will be 4.17× high all other things being equal. Large overshoots are seen and again there are large voltages present over the switches when they turn on and again a loss of energy $0.5*C*dV^2$ every ½ cycle.

FIG. 48 right panel is the ideal operating condition where the combination of timings of the switches, Lp inductance=2500 uH for this particular set of parasitic capacitances and timings makes the natural self-slews intercept the power voltage rails at the exact time where ph0 or ph180 turn on.

The switching environment for the transistors is almost perfectly benign, there is no voltage stresses during turn on or turn off, no risk of second breakdown or dynamic breakdown effects. The usual Eon and Eoff measures of transistor switching losses are largely irrelevant. When coupled to a properly timed gate drive adiabatic system [FIGS. 17-21 should now be self-explanatory] the entire system is asymptotically zero energy even when operating at several hundred Khz or even GHz depending on device sizes. In reality there will be losses such as Conduction losses, Eddy current losses, Hysteresis losses but these can be minimised by oversizing the active and passive devices which in an adiabatic system does not result in an explosion of switching losses as would normally happen.

Optimum timing to achieve adiabicity can be done dynamically as was described previously although to first order the timing is independent of the power voltage: From example given the equation dI=VT/L then if the input voltage were to triple from 400V to 1200V then the dI of Imag would increase by a factor of three. To first order this compensates exactly for the fact that the total slew must increase from the previous 800V (from +400 to −400) now to 2400V (from +1200V to −1200V) from dV=IT/C where T and C have not changed and now both dV and I have increased by a factor of 3.

Power-Coupling:

Operation with a load on the secondary-side of the power transformer follows normal transformer action—load on the secondary side induces an immediate current flow in the primary according to the turns ratio as expected. By interleaving transformers using phase-offset parallelism a continuous power path can be maintained across the isolation boundary. Additionally or alternatively decoupling capacitors on the power voltage rails will have the same beneficial effect of preventing voltage ripple or collapse which might undermine the zero-voltage-switching condition during especially switch-off, start-of-self-ramp condition.

FIG. 49 explains how there is always a low impedance, low loss, high bandwidth connection between input and output by using interleaved transformers.

FIGS. 50 and 51 show and example of the synchronous rectification (or synchronous modulation in case of bidirectional flow in operation). Gate isolation transformer is used. Adiabatic drive as detailed in the notes which accompany FIGS. 17-21 can be used to save energy and drive very large MOSFET devices.

FIGS. 52 and 53 shown an example embodiments of a blender using standard components.

FIGS. 54 and 55 explain the problem of input ripple current present on DC->AC converters in general and a conceptual solution to this problem using 'capacitor multiplication'.

FIGS. 56 and 57 has the diagrams of a scheme to implement the ripple current reduction scheme using components already described but this time feeding a storage node Cstore rather than the AC output path.

FIGS. 58 and 59 are pictures of some of the other components which might be needed and the approximate sizes.

Binary-Tree Tap Selector.

FIG. 60 Shows an efficient method of selecting from one amongst N taps. In this example N is 8. The bus voltage is 400V and the highest tap voltage is 350V and the lowest voltage tap is 0V.

From left to right, the voltage rating of the MOSFETs is 200V, 100V, 50V. In terms of MOSFET cost the N-tap binary method is quite efficient even compared to a simple 0V,350V switching scheme since the left side MOSFETs only need to be 200V rated, and when combined with the lower voltage (smaller) devices needed on the 0V and 350V paths the total MOSFET cost is comparable.

The additional cost of implementing the 8-tap comes from the 6 extra 50V MOSFETs and 2 extra 100V MOSFETs— low cost standard devices.

Three-Level Blender

On the diagram mentioned above is a 3-level blender circuit which can PWM from 0 to 100% of the difference between potential vtap and vtap+50V. An output inductor and capacitor filter this voltage to cleanly interpolates (blend) between 0 and 100% of 50V tap voltage. By using a centre-tap on one of the possibly multi-parallel windings of the common core plus an upfront DPDT switch the high-frequency switches see no more than 25V allowing hard switching operation. The DPDT switch corresponds to the lowest significant bit of the binary tap selection. The high speed PWM fets interpolate for intermediate values between the LSB tap step size.

Again it should be noted that the circuits are bidirectional with respect to power which is exploited when making a ripple rejection circuit from these components where power can be pushed/pulled in both directions.

Multi-Level Taps, Flying Taps and Blending

The above is an example of a two-level binary tap system with a main tap then a 'flying' tap which is then binary selected before final blending between DC step levels. This could be taken to NN levels of depth where a larger number of discrete steps are needed with the minimum number of switches.

Elimination of the Effects of Interwinding Capacitance.

Techniques have already been described which can mitigate for the effects of cyclic power loss by adiabatic techniques but problems can persist in noise-currents flowing through transformers producing EMI interference problems (conducted and/or radiated).

Especially with Planar transformer construction like that in FIG. 61 where adjacent windings are places very close to each other to reduce leakage inductance. Normally this causes a problematic increase in interwiring capacitance.

FIG. 62(b) shows that unlike a normal transformer where the high voltage side is switched with two switches, and there exists a large differential capacitance current flow as the primary alternates, the multiply connected, DC series synchronous modulators produce a matching delta voltages between all primary and secondary turns if arranged properly.

On the non-isolated scheme it is easy to ensure that the effects of interwiring capacitance can be negated by the same token.

Interwiring capacitance can actually help the converter by promoting a simultaneous switched-capacitor power transfer mechanism. FIG. 63 Illustrates the point with a non-isolated converter and FIG. 64 again shows that the principle holds for an isolated converter where the primary is broken down into a stack of multiple lower-voltage DC/AC switching units.

Non-Isolated Version Advantages

It can be advantageous to produce a non-isolated DC->AC converter since this reduces the copper losses [primary is removed, freeing winding area on the core for the inductor string], promotes an 'Autotransformer' mode of power transfer and can simplify the control electronics.

To convert to non-isolated mode, both the primary winding and primary drive/control electronics is dispensed with and the input DC power source is connected to the top and bottom of what was the secondary series-DC synchronous modulator tap string. No other changes are needed.

Operation is now quite different because much of the output current from the selected tap is coming directly from the DC input source. In the limit, if 400V peak AC is required then there is no involvement of the converter and just the DC path is providing the power output. Losses are very low in this case. At an output tap-selected voltage of 200V at 10 A for example, 5 A is coming directly from the input DC source (via the top 4 tap stages) which is then pumping 5 A at 200V to the remaining lower 4 tap stages which then provide 5 A at 200V output which combines with the previous 5 A to make 10 A into the 200V output. This is classic autotransformer type operation but here at a high-frequency mode.

Interleaving of transformers is still required to prevent discontinuities in the input and subsequent inductor voltage-bounce or capacitor voltage dips.

Description of the Switching Devices

FIG. 65 illustrates a BJT device which is used as the switching devices in the present specification. A N– bulk version of a I2 device see FIG. 65 made with either a BJT base (in this case an NPN base) or a JFET base I2 device each operate in a similar way by injecting electrons into the N– base and are just reverse-doped versions of I2 structures already described. Polarities and current flow directions are reversed relative to a P– bulk T2 device.

Whereas in an IGBT, J-FET regions are considered 'parasitic' and lead to the development on the trench IGBT to avoid them; in the I2 JFET-base device the JFET region is encouraged and essential for the off-state. In the on-state the depleted channel disappears to be replaced with a minority-carrier-injected channel orders of magnitude higher conductivity than a MOS inversion channel.

Operationally, the main current-carrying PNP transistor is virtually identical to the IGBT PNP mode (and for that matter to that of a Thyristor), but in this case it can operate without a built-in diode drop in the C to E (CE1 to CE2) main conduction path.

The gate/base arrangement is very different. All of the insulating gate material and contact of an IGBT are no longer present and there is no N+ region connecting to the E any longer. This eliminates the possibility of NPNP latch-up because the N+ contact is not to a potential or permanent low impedance capable of sustaining latch-up.

For these N– bulk I2 devices, a negative base voltage of –VBE at current of Ibase gives BETA×Ibase of current through C to E terminals. In cases of low BETA of the PNP, the PIN action will also be present (like a PIN-mode IGBT) and the base will have to take most of the switching current of the device. In the limit, with if there is no PNP action, the efficiency of the I2 device will not much exceed the IGBT except for the elimination of the MOS resistive channel voltage drop of an IGBT.

Punch-Through/Non-Punch-Through/Electron Irradiation Options:

The same set of design optimisations used for IGBTs such as punch-through/N+ buffer layer can be applied to the I2 devices making it asymmetric and not able to support (much) reverse voltage.

The region label BL can be N–, N+ or something in between, exactly like standard IGBT processing for Field-Stop, Soft-Punch-Through, Controlled-Punch-Through, Light-Punch through etc. Electron irradiation can be applied to the T2 type devices as it can to traditional IGBTs for lifetime control.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A power coupler for connecting AC or DC electrical circuits having different voltages, current or impedance levels, the power coupler comprising:
   a power transformer comprising a first core winding and a second core winding, the first core winding and the second core winding having equal numbers of turns, the power transformer configured to have:
      a first capacitance between two terminals of the first core winding;
      a second capacitance between two terminals of the second core winding; and a third capacitance between the first and second cores windings;
   a first switching device configured to control current flow through the first core winding;
   a second switching device configured to control current flow through the second core winding, the second switching device arranged in series with the first switching device;
   wherein the power coupler is configured to operate the first switching device and the second switching device synchronously and selecting switching time of the switching devices so that resonant time constants are synchronized with the switching time, thereby reducing switching power loss by interchanging magnetic and capacitive energy between the first, second and third capacitance and a transformer inductance between the first core winding and second core winding of the power transformer.

2. The power coupler according to claim 1, further configured to stepwise charge a capacitance on gates of the first and second switching devices using a multi-level DC supply via a further transformer.

3. The power coupler according to claim 1, wherein the first and second switching devices each comprise a plurality of switches.

4. The power coupler according to claim 3, wherein the plurality of switches are arranged in a half bridge configuration.

5. The power coupler according to claim 3, wherein the plurality of switches are arranged in a full bridge configuration.

6. The power coupler assembly incorporating a plurality of power couplers according to claim 1, wherein the plurality of power couplers are interleaved with one another.

7. The power coupler assembly according to claim 6, wherein a first power coupler of the plurality of power couplers is configured to operate its respective switching devices in a different phase compared with a second power coupler of the plurality of power couplers.

8. The power coupler assembly according to claim 6, wherein said interleaved plurality of power couplers are configured to provide continuous primary to secondary high bandwidth power coupling.

9. The power coupler assembly according to claim 6, wherein the first core winding and the second core winding of the power transformer have a common core.

10. The power coupler assembly according to claim 6, further comprising a voltage tap coupled with each power coupler.

11. The power coupler according to claim 3, wherein each of the plurality of switches comprise series connected inverse power transistors.

* * * * *